(12) United States Patent
Ohno

(10) Patent No.: US 6,828,820 B2
(45) Date of Patent: Dec. 7, 2004

(54) METHOD AND CIRCUIT FOR PRODUCING CONTROL SIGNAL FOR IMPEDANCE MATCHING

(75) Inventor: Tsuyoshi Ohno, Kawasaki (JP)

(73) Assignee: NEC Electronics Corporation (JP)

( * ) Notice: Subject to any disclaimer, the term of this patent is extended or adjusted under 35 U.S.C. 154(b) by 21 days.

(21) Appl. No.: 10/435,112

(22) Filed: May 8, 2003

(65) Prior Publication Data

US 2004/0021481 A1 Feb. 5, 2004

(30) Foreign Application Priority Data

May 8, 2002 (JP) ........................................ 2002-132552

(51) Int. Cl.[7] ........................................... H03K 19/003
(52) U.S. Cl. ............................ 326/30; 326/33; 333/17.3
(58) Field of Search ..................... 326/30–34; 324/601; 333/17.3

(56) References Cited

U.S. PATENT DOCUMENTS 6,307,791 B1 * 10/2001 Otsuka et al. .......... 365/189.05
6,567,318 B2 *  5/2003 Bedarida et al. ....... 365/189.05
6,741,095 B2 *  5/2004 Abrosimov et al. .......... 326/30

FOREIGN PATENT DOCUMENTS

| JP | 10-190642 | 7/1998 | |
|----|-----------|--------|---|
| JP | 2000-59202 | 2/2000 | |
| JP | 2001217705 A | * 8/2001 | ....... H03K/19/0175 |

* cited by examiner

Primary Examiner—James H. Cho
(74) Attorney, Agent, or Firm—Ostrolenk, Faber, Gerb & Soffen, LLP

(57) ABSTRACT

A method for producing a stable control signal for impedance matching is provided which is capable of suppressing variation in impedance matching data by adding a shift voltage to a voltage to be compared. A comparator compares the voltage to be compared with a reference voltage and an up-down counter performs a counting operation according to a result from the comparison. A code converting circuit converts a count value output from the up-down counter to a thermometer code used for changing an impedance of an impedance varying circuit. A change in the impedance is made in a manner that, even when the voltage to be compared gets closest to the reference voltage, a shift voltage for the comparator to make an exact comparison is fed to the voltage to be compared. An averaging circuit averages a count value and the code converting circuit converts a resulting average value to the thermometer code.

23 Claims, 32 Drawing Sheets

FIG.6

| type of code / code number | binary code | | | thermometer code | | | | | | |
|---|---|---|---|---|---|---|---|---|---|---|
| | B2 | B1 | B0 | T6 | T5 | T4 | T3 | T2 | T1 | T0 |
| 0 | 0 | 0 | 0 | 0 | 0 | 0 | 0 | 0 | 0 | 0 |
| 1 | 0 | 0 | 1 | 0 | 0 | 0 | 0 | 0 | 0 | 1 |
| 2 | 0 | 1 | 0 | 0 | 0 | 0 | 0 | 0 | 1 | 1 |
| 3 | 0 | 1 | 1 | 0 | 0 | 0 | 0 | 1 | 1 | 1 |
| 4 | 1 | 0 | 0 | 0 | 0 | 0 | 1 | 1 | 1 | 1 |
| 5 | 1 | 0 | 1 | 0 | 0 | 1 | 1 | 1 | 1 | 1 |

FIG.7

| type of code / code number | thermometer code |||||||| Up=1 | Up=0 |
|---|---|---|---|---|---|---|---|---|---|
| | T6 | T5 | T4 | T3 | T2 | T1 | T0 | | |
| 0 | 0 | 0 | 0 | 0 | 0 | 0 | 0 | 1/W | 1/W |
| 1 | 0 | 0 | 0 | 0 | 0 | 0 | 1 | 1/(W+3W/4) | 1/(W+3W/4+W/2) |
| 2 | 0 | 0 | 0 | 0 | 0 | 1 | 1 | 1/(2W+3W/4) | 1/(2W+3W/4+W/2) |
| 3 | 0 | 0 | 0 | 0 | 1 | 1 | 1 | 1/(3W+3W/4) | 1/(3W+3W/4+W/2) |
| 4 | 0 | 0 | 0 | 1 | 1 | 1 | 1 | 1/(4W+3W/4) | 1/(4W+3W/4+W/2) |
| 5 | 0 | 0 | 1 | 1 | 1 | 1 | 1 | 1/(5W+3W/4) | 1/(5W+3W/4+W/2) |

FIG.22

| type of code / code number | thermometer code | | | | | | | Up=1 | Up=0 |
|---|---|---|---|---|---|---|---|---|---|
| | T6 | T5 | T4 | T3 | T2 | T1 | T0 | | |
| 0 | 0 | 0 | 0 | 0 | 0 | 0 | 0 | 1/W | 1/W |
| 1 | 0 | 0 | 0 | 0 | 0 | 0 | 1 | 1/(W+W/2) | 1/(W+3W/4+W/2) |
| 2 | 0 | 0 | 0 | 0 | 0 | 1 | 1 | 1/(2W+W/2) | 1/(2W+3W/4+W/2) |
| 3 | 0 | 0 | 0 | 0 | 1 | 1 | 1 | 1/(3W+W/2) | 1/(3W+3W/4+W/2) |
| 4 | 0 | 0 | 0 | 1 | 1 | 1 | 1 | 1/(4W+W/2) | 1/(4W+3W/4+W/2) |
| 5 | 0 | 0 | 1 | 1 | 1 | 1 | 1 | 1/(5W+W/2) | 1/(5W+3W/4+W/2) |

FIG. 33 (PRIOR ART)

| state | 0 | 1 | 2 | 3 | 4 | 5 | 6 | 7 | 8 | 9 | 10 | 11 |
|---|---|---|---|---|---|---|---|---|---|---|---|---|
| input to averaging circuit | 0 | 1 | 2 | 3 | 4 | 5 | 4 | 3 | 4 | 5 | 4 | 3 |
| output from subtractor |  | 1 | 1.75 | 2.31 | 2.73 | 3.05 | 1.29 | -0 | 0.97 | 1.73 | 0.3 | -0.8 |
| output from weighting section | 0.25 | 0.25 | 0.44 | 0.58 | 0.68 | 0.76 | 0.32 | -0 | 0.24 | 0.43 | 0.07 | -0.2 |
| output from adding circuit | 0 | 0 | 0.25 | 0.69 | 1.27 | 1.95 | 2.71 | 3.03 | 3.03 | 3.27 | 3.7 | 3.78 |
| output from averaging circuit | 0 | 0 | 0 | 1 | 1 | 2 | 3 | 3 | 3 | 3 | 3 | 3 | to be continued →

| 12 | 13 | 14 | 15 | 16 | 17 | 18 | 19 | 20 | 21 | 22 | 23 | 24 |
|---|---|---|---|---|---|---|---|---|---|---|---|---|
| 4 | 5 | 4 | 3 | 4 | 5 | 4 | 3 | 4 | 5 | 4 | 3 | 4 |
| 0.42 | 1.31 | -0 | -1 | 0.24 | 1.18 | -0.1 | -1.1 | 0.97 | 1.14 | -0.1 | -1.1 | 0.17 |
| 0.1 | 0.33 | -0 | -0.3 | 0.06 | 0.3 | -0 | -0.3 | 0.05 | 0.28 | -0 | -0.3 | 0.04 |
| 3.58 | 3.69 | 4.02 | 4.01 | 3.76 | 3.82 | 4.11 | 4.09 | 3.81 | 3.88 | 4.15 | 4.11 | 3.83 |
| 3 | 4 | 4 | 3 | 3 | 4 | 4 | 3 | 3 | 4 | 4 | 3 | 3 |

METHOD AND CIRCUIT FOR PRODUCING CONTROL SIGNAL FOR IMPEDANCE MATCHING

BACKGROUND OF THE INVENTION

1. Field of the Invention

The present invention relates to a method and a circuit for producing a control signal for impedance matching, and more particularly to the method and the circuit for producing the stable control signal for impedance matching by using a count value output from an up-down counter as a control signal for impedance matching to be used for matching of terminating impedance of an impedance matching circuit that requires impedance matching and by comparing a voltage to be compared to be produced based on the count value and changing the count value through control of the up-down counter according to a result from the comparison.

The present application claims priority of Japanese Patent Application No. 2002-132552 filed on May 8, 2002, which is hereby incorporated by reference.

2. Description of the Related Art

Conventionally, an electronic signal transmitting path is provided with a unit which can perform impedance matching at a sending end and at a receiving end of a signal. An aim of performing such impedance matching is to normally transmit an electric signal from the sending end of the signal to the receiving end of the signal. Particularly, some high-speed input/output interfaces constructed using semiconductor devices, since they generate high heat therein, are cooled to minus several tens of degrees. When these high-speed input/output interfaces are used during long periods in communication applications, their temperatures are increased up to plus several tens of degrees. If such the big change in the temperature or power source voltages occurs during use of the high-speed input/output interface, a change also occurs in impedance in the semiconductor device which is performing impedance matching. Due to this, a state occurs in which the impedance in the high-speed input/output interface is not matched and, therefore, a method to avoid such the state and to always maintain a matched impedance is needed. As one of the methods for achieving such the impedance matching, an output impedance calibrating circuit is disclosed in Japanese Patent Application Laid-open No. 2000-59202 (hereinafter referred to a "first application"). FIG. 30 shows a schematic block diagram of the disclosed output impedance calibrating circuit.

An outline of the disclosed output impedance calibrating circuit is described below. An impedance varying circuit 111 shown in FIG. 30 provides an impedance according to a binary code output from an up-down counter 114. A connecting point $111_a$ is a connecting point placed between the impedance varying circuit 111 and a resistor 112. A voltage Va to be compared occurring at the connecting point $111_a$ is fed to one input terminal of a comparator 113. The voltage Va to be compared is a voltage which represents, in a simulated manner, an impedance provided by the impedance calibrating circuit in the high-speed input/output interface. To another input terminal of the comparator 113 is fed a reference voltage Vref which does not change even if a change in temperature occurs. A comparison between the voltage Va to be compared and the reference voltage Vref is made by the comparator 113 and a counting operation corresponding to a result of the comparison is performed in the up-down counter 114.

Though an impedance in the impedance varying circuit 111 is calibrated according to a binary code output from the up-down counter 114 and feed-back control is exerted so that the voltage Va to be compared converges to the reference voltage Vref, the voltage Va to be compared, as shown in FIG. 31A, changes at levels being higher or lower than a level of the reference voltage Vref. That is, the binary code itself output from the up-down counter 114 is changed. Therefore, since the binary code output from the up-down counter 114, as is, cannot be used as data for impedance matching, conventionally, in order to stabilize the variable binary code so as to be stable and to be a constant value, an averaging circuit (explained later) is introduced. FIG. 31B shows a state of a change in a voltage Va to be compared in the case of using such the averaging circuit.

As one of examples of the averaging circuit, technology containing the averaging circuit is disclosed in Japanese Patent Application Laid-open No. Hei 10-190642 (hereinafter called a "second application"). The technology disclosed in the second application is a bit synchronizing technology which is essential when a digital signal in digital transmission is reproduced on a receiving side, in which the averaging circuit is used. The bit synchronizing circuit (not shown) employed in the second application includes a phase comparing unit (not shown), a retiming unit (not shown), an averaging unit (not shown), and a selecting unit (not shown) as elements featuring the bit synchronizing technology.

An outline of operations of the bit synchronizing circuit (not shown) is described. In its phase comparing unit, frequency-divided data obtained by dividing a frequency of receiving data is compared with each clock signal of polyphase clock signals and a specified signal to specify one clock signal contained in the polyphase clock signals having a phase relation being predetermined in the frequency-divided data is produced. The retiming unit (not shown) performs retiming operations on the frequency-divided data according to an extracted clock signal selected by the selecting unit (not shown). The specified signal fed from the phase comparing unit (not shown) to the averaging circuit (not shown) is averaged in synchronization with a signal output from the retiming unit (not shown) and then is output. The selecting unit (not shown) receiving the signal from the averaging unit (not shown) alternatively extracts one clock signal contained in the above polyphase clock signals according to the signal output from the averaging (not shown) unit and outputs the extracted clock signal. The extracted clock signal outputted from the selecting unit (not shown) is used in the retiming unit (not shown) and for performing retiming operations on received data.

The averaging circuit (not shown) disclosed in the above second application is, more particularly, made up of a subtractor, one m-th weighting section, an adder, a storing section, numeral operating section, and a flip-flop (none being shown). The averaging circuit (not shown), after having subtracted, using the subtractor (not shown), a value of the specified signal fed from the phase comparing (not shown) unit from a value fed from the storing section (not shown), performs dividing operations on the subtracted value using the one m-th weighting section (not shown) and stores an average value obtained by adding, using the adder (not shown), a value resulting from the dividing operations to a value fed from the storing section (not shown) and by making a correction to a result from the addition, in the storing section (not shown). Then, a numerical operating section (not shown) rounds off the average value fed from the storing section (not shown) to the nearest integer and the flip-flop (not shown) performs retiming operations on the average value of a phase comparing signal according to a signal fed from the retiming unit and outputs the resulting value.

However, the above conventional technology has problem. That is, as described above, by connecting the above averaging circuit (not shown) to an output terminal of the output impedance calibrating circuit (not shown), a variable binary code can be stabilized. The stabilization of the binary code, in the output impedance calibrating circuit (not shown), can be achieved so long as a voltage Va to be compared is changed at a level being sufficiently apart from an offset voltage of the comparator 113 from a level of the reference voltage Vref. This is because, as shown in FIG. 31A, the voltage Va to be compared is changed under such conditions described above at two voltage level being higher and lower than a level of the reference voltage Vref. Moreover, an offset voltage of the comparator 113 represents a voltage being near to a reference voltage Vref which causes a mistake in judging whether a voltage Va to be compared is larger or smaller than a reference value.

However, in the comparator 113 described above, when a voltage Va to be compared gets near to the reference voltage Vref by a value exceeding a value resulting from addition of an offset voltage of the comparator 113 to the voltage Va to be compared or by a value exceeding a value resulting from subtraction of the offset voltage of the comparator 113 to the voltage Va to be compared, it is not certain that count values output from the up-down counter 114 are increased by a voltage corresponding to "one step" or decreased by a voltage corresponding to "one step". In such the comparator 113 as operated as above, when a noise happens to be added to the voltage Va to be compared, even if the voltage Va to be compared becomes higher by a voltage crossing over the offset voltage of the comparator 113 than the reference voltage Vref or becomes lower by a voltage exceeding the offset voltage than the reference voltage Vref, same phenomenon as appeared in the above case occurs.

Therefore, if such the state as described occurs, counting operation of the up-down counter 114 becomes irregular. In response to the binary code output from the up-down counter 114 being put in the above state, an impedance in the impedance varying circuit 111 is changed and a voltage Va to be compared occurring at a connecting point $111_a$ becomes a voltage shown in FIG. 32A. In such a state as above, even if the averaging circuit (not shown) disclosed in the above application is connected for use to the output terminal of the up-down counter 114, an output from the averaging circuit (not shown) is varied as shown in FIG. 33. That is, an irregular variation occurs in a lowest order bit. Introduction of the averaging circuit (not shown) becomes meaningless. FIG. 34 is a diagram obtained by graphing data shown in FIG. 33. FIG. 32B is a diagram showing only outputs shown in FIG. 34 from the averaging circuit (not shown). Moreover, FIG. 33 shows values obtained by assuming that m=4 in the one m-th weighting section (not shown) incorporated in the averaging circuit (not shown) disclosed in the second application.

Thus, even if the averaging circuit (not shown) is connected to the output terminal of the output impedance calibrating circuit (not shown) to achieve stabilization of the binary-coded value, when the irregular operation described above occurs, variation of the lowest order bit, that is, an error being equivalent to one step occurs in impedance matching. If a number of bits incorporated in the binary code is increased in order to reduce such the error, a problem arises that the circuit is complicated and its circuit size is increased.

Moreover, as described above, the binary code (being made up of N-pieces of bits) output from the up-down counter 114 is used as data for impedance matching to be fed to an output impedance matching circuit (not shown) that requires impedance matching or input impedance matching circuit (see FIG. 35) that also requires impedance matching. An i-th control bit (one of bits made up of i=1, 2, ..., N) for a P-channel and an i-th control bit for an N-channel, both of which are produced based on the binary bit, are fed separately through a NAND circuit $121_1$ and a NAND circuit $123_1$ (to each of another input terminal of these circuit is fed a corresponding data bit) and via separate wires respectively to each of impedance matching control input terminals, that is, to a gate of a P-channel type MOSFET (Metal Oxide Semiconductor Field Effect Transistor) $124_1$ and a gate of an N-channel type MOSFET $125_1$ corresponding to an output impedance matching circuit (not shown) or an input impedance matching circuit (not shown) either being made up of a P-channel type MOSFET and an N-channel type MOSFET. Since variations exist in a floating capacity occurring in each of the wires and since the more the number of wires become, the more output timing for every signal being output from each wiring is varied, another problem occurs in that jitters occurs in signals output from an output impedance matching circuit or input impedance matching circuit.

SUMMARY OF THE INVENTION

In view of the above, it is an object of the present invention to provide a method for producing a stable control signal for impedance matching and a circuit for producing the stable control signal for impedance matching by using, at least, an offset value of a comparator when a voltage to be compared is regularly changed according to count values output from an up-down counter and by averaging the count values within a predetermined period of time.

According to a first aspect of the present invention, there is provided a method for producing a control signal for impedance matching for adjusting an output impedance of an output buffer or an input impedance of an input buffer by comparing a voltage to be compared with a reference voltage to increase, when the voltage to be compared is smaller than the reference voltage, the voltage to be compared by a predetermined voltage and to decrease, when the voltage to be compared is larger than the reference voltage, the voltage to be compared by a predetermined voltage and by producing the control signal based on a result from the comparison and using this produced control signal, the method including:

a step of setting so that the predetermined voltage to be used when a change in the voltage to be compared is switched from its increasing state to its decreasing state or when the change in the voltage to be compared is switched from its decreasing state to its increasing state has a potential being smaller than that of the predetermined voltage to be used when the voltage to be compared is caused to continue increasing and when the voltage to be compared is caused to continue decreasing and so that a voltage obtained by adding both predetermined voltages to be used when a change in the voltage to be compared is switched from its increasing state to its decreasing state or when a change in the voltage to be compared is switched from its decreasing state to its increasing state has a potential being smaller than that when the voltage to be compared is caused to continue increasing or when the voltage to be compared is caused to continue decreasing.

In the foregoing first aspect, a preferable mode is one wherein the predetermined voltage to be used when the voltage to be compared is caused to continue increasing and when the voltage to be compared is caused to continue decreasing is made constant.

Another preferable mode is one wherein the voltage to be compared is changed in every specified period of time and values given by the control signals produced based on a result from the comparison made in the every specified period of time are averaged in a predetermined time.

Still another mode is one wherein, in the change in the voltage to be compared, a value to be used when the voltage to be compared is caused to increase and a value to be used when the voltage to be compared is caused to decrease are made different from each other.

According to a second aspect of the present invention, there is provided a circuit for producing a control signal for impedance matching including:

a comparator to compare a voltage to be compared with a reference voltage in every determined time;

an up-down counter to increment, every time results from the comparison by the comparator are input and compared, a count value by 1 (one) when the voltage to be compared is smaller than the reference voltage and to decrement a count value by 1 (one) when the voltage to be compared is larger than that the reference voltage;

a first circuit for changing a value of a voltage to be compared based on the count value;

a second circuit for producing and outputting a control signal for impedance matching; and wherein the first circuit does setting so that, when a value of a voltage to be compared is changed, a value to be used when the value of the voltage to be compared is increased and a value to be used when a value of a voltage to be compared is decreased are made different from each other and changes a value of the voltage to be compared so that a potential to be changed when a change in the voltage to be compared is switched from its increasing state to its decreasing state or when a change in the voltage to be compared is switched from its decreasing state to its increasing state is smaller than a potential to be changed in every counting when the voltage to be compared is caused to continue increasing and decreasing and so that a potential obtained by adding a potential to be used when a change in the voltage to be compared is switched from its increasing state to its decreasing state and a potential to be used when a change in the voltage to be compared is switched from its decreasing state to its increasing state is smaller than a potential to be changed in every counting when the voltage to be compared is caused to continue decreasing and increasing and wherein the second circuit produces and outputs a control signal for the impedance matching based on an average value of the count values measured within the predetermined time.

In the foregoing second aspect, a preferable mode is one wherein the first circuit includes two impedance elements being connected serially between a power source and a ground and wherein the voltage to be compared is output from a connecting point of both of the impedance elements and wherein the impedance elements being connected to the power source are transistors being, in parallel, connected whose impedance values are changed according to the count value and a signal based on the count value is input to a gate of each of the transistors.

Another preferable mode is one wherein the impedance elements being connected to the power source are made up of a switching element and a resistor, instead of the transistors and wherein the switching element is closed or opened depending on a signal based on the count value.

According to a third aspect of the present invention, there is provided a method for producing a control signal for impedance matching including:

a step of comparing a voltage to be compared with a reference voltage by a comparator;

a step of incrementing count values output from an up-down counter by only 1 (one) in every predetermined period of time when a result of the comparison indicates that the voltage to be compared is smaller than the reference voltage and of decrementing the count values output from the up-down counter by only 1 (one) in every predetermined period of time when the result of the comparison indicates that the voltage to be compared is larger than the reference voltage;

a step of changing the voltage to be compared by a predetermined voltage based on the count values for every one counting operation of the up-down counter;

a step of producing, based on the count values, the control signal for the impedance matching to be used for matching terminating impedance of a circuit that requires impedance matching;

a step of regularly changing the voltage to be compared at levels being higher and lower than a level of the reference voltage;

a step of setting, even when the voltage to be compared gets closest to the reference voltage, the predetermined voltage to be used for changing the voltage to be compared at a voltage at which the voltage to be compared is apart by an offset voltage of the comparator from the reference voltage; and a step of outputting the control signal for the impedance matching based on an average value of count values obtained by one counting operation of the up-down counter within a predetermined period of time.

According to a fourth aspect of the present invention, there is provided a method for producing a control signal for impedance matching including:

a step of comparing a voltage to be compared with a reference voltage by using a comparator;

a step of decrementing count values output from an up-down counter by only 1 (one) in every predetermined period of time when a result of the comparison indicates that the voltage to be compared is smaller than the reference voltage and of incrementing the count values output from the up-down counter by only 1 (one) in every predetermined period of time when the result of the comparison indicates that the voltage to be compared is larger than the reference voltage;

a step of changing the voltage to be compared by a predetermined voltage based on the count values for every one counting operation of the up-down counter;

a step of producing, based on the count values, the control signal for the impedance matching to be used for matching terminating impedance of a circuit that requires impedance matching;

a step of regularly changing the voltage to be compared at levels being higher and lower than a level of the reference voltage;

a step of setting, even when the voltage to be compared gets closest to the reference voltage, the predetermined voltage to be used for changing the voltage to be compared at a voltage at which the voltage to be compared is apart by an offset voltage of the comparator from the reference voltage; and a step of outputting the control signal for impedance matching based on an average value of count values obtained by one counting operation of the up-down counter within a predetermined period of time.

In the foregoing third and fourth aspect, a preferable mode is one wherein setting of the predetermined voltage for changing is made so that the voltages to be compared become symmetric with respect to the reference voltage at levels being higher and lower than a level the reference voltage.

Also, a preferable mode is one wherein setting of the predetermined voltage for changing is made so that the voltages to be compared become asymmetric with respect to the reference voltage at levels being higher and lower than the level of the reference.

Also, a preferable mode is one wherein the predetermined voltage is changed so that a ratio of the changing is made larger when a difference between the reference voltage and the voltage to be compared is the larger.

Also, a preferable mode is one wherein the predetermined voltage is changed, irrespective of magnitude of the difference between the reference voltage and the voltage to be compared, so that a ratio of the changing is made almost same.

Also, a preferable mode is one wherein the predetermined period of time is time required for counting the count values obtained by four times counting and the average value is an average value of the count values obtained by the four times counting.

Also, a preferable mode is one wherein the predetermined period of time is time required for counting the count values obtained by six times counting and the average value is an average value of the count values obtained by the six times counting.

Also, a preferable mode is one wherein the predetermined period of time is time required for counting the count values obtained by eight times counting and the average value is an average value of the count values obtained by the eight times counting.

Also, a preferable mode is one wherein the changing of the predetermined voltage is made based on a code that has been converted so that only one bit incorporated in the code is changed for one time change in counting the count values.

Also, a preferable mode is one wherein the changing of the predetermined voltage is made based on the count values.

Also, a preferable mode is one wherein the control signal for impedance matching is output using a code that have been converted so that only one bit incorporated in the code is changed for one time change in the count values obtained by averaging.

According to a fifth aspect of the present invention, there is provided a circuit for producing a control signal for impedance matching of terminating impedance of a circuit that requires impedance matching including:

a comparator to compare a voltage to be compared with a reference voltage in every predetermined time;

an up-down counter to receive a result from the comparison by the comparator to increment a count value output from an up-down counter by only 1 (one) every time when a result of the comparison indicates that the voltage to be compared is smaller than the reference voltage and to decrement the count value output from the up-down counter by only 1 (one) every time when the result of the comparison indicates that the voltage to be compared is larger than the reference voltage;

a circuit for changing the voltage to be compared used to change the voltage to be compared by a predetermined voltage based on the count values for every one counting operation of the up-down counter wherein the count value is used for outputting the control signal for the impedance matching, and wherein the circuit for changing the voltage to be compared regularly changes the voltage to be compared at levels being higher and lower than a level of the reference voltage and sets, even when the voltage to be compared gets closest to the reference voltage, the predetermined voltage to be used for changing the voltage to be compared at a voltage at which the voltage to be compared is apart by an offset voltage of the comparator from the reference voltage and has an averaging circuit to produce an average value of count values obtained by one counting operation within a predetermined period of time and outputs the control signal for impedance matching by using the averaged count values.

According to a sixth aspect of the present invention, there is provided a circuit for producing a control signal for impedance matching of terminating impedance of a circuit that requires impedance matching including:

a comparator to compare a voltage to be compared with a reference voltage in every predetermined time;

an up-down counter receiving a result from the comparison made by the comparator to decrement count values output from an up-down counter by only 1 (one) every time when the result of the comparison indicates that the voltage to be compared is smaller than the reference voltage and to increment the count values output from the up-down counter by only 1 (one) every time when the result of the comparison indicates that the voltage to be compared is larger than the reference voltage;

a circuit for changing the voltage to be compared used to change the voltage to be compared by a predetermined voltage based on the count values for every one counting operation of the up-down counter wherein the count values are used for outputting the control signal for the impedance matching; and wherein the circuit for changing the voltage to be compared regularly changes the voltage to be compared at levels being higher and lower than a level of the reference voltage and sets, even when the voltage to be compared gets closest to the reference voltage, the predetermined voltage to be used for changing the voltage to be compared at a voltage at which the voltage to be compared is apart by an offset voltage of the comparator from the reference voltage and has an averaging circuit to produce an average value of count values obtained by one counting operation within a predetermined period of time wherein the average value is used for outputting the control signal for the impedance matching.

In the foregoing fifth and sixth aspect, a preferable mode is one wherein setting of the predetermined voltage for changing to be made by the circuit for changing a voltage to be compared is made so that the voltages to be compared become symmetric with respect to the reference voltage at levels being higher and lower than a level of the reference voltage.

Also, a preferable mode is one wherein setting of the predetermined voltage for changing to be made by the circuit for changing a voltage to be compared is made so that the voltages to be compared become asymmetric with respect to the reference voltage at levels being higher and lower than the level of the reference voltage.

Also, a preferable mode is one wherein a value for one counting of the predetermined voltage to be changed by the circuit for changing a voltage to be compared is the larger when a difference between the reference voltage and the voltage to be compared is larger.

Also, a preferable mode is one wherein a value for one counting of the predetermined voltage to be changed by the circuit for changing a voltage to be compared is almost same, irrespective of magnitude of the difference between the reference voltage and the voltage to be compared.

Also, a preferable mode is one wherein the predetermined period of time is time required for counting the count values obtained by four times counting and the average value is an average value of the count values obtained by four times counting.

Also, a preferable mode is one wherein the predetermined period of time is time required for counting the count values obtained by six times counting and the average value is an average value of the count values obtained by six times counting.

Also, a preferable mode is one wherein the predetermined period of time is time required for counting the count values obtained by eight times counting and the average value is an average value of the count values obtained by eight times counting.

Also, a preferable mode is one wherein the changing of the predetermined voltage to be made by the circuit for changing a voltage to be compared is made based on a code that has been converted so that only one bit incorporated in the code is changed for one time change in counting the count values.

Also, a preferable mode is one wherein the changing of the predetermined voltage to be made by the circuit for changing a voltage to be compared is made based on the count values.

Also, a preferable mode is one wherein the circuit for changing a voltage to be compared is made up of an impedance circuit which includes a plurality of impedance elements being connected in parallel each being designated based on a bit incorporated in the count values wherein a first impedance element out of the impedance elements produces a first impedance, a second impedance element produces a second impedance being larger than the first impedance, and remaining impedance elements produce an impedance being larger than that of the second impedance element and of a first control circuit to control connection or disconnection of the first impedance element based on an up-signal output from the comparator and on a lowest order bit out of bits incorporated in the count values, of a second control circuit to control connection or disconnection of the second element based on a down-signal output from the comparator and on a lowest order bit out of bits incorporated in the count values, and of a third control circuit to ordinarily connect one impedance element out of the remaining impedance elements and to control connection or disconnection of every one of other impedance elements for every counting operation based on bits being higher than the lowest order bit.

Also, a preferable mode is one wherein when an impedance of remaining impedance elements of the circuit for changing a voltage to be compared is set to be 1 (one), an impedance of the first impedance element is set to be ½ (one half) and, when an impedance of the second impedance element is set to be ¾ (three-fourths), the predetermined voltage to be applied while the up-signal is being output from the comparator is set to be a voltage being lower by twenty-five percent than the predetermined voltage output by parallel connection of any one of the remaining impedance elements and the predetermined voltage to be applied while the down-signal is being output from the comparator is set to be a voltage being higher by twenty-five percent than the predetermined voltage output by parallel connection of any one of the remaining impedance elements.

Also, a preferable mode is one wherein the circuit for changing a voltage to be compared is configured by replacing the first impedance element with the second impedance element.

Also, a preferable mode is one wherein, when an impedance of remaining impedance elements of the circuit for changing a voltage to be compared is set to be 1 (one), an impedance of the first impedance element is set to be ¾ (three fourths) and, when an impedance of the second impedance element is set to be one half, the predetermined voltage to be applied while the up-signal is being output from the comparator is set to be a voltage being lower by ½ (fifty percent) than the predetermined voltage output by parallel connection of any one of the remaining impedance elements and the predetermined voltage to be applied while the down-signal is being output from the comparator is set to be a voltage being higher by ¼ (twenty-five percent) and more and by less than ½ (fifty percent) than the predetermined voltage output by parallel connection of any one of the remaining impedance elements.

Also, a preferable mode is one wherein the circuit for changing a voltage to be compared is made up of a resistor circuit being connected between an operating power source terminal and a first resistor element whose one terminal is connected to a reference voltage terminal and using another terminal of the first resistor element as an output terminal of the voltage to be compared, which has a second resistor element being connected between the operating power source terminal and the another terminal of the first resistor element and a plurality of third resistor elements being connected in parallel through switching elements between the operating power source terminal and another terminal of the first resistor element which provides a resistance being different from a resistance of the second resistor element, and of a first control circuit to control electric connection or disconnection of a switching element being connected serially to one of a plurality of the third resistor elements based on an up-signal output from the comparator and on a lowest order bit out of bits incorporated in the count values, of a second control circuit to control electric connection or disconnection of a switching element being connected serially to one of the plurality of the third resistor elements based on a down-signal output from the comparator and on a lowest order bit out of bits incorporated in the count value, and of a third control circuit to control electric connection or disconnection of every switching element for every counting operation which is connected to resistor elements except the two resistor elements out of the plurality of the second resistor elements based on a bit being higher than the lowest order bit.

Also, a preferable mode is one wherein the circuit for changing a voltage to be compared is configured by replacing the one resistor element with the another resistor element.

Also, a preferable mode is one wherein the circuit for changing a voltage to be compared has an impedance varying circuit placed on a package and a fourth resistor element, placed outside the package, being connected through a parasitic resistor mounted on the package to the impedance varying circuit and wherein an impedance of the impedance varying circuit and an impedance of the resistor element are set at a value being large enough to prevent an influence of an impedance of the parasitic resistor on a ratio of the impedance of the impedance varying circuit to the impedance of the fourth resistor element.

Also, a preferable mode is one wherein the circuit for changing a voltage to be compared has an impedance varying circuit, placed on a package, whose one terminal is connected to the operating power source terminal and whose another terminal is connected to one terminal of a parasitic resistor mounted on the package and to one input terminal of the comparator, a fourth resistor element, placed outside the package, whose one terminal is connected to another terminal of the parasitic resistor and whose another terminal is connected to a reference voltage terminal, and fifth and sixth resistor elements being connected serially between the operating power source terminal and the reference voltage terminal wherein their connecting point is connected to another input terminal of the comparator, and wherein a ratio of the impedance of the impedance varying circuit to a sum of the parasitic resistance and an impedance of the first resistor element is made equal to a ratio of an impedance of the fifth resistor element to an impedance of the sixth resistor element.

Furthermore, a preferable mode is one that wherein includes a code converting circuit to convert to a code wherein only one bit is changed for one time change of the count values having been averaged and wherein a control signal for the impedance matching is output using the code having been converted by the code converting circuit.

With the above configurations, by changing a voltage to be changed at levels being higher and lower than a level of a reference voltage and, even if the voltage to be compared gets closest to the reference voltage, by setting a voltage causing the voltage to be compared to change for every one count value output from an up-down counter at a voltage at which the voltage to be compared is apart from the reference voltage by an offset voltage of a comparator and by outputting a control data for impedance matching based on an average voltage of count values obtained by one counting operation of the up-down counter within a predetermined period of time, though the voltage to be compared changes, jitter of control signals for impedance matching can be suppressed.

With another configuration, by stabilizing the control signal for impedance matching so as to be constant, it is made possible to prevent occurrence of variation in matching impedance, thus enabling a purpose of the impedance matching to be successfully achieved.

With still another configuration, by suppressing the variation in matching impedance and by reducing errors in impedance matching, it is made possible to reduce a number of bits required for impedance matching. This serves to suppress occurrence of jitter caused by an increase in bit signals for impedance matching data, particularly in a high-speed interface of a GHz class used in a broadband network devices or a like. If such devices deal with the same number of bits, the amount of jitter caused in signals output from an output impedance matching circuit or input impedance matching circuit can be reduced the more. Therefore, in a technological environment requiring reduced jitter of the output signal, the present invention is very effective. Moreover, since the number of bits for the impedance matching data can be reduced, it is possible to reduce a number of circuits the more and a required area on a chip, thus serving to simplify circuits of the impedance matching data outputting circuit of the present invention.

With still another configuration, by making uniformed a change in an amount of a change in an impedance of a transistor which is changed by a control signal (change code), an amount of a change in the voltage to be compared which changes, with a shift voltage being included, in response to a change of one step of the change code can be made same. As a result, characteristics of a shift voltage required in a comparator become same, thus achieving stabilization of operations of a feedback control system.

With still another configuration, by structuring a part to fix an impedance to be of a transfer gate type and by connecting a linear resistor to the transfer gate, a range of a linear characteristic of a voltage to be compared can be made expanded.

With still another configuration, by expanding a range to a desired range, sensitivity adjustment of impedance in ordinary calibration operations can be achieved.

With still another configuration, by using a resistor instead of an impedance varying circuit, a variation of an impedance caused by a change in an operating voltage can be prevented, thus improving performance of impedance matching.

With still another configuration, by making ratios of two voltage-divided impedance (resistance value) of a circuit for changing a voltage to be changed be same and making a voltage-divided impedance of the circuit for producing the voltage to be change be extraordinarily larger than an impedance (resistance) of a circuit requiring impedance matching, an influence on a parasitic resistance can be almost removed. Moreover, by making a ratio of a voltage-divided impedance containing a parasitic resistance of the circuit for changing the voltage to be compared be equal to a ratio of a voltage-divided resistance which produces a reference voltage to be fed to a comparator, influences of parasitic resistors and/or a change in an operating voltage can be prevented.

BRIEF DESCRIPTION OF THE DRAWINGS

The above and other objects, advantages, and features of the present invention will be more apparent from the following description taken in conjunction with the accompanying drawings in which:

FIG. 6 is a diagram showing conversion of codes in a code converting circuit incorporated in the impedance matching data outputting circuit of FIG. 1;

FIG. 7 is a diagram showing a change in an impedance in an impedance varying circuit incorporated in the impedance matching data outputting circuit of FIG. 1;

FIG. 22 is a diagram showing a change in an impedance in the impedance varying circuit incorporated in the impedance matching data outputting circuit according to the sixth embodiment of the present invention;

FIG. 33 is a diagram showing data output from a conventional averaging circuit;

DETAILED DESCRIPTION OF THE PREFERRED EMBODIMENTS

Best modes of carrying out the present invention will be described in further detail using various embodiments with reference to the accompanying drawings.

First Embodiment

Figure 1:
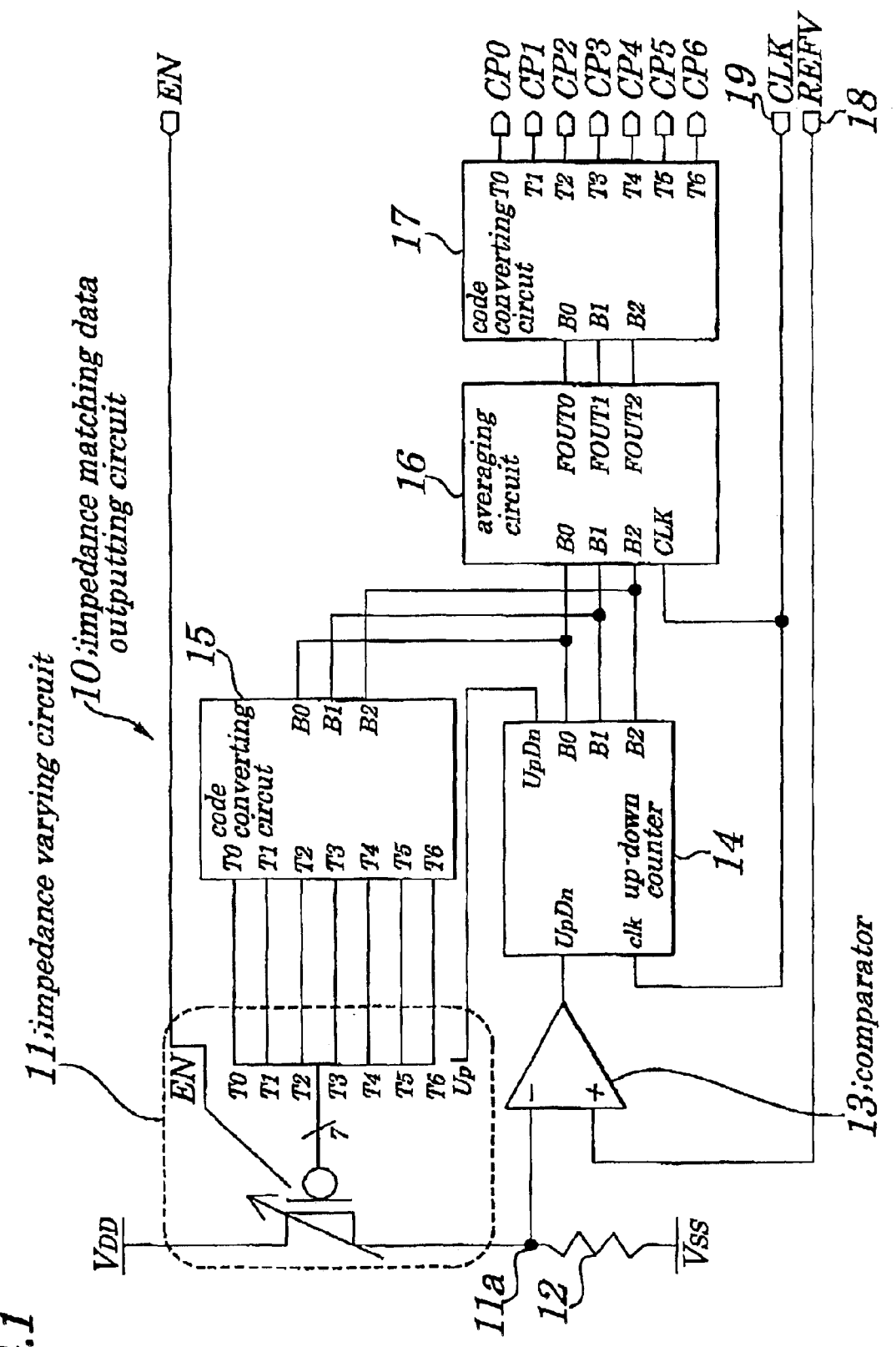
FIG. 1 is a schematic block diagram showing an impedance matching data outputting circuit according to a first embodiment of the present invention.
Figure 2:
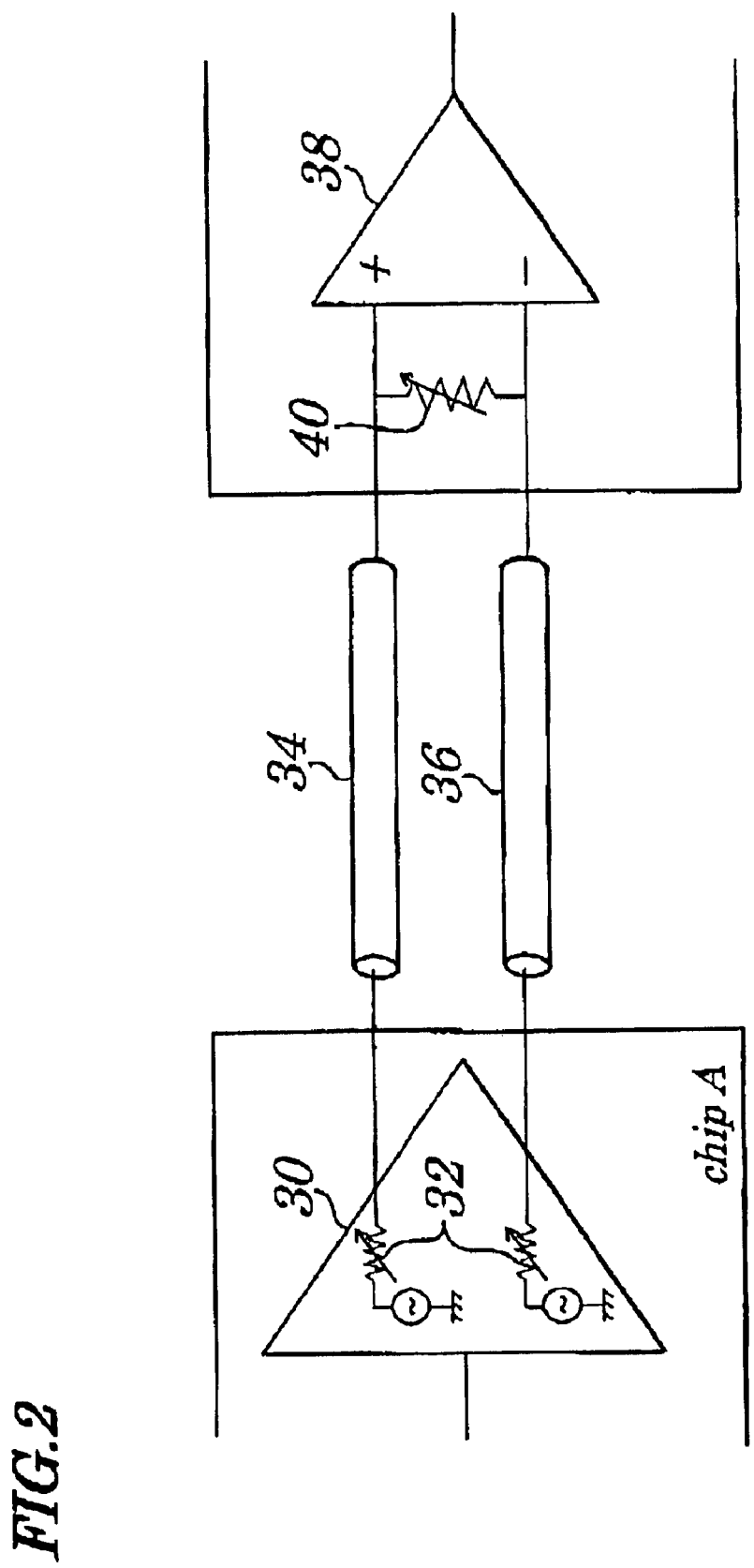
FIG. 2 is a diagram illustrating an example of a high-speed interface, to which the impedance matching data outputting circuit of FIG. 1 is applied, of a basic line for a network.
Figure 3:
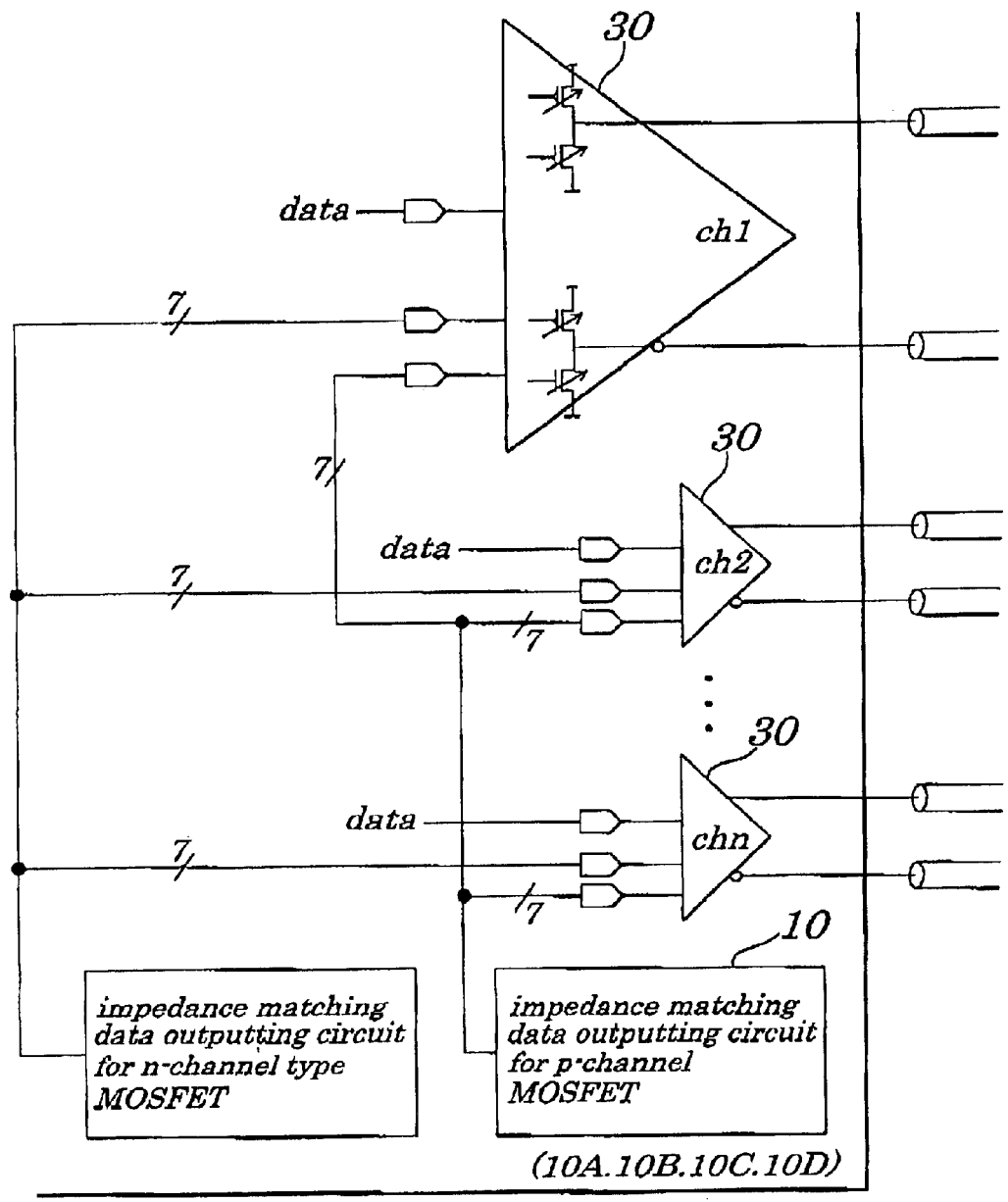
FIG. 3 is a diagram illustrating an example in which the impedance matching data outputting circuit of FIG. 1 is applied to the high speed interface of the basic line for the network.
Figure 4:
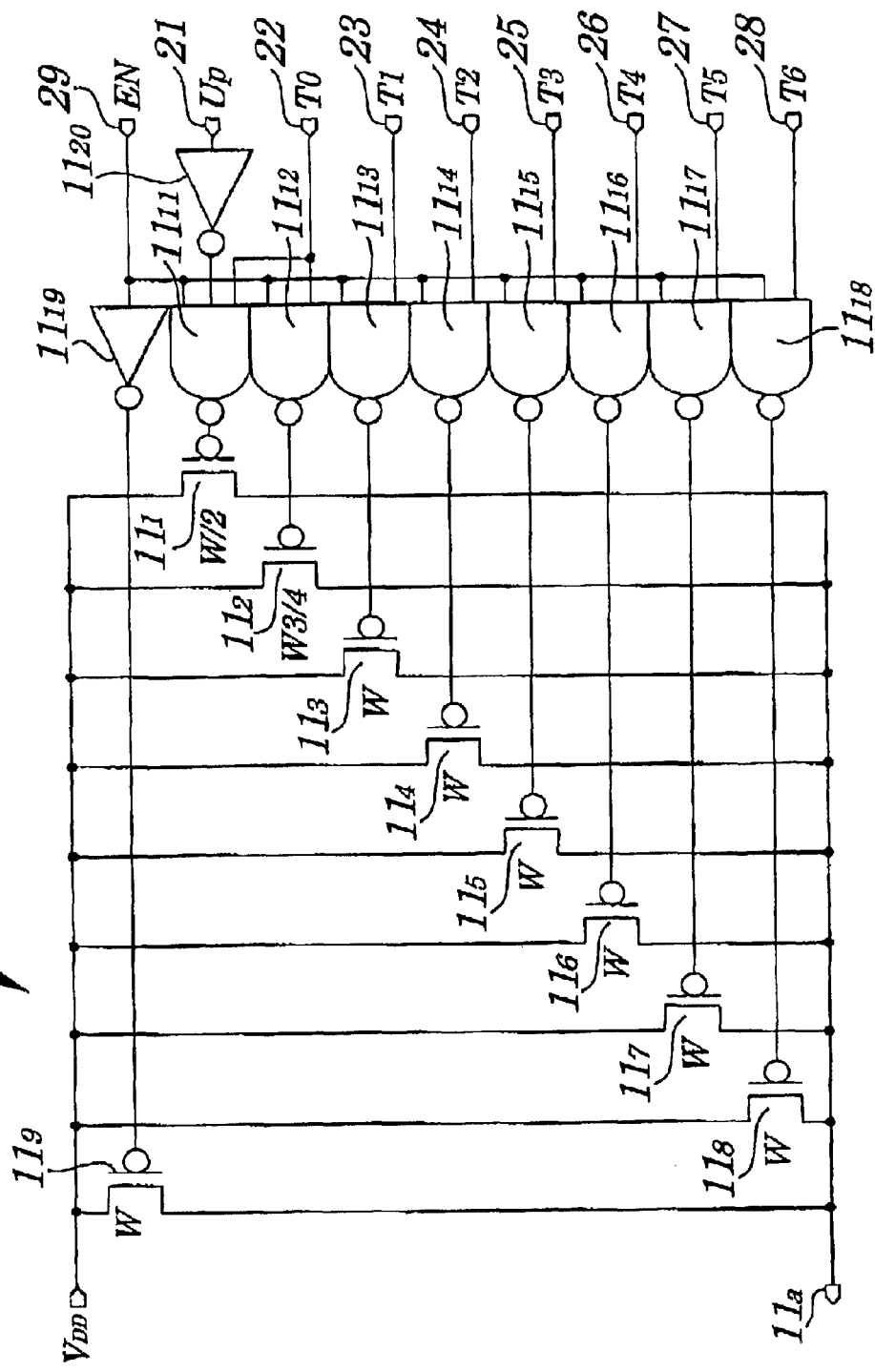
FIG. 4 is a diagram partially showing an impedance varying circuit incorporated in the impedance matching data outputting circuit of FIG. 1.
Figure 5:
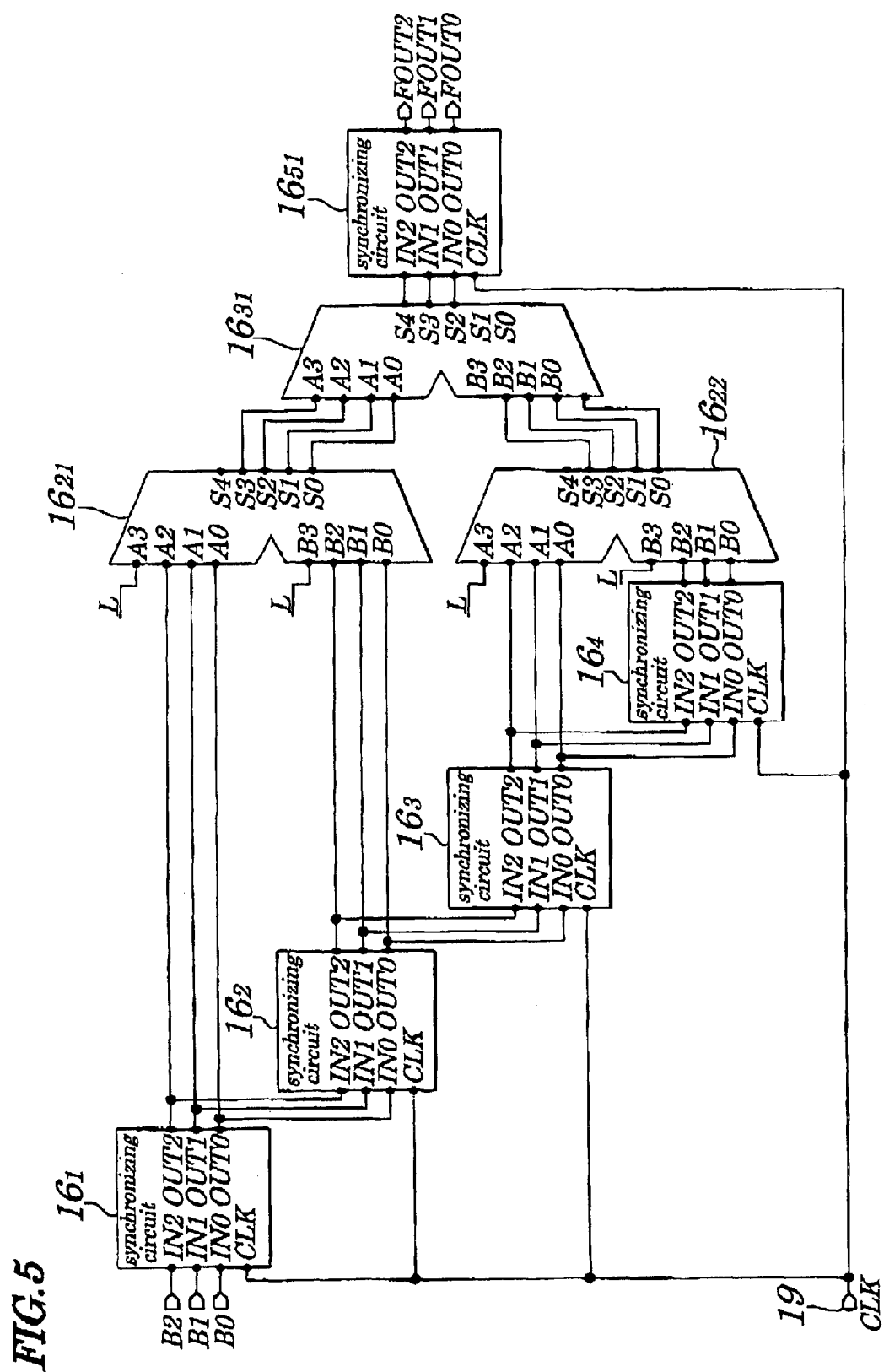
FIG. 5 is a schematic block diagram showing an averaging circuit incorporated in the impedance matching data outputting circuit of FIG. 1.
Figure 8:
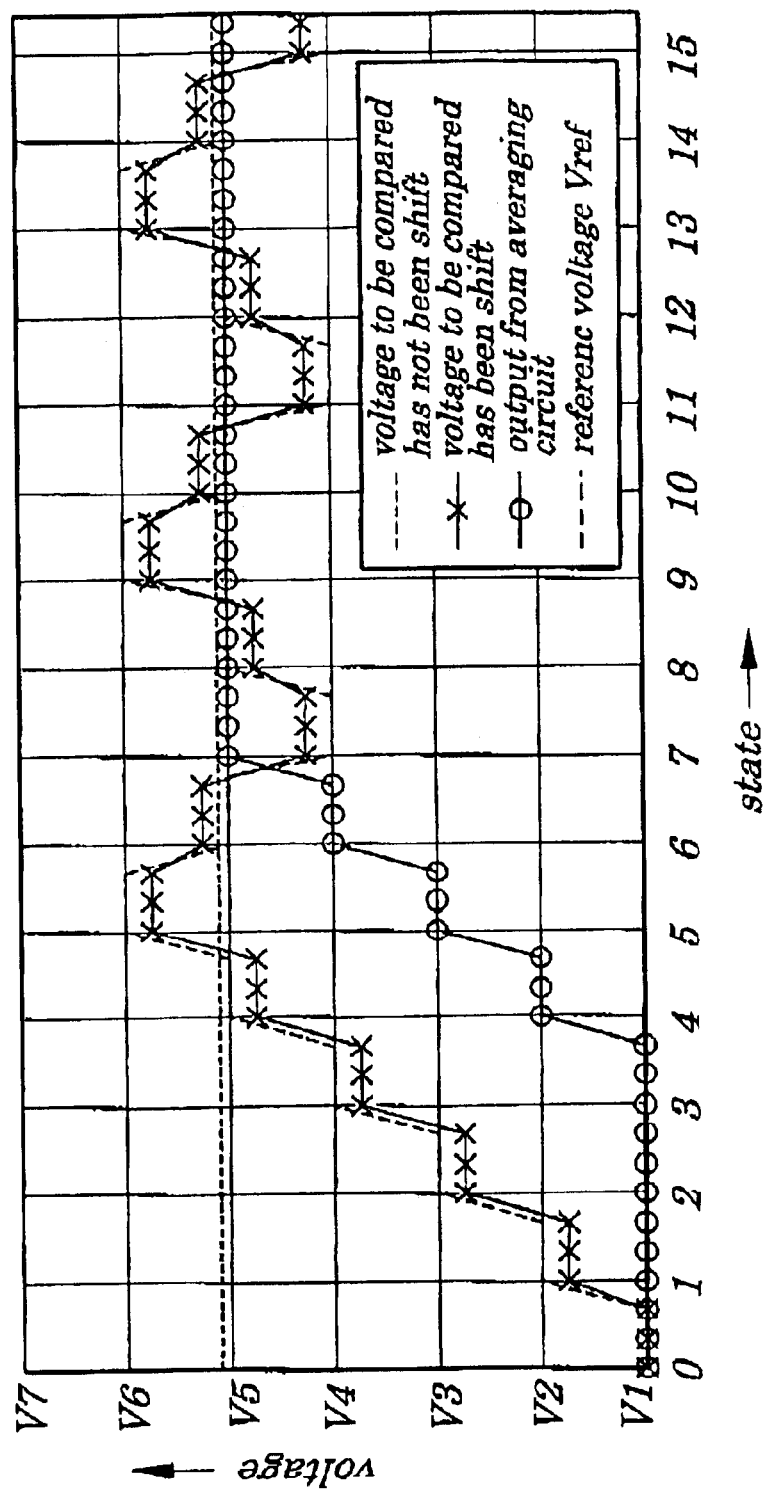
FIG. 8 is a graph showing, in an expanded manner, a relation between a state of operations of the impedance matching data outputting circuit of the first embodiment and a voltage to be compared.
Figure 9:
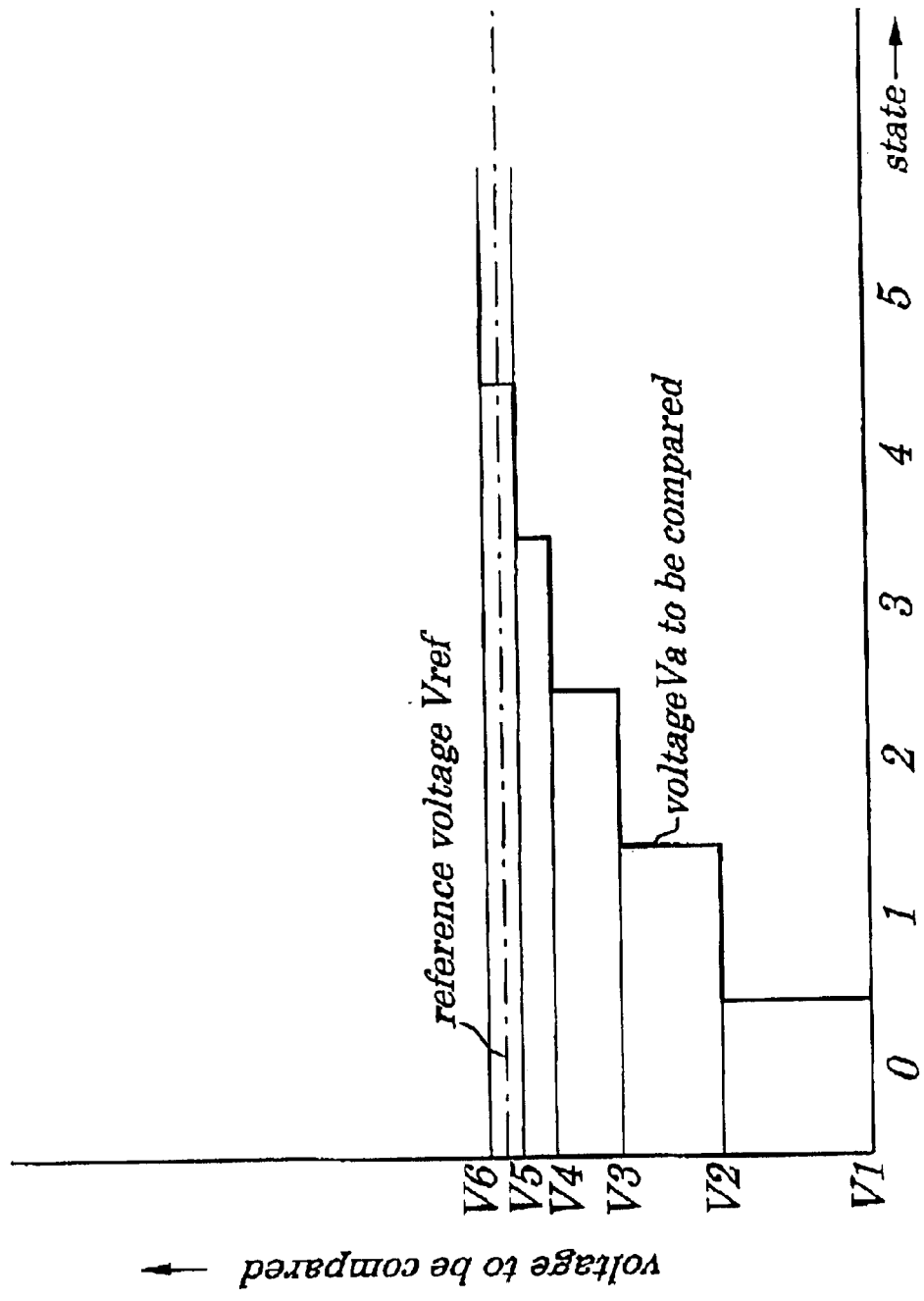
FIG. 9 is a graph showing an actual case to which a relation of a state of operations of the impedance matching data outputting circuit of the first embodiment to a voltage to be compared is applied.
Figure 10:
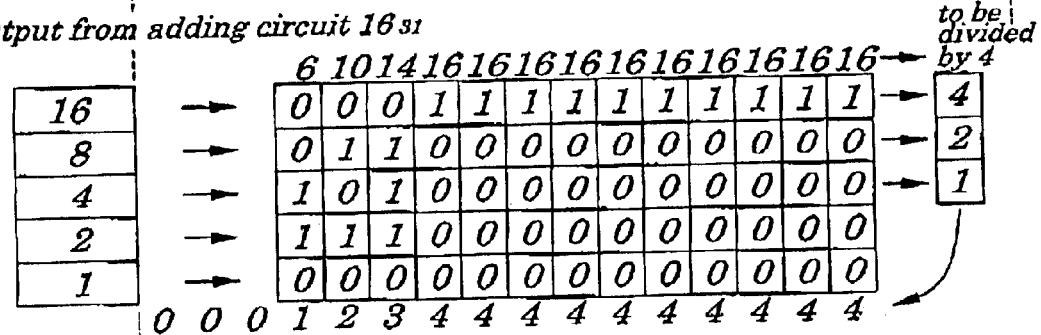
FIG. 10 is a timing chart explaining operations of an averaging circuit incorporated in the impedance matching data outputting circuit of the first embodiment of the present invention.
Figure 11:
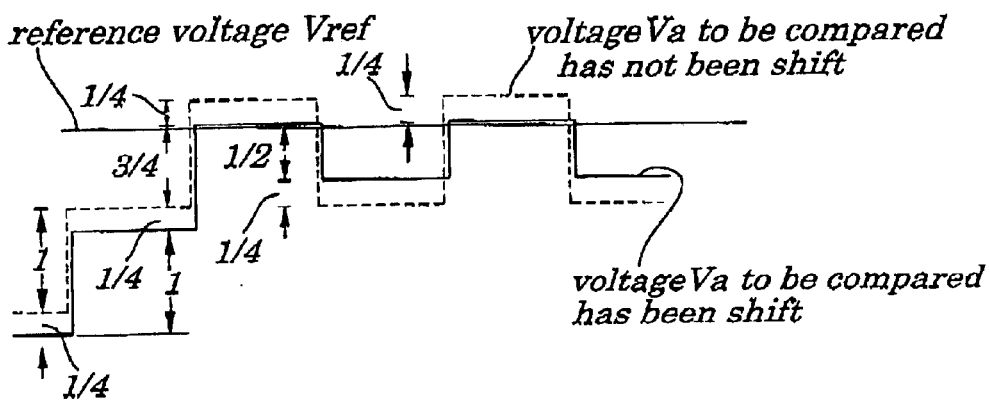
FIG. 11 is a diagram explaining one example of errors occurring in the impedance matching data outputting circuit of the first embodiment of the present invention.
Figure 12:
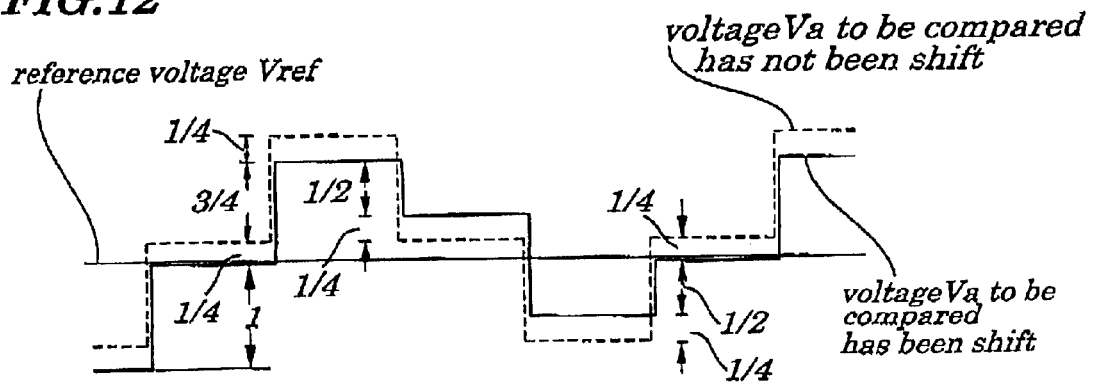
FIG. 12 is a diagram explaining another example of errors occurring in the impedance matching data outputting circuit of the first embodiment of the present invention.

FIG. 1 is a schematic block diagram showing an impedance matching control signal producing circuit (hereinafter referred to as an impedance matching data outputting circuit 10) according to a first embodiment of the present invention. FIG. 2 is a diagram illustrating an example of a high-speed interface, to which the impedance matching data outputting circuit 10 of FIG. 1 is applied, of a basic line for a network. FIG. 3 is a diagram illustrating an example in which the impedance matching data outputting circuit 10 of FIG. 1 is applied to the high speed interface of the basic line for the network. FIG. 4 is a diagram showing an impedance varying circuit 11 incorporated in the impedance matching data outputting circuit 10 of FIG. 1. FIG. 5 is a schematic block diagram showing an averaging circuit 16 incorporated in the impedance matching data outputting circuit 10 of FIG. 1. FIG. 6 is a diagram showing conversion of codes in a code converting circuit 17 incorporated in the impedance matching data outputting circuit 10 of FIG. 1. FIG. 7 is a diagram showing a change in an impedance of the impedance varying circuit 11 incorporated in the impedance matching data outputting circuit 10 of FIG. 1. FIG. 8 is a graph showing, in an expanded manner, a relation between a state of operations of the impedance matching data outputting circuit 10 of FIG. 1 and a voltage Va to be compared. FIG. 9 is a graph showing an actual case to which a relation of a state of operations of the impedance matching data outputting circuit 10 of the first embodiment to a voltage Va to be compared is applied. FIG. 10 is a timing chart explaining operations of the averaging circuit 16 incorporated in the impedance matching data outputting circuit 10 of the first embodiment. FIG. 11 is a diagram explaining one example of errors occurring in the impedance matching data outputting circuit 10 of the first embodiment. FIG. 12 is a diagram explaining another example of errors occurring in the impedance matching data outputting circuit 10 of the first embodiment.

In the impedance matching data outputting circuit 10 of the first embodiment, by regularly changing a voltage Va to be compared at levels being higher and lower than a level of a reference voltage Vref and by setting a voltage used to change the voltage Va to be compared in every one counting operation of an up-down counter at a voltage at which the voltage Va to be compared is apart by an offset voltage of a comparator 13 from the reference voltage Vref and by averaging count values within a predetermined period of time even when the voltage Va to be compared gets closest to the reference voltage Vref, an average value is not varied in ordinary operations.

The impedance matching data outputting circuit 10 of the first embodiment includes, as shown in FIG. 1, an impedance varying circuit 11, a resistor 12 serving as a DC (direct current) impedance element, a comparator 13, an up-down counter 14, a code converting circuit 15, an averaging circuit 16, and a code converting circuit 17.

Figure 32A:
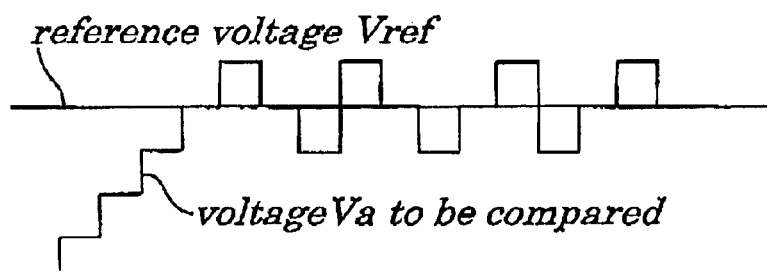
FIG. 32A is a diagram showing a change in an voltage to be compared in the conventional output impedance calibrating circuit and FIG. 32B is a diagram showing a change in an output from an averaging circuit being connected to an output terminal of the conventional output impedance calibrating circuit.
Figure 32B:
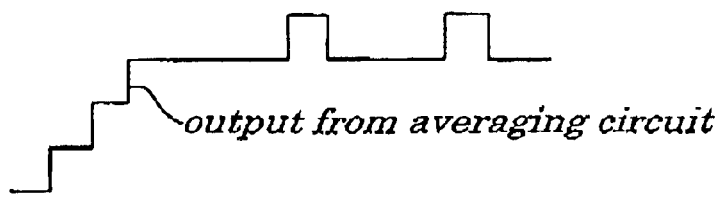
Figure 34:
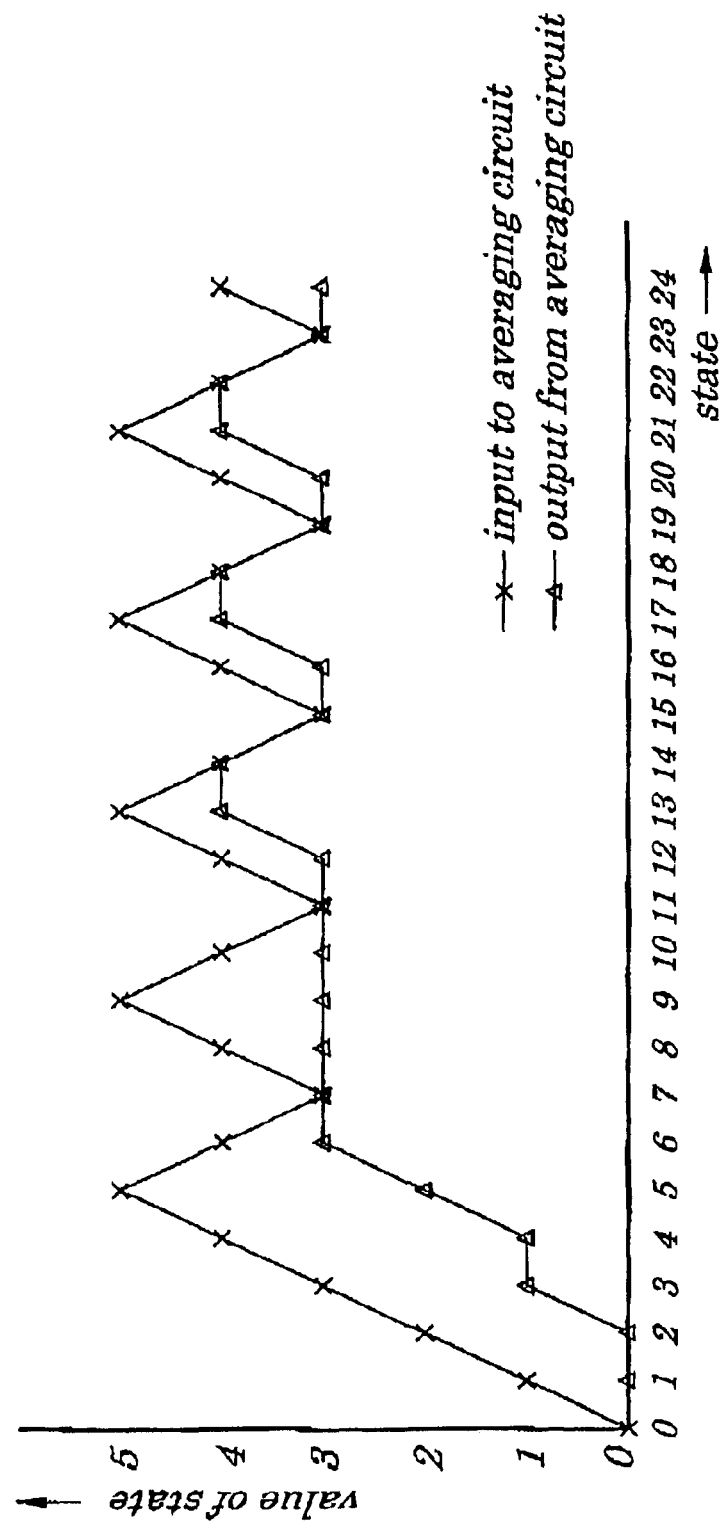
FIG. 34 is a graph showing data output from the conventional averaging circuit of FIG. 33.
Figure 35:
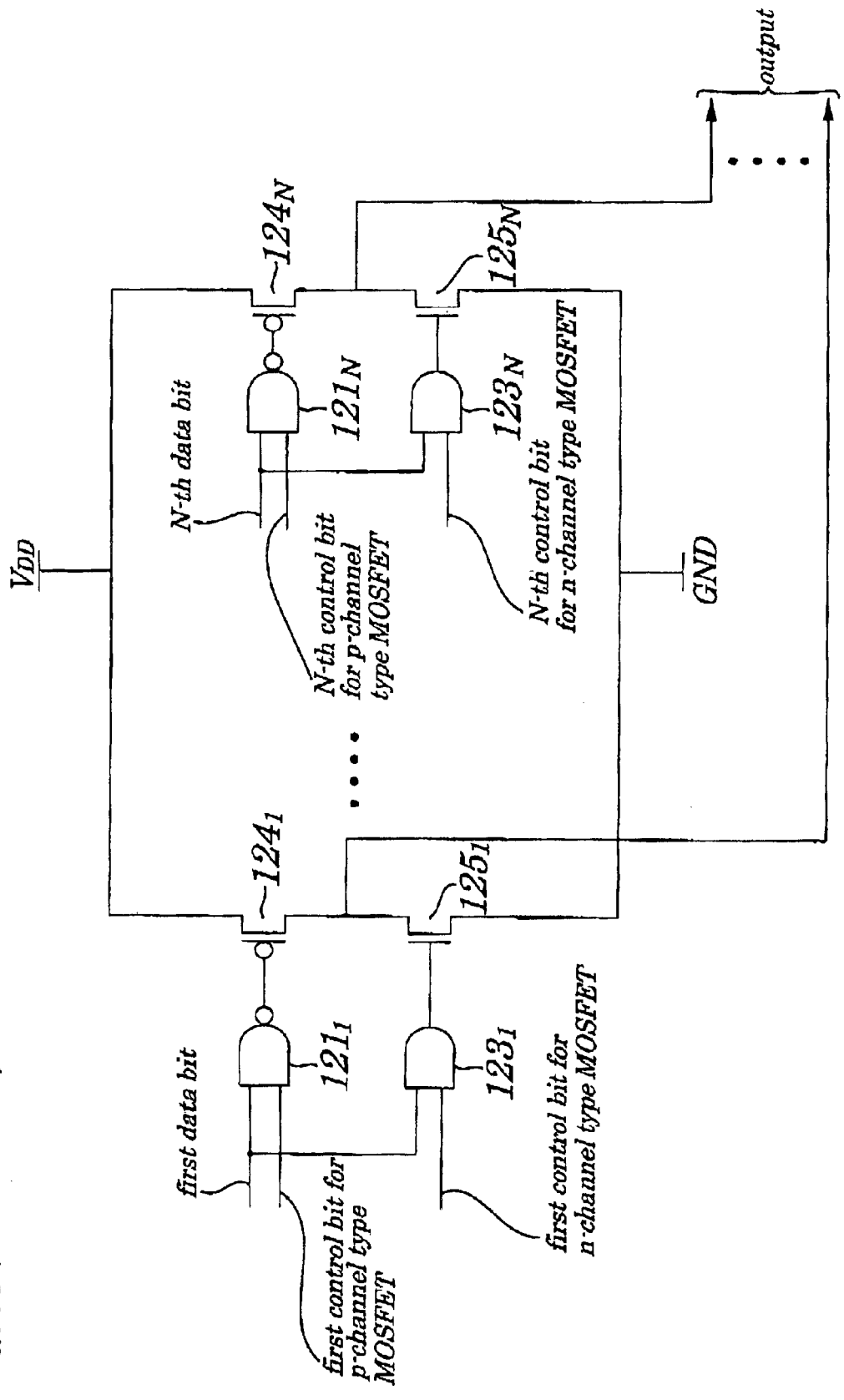
FIG. 35 is a diagram showing configurations of a conventional output buffer.

An outline of the impedance matching data outputting circuit 10 of the embodiment is described below by referring to FIG. 8. The "state 4" shown in FIG. 8 is an example of a case in which a voltage Va to be compared comes near to a reference voltage Vref being fixed to be about 5 V and, as a result, falls within a range of the offset voltage of the comparator 13. In this case, in the conventional case of the voltage Va to be compared to which no shift voltage has been fed, its state of changes in voltage depends on a condition at that time in which, as shown by dashed lines, whether or not the voltage Va to be compared crosses over a reference voltage Vref is influenced by a slight noise and, even after the process of having been averaged, a state of the change as shown in FIG. 32(B) occurs.

As shown by solid lines in FIG. 8, when the voltage Va to be compared to which a shift voltage has been fed and which is within a range of the offset voltage is put, due to a voltage rise by a voltage corresponding to one step, into a "state 5" where the voltage Va to be compared crosses over the reference voltage Vref, there is possibility that an operation to lower a voltage is performed in the next "state 6" in the same way as in the conventional case. However, in the embodiment of the present invention, a voltage is lowered not by a voltage corresponding to one step but by a voltage being smaller than that corresponding to one step so that the voltage Va to be compared does not come into the range of the offset voltage.

As a result, since the voltage Va to be compared in the "state 6" does not cross over the reference voltage Vref due to a small step value by which the voltage Va to be compared has been lowered, an operation to lower the voltage Va to be compared is performed in the next "state 7". At this point, the voltage Va to be compared is lowered by a voltage corresponding to one step.

Since the voltage Va to be compared always crosses over the reference voltage Vref, an operation to boost the voltage Va to be compared is performed in the "state 8". However, in this case, in the embodiment of the present invention, a voltage is boosted not by a voltage corresponding to one step but by a voltage being smaller than that corresponding to one step. As a result, since the voltage Va to be compared in the "state 8" does not exceed the reference voltage, Vref due to a small step value by which the voltage Va to be compared has been boosted, an operation to boost the voltage Va to be compared is performed in the next "state 9".

Thus, according to the present invention, by repeated operations described above, the voltage Va to be compared is changed regularly in a repeated manner being centered on the reference voltage Vref as shown by solid lines. When the voltages to be compared obtained by this regularly repeated change are averaged, the voltage Va to be compared naturally becomes constant at a voltage being near to the reference value.

As described above, according to the present invention, in order to achieve such the regular change in the voltage Va to be compared, a potential corresponding to one step to be applied when a change in the voltage Va to be compared is switched from its increasing state to its decreasing state and from its decreasing state to its increasing state, is made smaller than a potential corresponding to one step to be applied when the voltage Va to be compared is caused to continue increasing or decreasing. This state is called a "state where a shift voltage has been fed to a voltage Va to be compared". An aim of the present invention is to suppress jitters in a control signal to be used for impedance matching.

Conventionally, in order to achieve this aim, a measure to suppress variation in a voltage Va to be compared is taken. However, due to a change in characteristics caused by a change in temperatures of a device to be used, variation in manufacturing conditions, or a like, it is very difficult to the variation in the voltage Va to be compared. Therefore, the present invention employs a method in which a voltage Va to be compared is made constant not by suppressing variation in the voltage Va to be compared but by changing the voltage Va to be compared regularly and by taking an average value of the voltages to be compared that have been changed in a repeated manner. Hereinafter, this method is explained in order.

The impedance varying circuit 11, as shown in FIG. 4, is made up of impedance elements $11_1$ to $11_9$, NAND circuits $11_{11}$ to $11_{18}$, and inverters $11_{19}$ and $11_{20}$. Each of the impedance elements $11_3$ to $11_9$ is made up of a P-channel type MOSFET having a channel width being "W". The impedance element $11_1$ is made up of a P-channel type MOSFET having a channel width being is made up of ½ (one-seconds)(shown as ½W) of a channel width W of each of the impedance elements (P-channel type MOSFETs) $11_3$ to $11_9$. The impedance element $11_2$ is made up of a P-channel type MOSFET having a channel width being ¾ (three-fourth)(shown as ¾W) of the channel width "W" of each of the impedance elements (P-channel type MOSFETs) $11_3$ to $11_9$.

The impedance elements (P-channel type MOSFETs) $11_1$ to $11_9$ are connected in parallel between a voltage (power) source terminal $V_{DD}$ and a connecting point $11_a$. The connecting point $11_a$ exists at a connecting point between the impedance varying circuit 11 and a DC impedance element 12.

An input terminal of the inverter $11_{19}$ is connected to an EN terminal 29. An input terminal of the inverter $11_{20}$ is connected to an UP terminal 21. A first input terminal out of three input terminals of the NAND circuit $11_{11}$ is connected to the EN terminal 29, its second input terminal is connected to an output terminal of the inverter $11_{20}$, and its third input terminal is connected to a T0 terminal 22. A first input terminal out of two input terminals of the NAND circuit $11_{12}$ is connected to the EN terminal 29 and its second input terminal is connected to the T0 terminal 22. A first input terminal out of two input terminals of the NAND circuit $11_{13}$ is connected to the EN terminal 29 and its second input terminal is connected to a T1 terminal 23. A first input terminal out of two input terminals of the NAND circuit $11_{14}$ is connected to the EN terminal 29 and its second input terminal is connected to a T2 terminal 24. A first input terminal out of two input terminals of the NAND circuit $11_{15}$ is connected to the EN terminal 29 and its second input terminal is connected to a T3 terminal 25. A first input terminal out of two input terminals of the NAND circuit $11_{16}$ is connected to the EN terminal 29 and its second input terminal is connected to a T4 terminal 26. A first input terminal out of two input terminals of the NAND circuit $11_{17}$ is connected to the EN terminal 29 and its second input terminal is connected to a T5 terminal 27. A first input terminal out of two input terminals of the NAND circuit $11_{18}$ is connected to the EN terminal 29 and its second input terminal is connected to a T6 terminal 28.

As shown in FIG. 4, an output terminal of the inverter $11_{19}$ is connected to a gate of the impedance element (P-channel type MOSFET) $11_9$. An output terminal of the NAND circuit $11_{11}$ is connected to a gate of the impedance element (P-channel type MOSFET) $11_1$. An output terminal of the NAND circuit $11_{12}$ is connected to a gate of the impedance element (P-channel type MOSFET) $11_2$. An output terminal of the NAND circuit $11_{13}$ is connected to a gate of the impedance element (P-channel type MOSFET) $11_3$. An output terminal of the NAND circuit $11_{14}$ is connected to a gate of the impedance element (P-channel type MOSFET) $11_4$. An output terminal of the NAND circuit $11_{15}$ is connected to a gate of the impedance element (P-channel type MOSFET) $11_5$. An output terminal of the NAND circuit $11_{16}$ is connected to a gate of the impedance element (P-channel type MOSFET) $11_6$. An output terminal of the NAND circuit $11_{17}$ is connected to a gate of the impedance element (P-channel type MOSFET) $11_7$. An output terminal of the NAND circuit $11_{18}$ is connected to a gate of the impedance element (P-channel type MOSFET) $11_8$.

As shown in FIG. 1, a minus (−) input of the comparator 13 is connected to the connecting point $11_a$ and its plus (+) input is connected to an input terminal of a reference voltage input terminal (REFV) 18. As shown in FIG. 1, an UpDn input terminal of the up-down counter 14 is connected to an output of the comparator 13 and its clock signal input (CLK) is connected to a clock signal input terminal (CLK) 19. Input terminals B0, B1, and B2 of the code converting circuit 15 are connected respectively to output terminals B0, B1, and B2 of the up-down counter 14. As shown in FIG. 1, T0 terminal 22 (see FIG. 4), T1 terminal 23, . . . , and T6 terminal 28 of the impedance varying circuit 11 are connected respectively to output terminals T0, T1, T2, T3, T4, T5, and T6 of the code converting circuit 15.

As shown in FIG. 1, input terminals B0, B1, and B2 of the averaging circuit 16 are connected respectively to output terminals B0, B1, and B2 of the up-down counter 14. Moreover, a clock signal input (CLK) of the averaging circuit 16 is connected to the clock signal input terminal (CLK) 19. The averaging circuit 16 filters three binary-coded values being changeable so that the three binary-coded values gets closest to the reference value and become stable.

As shown in FIG. 5, the averaging circuit 16 is made up of synchronizing circuits $16_1$, $16_2$, $16_3$, and $16_4$, adding circuits $16_{21}$, $16_{22}$, and $16_{31}$, and a synchronizing circuit $16_{51}$. Input terminals IN0, IN1, and IN2 of the synchronizing circuit $16_1$ are connected respectively to the output terminals B0, B1, and B2 of the up-down counter 14. Output terminals OUT0, OUT1, and OUT2 are connected respectively to input terminals IN0, IN1, and IN2 of the synchronizing circuit $16_2$ and respectively to added-input terminals A0, A1, and A2 of the adding circuit $16_{21}$. output terminals OUT0, OUT1, and OUT2 of the synchronizing circuit $16_2$ are connected respectively to input terminals IN0, IN1, and IN2 of the synchronizing circuit $16_3$ and respectively to adding-input terminals B0, B1, and B2 of the adding circuit $16_{21}$.

Output terminals OUT0, OUT1, and OUT2 of the synchronizing circuit $16_3$ are connected respectively to input terminals IN0, IN1, and IN2 of the synchronizing circuit $16_4$ and respectively to added-input terminals A0, A1, and A2 of the adding circuit $16_{22}$. Output terminals OUT0, OUT1 and OUT2 of the synchronizing circuit $16_4$ are connected to respectively to adding-input terminals B0, B1, and B2 of the adding circuit $16_{22}$. To added-input terminals A3 of the adding circuit $16_{21}$ and to adding-input terminals B3 of the adding circuit $16_{22}$ is supplied a low-level voltage respectively.

Adding-output terminals S0, S1, S2, and S3 of the adding circuit $16_{21}$ are connected respectively to added-input terminals A0, A1, A2, and A3 of the adding circuit $16_{31}$. Adding-output terminals S0, S1, S2, and S3 of adding circuit $16_{22}$ are connected respectively to adding-input terminals B0, B1, B2, and B3 of the adding circuit $16_{31}$. Adding-output terminals S2, S3, and S4 of the adding circuit $16_{31}$ are connected respectively to input terminals IN0, IN1, and IN2 of the synchronizing circuit $16_{51}$. Output terminals OUT0, OUT1, and OUT2 of the synchronizing circuit $16_{51}$ are connected respectively to output terminals FOUT0, FOUT1, and FOUT2 of the averaging circuit 16. To clock signal input (CLK input) terminals of the synchronizing circuit $16_1$, $16_2$, $16_3$, $16_4$, and $16_{51}$ is connected a clock signal terminal 19.

As shown in FIG. 1, the input terminal B0 of the code converting circuit 17 is connected to the output terminal FOUT0 of the averaging circuit 16 and the input terminal B1 of the code converting circuit 17 is connected to the output FOUT1 of the averaging circuit 16 and the input terminal B2 of the code converting circuit 17 is connected to the output terminal FOUT2 of the averaging circuit 16. Output terminals T0, T1, T2, T3, T4, T5, and T6 of the code converting circuit 17 are connected respectively to output terminals CP0, CP1, CP2, CP3, CP4, CP5, and CP6 of the impedance matching data outputting circuit 10. The code converting circuit 17 is used to solve a technological problem which arises due to skew occurring among bits incorporated in impedance matching data being outputs from the code converting circuit 17, that is, to avoid a problem that, when impedance matching is performed on a circuit which requires impedance matching, an extremely different impedance is fed to the circuit that requires impedance matching in a transient manner.

An output of the impedance matching data outputting circuit 10, as shown in FIG. 3, is used to control a channel width of a P-channel type MOSFET of an output buffer 30 on a side of a sending-end of a high-speed interface. Moreover, since the buffer 30 has an N-channel type MOSFET as its component, a circuit being equivalent to the impedance matching data outputting date 10 for the P-channel type MOSFET that can be used in the impedance matching data outputting circuit 10 for the N-channel type MOSFET is required, however, it is not shown in FIG. 3. The impedance matching data outputting circuit 10 can be used to control a channel width of the P-channel MOSFET or the N-channel type MOSFET of the input buffer, instead of the output buffer. In FIG. 3, reference numbers 10A, 10B, 10C, and 10D for impedance matching data outputting circuits are shown together with the impedance matching data outputting circuit 10. These numbers are referred in other embodiments described later.

As shown in FIG. 2, an impedance element 32 that requires impedance matching is connected in the output buffer 30. The output buffer 30 outputs a non-inverse signal and an inverse signal, as an electrical signal, with same timing and in parallel. These two signals are transmitted through transmitting paths 34 and 36 to a comparator 38 connected to a receiving-end of the high-speed interface. The transmitting paths 34 and 36 are terminated by a terminating impedance element 40 at an inputting-end of the comparator 38.

Next, operations of the impedance matching data outputting circuit 10 of the first embodiment are described by referring to FIG. 1 to FIG. 11. In the impedance matching data outputting circuit 10, a voltage Va to be compared (not shown in Figures) occurring at a connecting point $11_a$ according to an impedance provided by the impedance varying circuit 11 is compared with a reference voltage Vref by the comparator 13. If the reference voltage Vref is higher than the voltage Va to be compared, an Up-signal is output from the comparator 13 and if the voltage Va to be compared is higher than the reference voltage Vref, a down-signal is output from the comparator 13.

When an Up-signal is output from the comparator 13, the up-down counter 14 increases its count value (is incremented) by a binary value "1" for every clock signal being input to the clock signal input terminal (CLK) 19. When a down-signal is output from the comparator 13, the up-down counter 14 decreases its count value (is decremented) by a binary value "1" for every clock signal being input to the clock signal input terminal (CLK) 19. A binary count value (hereinafter may be referred to as "binary code" or "binary value") made up of a B0 bit, B1 bit, and B2 bit output for every clock signal from the up-down counter 14 is fed to the code converting circuit 15 and the averaging circuit 16.

The code converting circuit 15 converts a binary code made up of a B0 bit, B1 bit, and B2 bit fed from the up-down counter 14 to a thermometer code made up of a T0 bit, T1 bit, T2 bit, T3 bit, T4 bit, T5 bit, and T6 bit and outputs it. Each of the T0 bit, T1 bit, T2 bit, T3 bit, T4 bit, T5 bit and T6 bit, which makes up the thermometer code, is fed to each of corresponding terminals T0, T1, T2, T3, T4, T5, and T6 of the impedance varying circuit 11.

To the EN terminal 29 of the impedance varying circuit 11 is fed a high-level EN signal in ordinary operations of the impedance matching data outputting circuit 10. The EN signal is used to stop operations of the impedance matching data outputting circuit in order to reduce power consumption or to achieve other purposes and is fed from an internal circuit (not shown) in a chip mounting the impedance matching data outputting circuit 10. Therefore, in FIG. 4, since a low-level voltage signal is output from the inverter $11_{19}$, the impedance element (P-channel type MOSFET) $11_9$ is in an ON state.

Moreover, in FIG. 4, each of the NAND circuits $11_{11}$ to $11_{18}$ to which a high-level EN signal is fed from the EN terminal 29 is conditioned to output a low-level or high-level voltage signal according to a voltage signal fed to other input terminal of each of the NAND circuits $11_{11}$ to $11_{18}$. In addition, in a state in which a high-level Up-signal is fed to an Up terminal 21 from the up-down counter 14, a low-level voltage signal is output from the inverter $11_{20}$.

Therefore, in a state where a high-level Up-signal has been fed to the Up terminal 21 from the up-down counter 14 (in the case of "UP=1" in FIG. 7), a T0 bit fed to the T0 terminal does not serve to effectively control a voltage signal output from the NAND circuit $11_{11}$ and the high-level voltage signal continues to be output from the NAND circuit $11_{11}$. Each of other NAND circuits $11_{12}$ to $11_{18}$ outputs a voltage signal being at a level corresponding to each of the T0 bit, T1 bit, T2 bit, T3 bit, T4 bit, T5 bit, and T6 bit, which are fed respectively to the T0, T1, T2, T3, T4, T5, and T6 terminals.

Therefore, in the impedance varying circuit 11, an impedance element (P-channel type MOSFET), out of the impedance elements (P-channel type MOSFETs) $11_2$ to $11_8$, which corresponds to each of the T0 bit, T1 bit, T2 bit, T3 bit, T4 bit, T5 bit, and T6 bit each being fed to each of the T0, T1, T2, T3, T4, T5, and T6 terminals, is turned ON or OFF and an impedance according to this ON/OFF operation is provided. Every time a binary value "1" occurs (that is, a high-level signal occurs) sequentially for each of the T0 bit, T1 bit, T2 bit, T3 bit, T4 bit, T5 bit, and T6 bit, the impedance value becomes smaller in a step-wise manner (in the case of "UP=1" in FIG. 7). An impedance value becomes smaller by an amount of a voltage caused by parallel connection of the impedance element (P-channel type MOSFET) $11_1$. As a result, a level of a voltage Va to be compared occurring at the connecting point $11_a$ when the impedance element (P-channel type MOSFET) $11_1$ is connected in parallel, is lower than that occurring when the impedance element (P-channel type MOSFET) $11_1$ is not connected in parallel. That is, an offset voltage is added to the voltage Va to be compared (hereinafter the offset voltage being called a "shift voltage").

Moreover, in a state where a low-level Up-signal is fed to the Up terminal 21 from the up-down counter 14 (in the case of "UP=0" in FIG. 7), the T0 bit fed to the T0 terminal serves to effectively control a voltage signal output from the NAND circuit $11_{11}$ and a low-level voltage signal continues to be output from the NAND circuit $11_{11}$. The impedance element (P-channel type MOSFET) $11_1$ continues to be ON. Like in the case of "UP=1", each of other NAND circuits $11_{12}$ to $11_{18}$ outputs a voltage signal being at a level corresponding to each of the T0 bit, T1 bit, T2 bit, T3 bit, T4 bit, T5 bit, and T6 bit, which are fed respectively to the T0, T1, T2, T3, T4, T5, and T6 terminals.

Therefore, in the impedance varying circuit 11, an impedance element (P-channel type MOSFET), out of the impedance elements (P-channel type MOSFETs) $11_1$ to $11_8$, which corresponds to each of the T0 bit, T1 bit, T2 bit, T3 bit, T4 bit, T5 bit, and T6 bit each being fed to each of the T0, T1, T2, T3, T4, T5, and T6 terminals, is turned ON or OFF and an impedance according to this ON/OFF operation is provided. Every time a binary value being "1" occurs (that is, a high-level signal occurs) sequentially for the T0 bit, T1 bit, T2 bit, T3 bit, T4 bit, T5 bit, and T6 bit, the impedance value becomes smaller in a step-wise manner (in the case of "UP=0" occurring at a "down" time in FIG. 7).

A rate at which the impedance value becomes smaller at the "down" time in a step-wise manner, is larger, by an amount of a voltage caused by parallel connection of the impedance element (P-channel type MOSFET) $11_1$, compared with a case when the impedance value becomes smaller at the "up" time. The offset voltage becomes larger by an amount of a voltage caused by the parallel connection of the impedance element (P-channel type MOSFET) $11_1$. Therefore, the voltage Va to be compared occurring at the connection point $11_a$ is higher than that occurring when the impedance element (P-channel type MOSFET) $11_1$ is not connected in parallel.

As described above, the binary code made up of a B0 bit, B1 bit, and B2 bit output from the up-down counter 14 is fed to the code converting circuit 15 and, at a same time, to the averaging circuit 16. The averaging circuit 16 does addition of four codes existing before the binary code, for every binary code (any binary code is made up of a B0 bit, B1 bit, and B2 bit) output sequentially from the up-down counter 14 and divides its sum by four to output an averaged binary code each made up of three bits including an FOUT0 bit, FOUT1 bit, and FOUT2 bit.

The averaged binary code made up of the FOUT0 bit, FOUT1 bit, and FOUT2 is fed to the code converting circuit 17 in which the averaged binary code is converted into a thermometer code and the code converting circuit 17 outputs the resulting thermometer code made up of seven bits including a CP0 bit, CP1 bit, CP2 bit, CP3 bit, CP4 bit, CP5 bit, and CP6 bit, being equivalent to bits to be converted in the code converting circuit 15. The seven-bit thermometer code (that is, impedance matching data) is fed to an impedance matching circuit (not labeled) that requires impedance matching in the high-speed interface (not labeled) shown in FIG. 2 and is used for impedance matching.

A specific example of operations of the impedance matching data outputting circuit 10 is described below. For convenience of description, let it be assumed that a reference voltage Vref is represented in binary as "101", a voltage Va to be compared (see FIG. 8) occurring at the connecting point $11_a$ is represented in binary as "000", a count value existing before the up-down counter 14 starts its counting operations in response to a clock signal is represented in binary as "000" and that an Up-signal (in the case of "Up=1", that is, the Up-signal is given the binary value "1") is output from the UpDn output terminal of the up-down counter 14 and a binary value "0" is output from each of the output terminals B0, B1, and B2. The state is shown as a "state 0" in FIGS. 8 and 10. Moreover, "000" is set to each of the synchronizing circuits $16_1$ to $16_4$ and $16_{51}$.

In FIG. 8, intervals among reference characters V1 to V7 representing voltages shown at a vertical axis are assigned so as to be equal in order to clarify features of the first embodiment of the present invention. However, in actual operations, as shown in FIG. 9, the intervals among the reference characters V1 to V6 become smaller as positions become higher on the vertical axis.

The code converting circuit 15 which receives a binary code made up of B0=0, B1=0, and B2=0 (in the case of a code number being 0 in FIG. 6) outputs a thermometer code made up of T0=0, T1=0, T2=0, T3=0, T4=0, T5=0 and T6=0 respectively from its seven pieces of output terminals T0, T1, T2, T3, T4, T5, and T6. Therefore, the impedance elements (P-channel type MOSFETs) $11_1$ to $11_8$ in the impedance varying circuit 11 are turned OFF and only the impedance element (P-channel type MOSFET) $11_9$ is turned ON. An impedance value of the impedance varying circuit 11 becomes a value being proportional to "1/W" (in the case of the code number 0 in FIG. 7). Now, let it be assumed that a voltage Va to be compared occurring at the connecting point $11_a$ is a voltage V1 being lower by voltages corresponding to four steps than a reference voltage Vref (here, the voltage V1 being called a lowest voltage Va to be compared). In FIG. 8, a voltage corresponding to one step is shown so as to be same for all steps, however, in reality, as shown in FIG. 10, the voltage corresponding to one step is different in all steps.

In a state where a reference voltage Vref is larger than a voltage Va to be compared and an Up-signal being "1" in binary is output from the comparator 13 and is fed to the UpDn input terminal of the up-down counter 14, when a first clock signal is fed to the up-down counter 14, a count value output from the up-down counter 14 increases by "1" and becomes a binary code made up of B2=0, B1=0, and B0=1. A signal occurring at the UpDn output terminal of the up-down counter 14 remains the Up-signal "Up".

The binary code made up of B2=0, B1=0, and B0=1 output from the up-down counter 14 is fed to the code converting circuit 15 and to the averaging circuit 16. The binary count value being made up of B2=0, B1=0, and B0=1 is converted by the code converting circuit 15 to the thermometer code made up of T0=1, T1=0, T2=0, T3=0, T4=0, T5=0, and T6=0 in the code converting circuit 15 (in the case of the code number 1 in FIG. 6). Therefore, only the impedance elements (P-channel type MOSFETs) $11_2$ and $11_9$ in the impedance varying circuit 11 are turned ON and the impedance elements (P-channel type MOSFETs) $11_3$ to $11_8$ are in an OFF state. An impedance of the impedance varying circuit 11 becomes a value being proportional to $1/(w+\frac{3}{4}W)$ (in the case of the code number 1 in FIG. 7).

At this point, a voltage Va to be compared occurring at the connecting point $11_a$ becomes a voltage being slightly lower than a voltage V2 which is higher by a voltage corresponding to one step than a lowest voltage Va to be compared. The voltage Va to be compared still remains lower than the reference voltage Vref. A state of this voltage is shown in FIG. 8 as a "state 1" where a shift voltage has been fed to the voltage Va to be compared. Therefore, an Up-signal continues to be output from the comparator 13. Moreover, small dashed lines show that no shift voltage has been fed to the voltage Va to be compared.

Moreover, since a first clock signal is fed also to the averaging circuit 16, a binary count value made up of B2=0, B1=0, and B0=1 is set in the synchronizing circuit $16_1$ in the averaging circuit 16. This state is shown in FIG. 10 as a "state 1".

Before the above setting is completed, after a binary value being set in the synchronizing circuit $16_1$ is added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting value obtained by addition in the adding circuit $16_{31}$ is "000000" in binary. The added value being output from the adding circuit $16_{31}$ is divided by four in the synchronizing circuit $16_{51}$ operated in response to the first clock signal. However, since the result of the dividing operation provides no meaning until the "state 3" described later occurs, descriptions of the addition and division to be done before the occurrence of the "state 3" are omitted accordingly.

When a second clock signal is input to the up-down counter 14, the binary code output from the up-down counter 14 are increased so that B2=0, B1=1, and B0=0. The binary code made up of B2=0, B1=1, and B0=0 output from the up-down counter 14 is fed to the code converting circuit 15. A code of the binary count value is converted in the code converting circuit 15 and, in the resulting code-converted thermometer code, T0 bit=1, T1 bit=1, T2 bit=0, T3 bit=0, T4 bit=0, T5 bit=0, and T6 bit=0 (in the case of code number being 2 in FIG. 6).

The thermometer code, in the same manner as described above, is used for changing an impedance of the impedance varying circuit 11. That is, only the impedance elements (P-channel type MOSFETs) $11_2$, $11_3$, and $11_9$ are turned ON and the impedance elements (P-channel type MOSFETs) $11_4$ to $11_8$ in the impedance varying circuit 11 are in an OFF state. An impedance of the impedance varying circuit 11 becomes a value being proportional to 1/(2W+¾W) (in the case of the code number 2 in FIG. 7). A change in the impedance causes a change in a voltage Va to be compared occurring at the connecting point $11_a$. The change in the voltage Va to be compared is shown in FIG. 8 as a "state 2" in which a shift voltage has been fed to the voltage Va to be compared.

Moreover, since the second clock signal is fed also to the averaging circuit 16, the binary code made up of B2=0, B1=0, and B0=0 having been set in the synchronizing circuit $16_2$ in the averaging circuit 16 is set in the synchronizing circuit $16_3$ and the binary code made up of B2=0, B1=0, and B0=1 having been set in the synchronizing circuit $16_1$ is set in the synchronizing circuit $16_2$ and, at a same time, the binary code made up of B2=0, B1=1, and B0=0 existing in the up-down counter 14 is set in the synchronizing circuit $16_1$ (in the case of the "state 2" in FIG. 10).

When a third clock signal is input to the up-down counter 14, a binary code of the up-down counter 14 is increased so that B2 bit=0, B1 bit=1, and B0 bit=1. The binary code made up of B2 bit=0, B1 bit=1, and B0=1 output from the up-down counter 14 is fed to the code converting circuit 15. A code of the binary count value, in the same way as described above, is converted in the code converting circuit 15 and, in the resulting code-converted thermometer code, T0 bit=1, T1 bit=1, T2 bit=1, T3 bit=0, T4 bit=0, T5 bit=0, and T6 bit=0 (in the case of code number 3 in FIG. 6).

The thermometer code, in the same manner as described above, is used for changing an impedance of the impedance varying circuit 11. That is, only the impedance elements (P-channel type MOSFETs) $11_2$, $11_3$, $11_4$ and $11_9$ in the impedance converting circuit 11 are turned ON and the impedance elements (P-channel type MOSFETs) $11_5$ to $11_8$ are in an OFF state. An impedance of the impedance varying circuit 11 becomes a value being proportional to 1/(3W+¾W) (in the case of the code number 3 in FIG. 7). A change in the impedance causes a change in a voltage Va to be compared occurring at the connecting point $11_a$. The voltage Va to be compared occurring after the change is shown in FIG. 8 as a "state 3" in which a shift voltage has been fed to the voltage Va to be compared.

Furthermore, since the third clock signal is fed also to the averaging circuit 16, the binary code made up of B2=0, B1=0, and B0=0 having been set in the synchronizing circuit $16_3$ in the averaging circuit 16 is set in the synchronizing circuit $16_4$ and the binary code made up of B2=0, B1=0, and B0=1 having been set in the synchronizing circuit $16_2$ is set in the synchronizing circuit $16_3$ and the binary code made up of B2=0, B1=1, and B0=0 having been set in the synchronizing circuit $16_1$ is set in the synchronizing circuit $16_2$ and, at a same time, the binary code made up of B2=0, B1=1, and B0=1 existing in the up-down counter 14 is set in the synchronizing circuit $16_1$ (in the case of a "state 3" in FIG. 10).

When the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting value obtained by addition is shown in FIG. 10 in decimal as "6" (00110 in binary) in the "state 3" for an output from the adding circuit $16_{31}$.

When a fourth clock signal is input to the up-down counter 14, since, at this time, a voltage Va to be compared is still lower than a reference voltage Vref, by the fourth clock signal fed to the up-down counter 14, the binary code of the up-down counter 14 is increased so that B2 bit=1, B1 bit=0, and B0 bit=0. The binary code made up of B2 bit=1, B1 bit=1, and B0 bit=0 are fed to the code converting circuit 15. A code of the binary code, in the same way as described above, is converted in the code converting circuit 15 and, in the resulting code-converted thermometer code, T0 bit=1, T1 bit=1, T2 bit=1, T3 bit=1, T4 bit=0, T5 bit=0, and T6 bit=0 (in the case of code number 4 in FIG. 6).

The thermometer code, in the same manner as described above, is used for changing an impedance of the impedance varying circuit 11. That is, only the impedance elements (P-channel type MOSFETs) $11_2$, $11_3$, $11_4$, $11_5$ and $11_9$ in the impedance varying circuit 11 are turned ON and the impedance elements (P-channel type MOSFETs) $11_6$ to $11_8$ are in an OFF state. An impedance of the impedance varying circuit 11 becomes a value being proportional to 1/(4W+¾W) (in the case of the code number 4 in FIG. 7). A change in the impedance causes a change in a voltage Va to be compared occurring at the connecting point $11_a$. The change in the voltage Va to be compared is shown in FIG. 8 as a "state 4". The voltage Va to be compared occurring at this time becomes a value that gets closest to a reference voltage Vref while the voltage Va to be compared is increasing.

Moreover, since the fourth clock signal is fed also to the averaging circuit 16, the binary code made up of B2=0, B1=0, and B0=1 having been set in the synchronizing circuit $16_3$ in the averaging circuit 16 is set in the synchronizing circuit $16_4$ and the binary code made up of B2=0, B1=1, and B0=0 having been set in the synchronizing circuit $16_2$ is set in the synchronizing circuit $16_3$ and the binary code made up of B2=0, B1=1, and B0=0 having been set in the synchronizing circuit $16_1$ is set in the synchronizing circuit $16_2$ and, at a same time, a binary code made up of B2=1, B1=0, and B0=0 existing in the up-down counter 14 is set in the synchronizing circuit $16_1$ (in the case of the "state 4" in FIG. 10).

Before the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "10" (01010 in binary) in the "state 4" for an output from the adding circuit $16_{31}$.

Moreover, since the fourth clock signal is input also to the synchronizing circuit $16_{51}$, the value 6 obtained by addition in the adding circuit $16_{31}$ in the state 3 ("state 3" of output from the adding circuit $16_{31}$ in FIG. 10) is divided by four (that is, shifted to a lower-order digit by two bits) by the synchronizing circuit $16_{51}$ and is output from the synchronizing circuit $16_{51}$ as "1" in decimal (or "1" in binary)

("state 4" of output from the synchronizing circuit $16_{51}$). The thermometer code output from the synchronizing circuit $16_{51}$ is fed to an object (impedance matching circuit) that requires impedance matching and is used for impedance matching therein (see FIG. 3).

When a fifth clock signal is input, since the voltage Va to be compared still remains lower than that of the reference voltage Vref, an Up-signal continues to be output from the comparator 13. Therefore, when the fifth clock signal is input to the up-down counter 14, the binary code of the up-down counter 14 are increased so that B2 bit=1, B1 bit=0, and B0 bit=1. The binary code made up of B2 bit=1, B1 bit=0, and B0 bit=1 is fed to the code converting circuit 15. A code of the binary code, in the same way as described above, is converted in the code converting circuit 15 and, in the resulting converted thermometer code, T0 bit=1, T1 bit=1, T2 bit=1, T3 bit=1, T4 bit=1, T5 bit=0, and T6 bit=0 (in the case of code number 5 in FIG. 6).

The thermometer code, in the same manner as described above, is used for changing an impedance of the impedance varying circuit 11. That is, only the impedance elements (P-channel type MOSFETs) $11_2$, $11_3$, $11_4$, $11_5$, $11_6$ and $11_9$ are turned ON and the impedance elements (P-channel type MOSFETs) $11_7$ and $11_8$ in the impedance varying circuit 11 are in an OFF state. An impedance of the impedance varying circuit 11 becomes a value being proportional to 1/(5W+¾W) (in the case of the code number 5 in FIG. 7). A change in the impedance causes a change in a voltage Va to be compared occurring at the connecting point $11_a$. The change in the voltage Va to be compared is shown in FIG. 8 as a "state 5" in which a shift voltage has been fed to the voltage Va to be compared. The voltage Va to be compared occurring at this time becomes a value being higher by a voltage corresponding to one step than a value that gets closest to a reference voltage Vref while the voltage Va to be compared is increasing.

Moreover, since the fifth clock signal is fed also to the averaging circuit 16, the binary code made up of B2=0, B1=1, and B0=0 having been set in the synchronizing circuit $16_3$ in the averaging circuit 16 is set in the synchronizing circuit $16_4$ and the binary code made up of B2=0, B1=1, and B0=1 having been set in the synchronizing circuit $16_2$ is set in the synchronizing circuit $16_3$ and the binary code made up of B2=1, B1=0, and B0=0 having been set in the synchronizing circuit $16_1$ is set in the synchronizing circuit $16_2$ and, at a same time, the binary code made up of B2=1, B1=0, and B0=1 existing in the up-down counter 14 is set in the synchronizing circuit $16_1$ (in the case of the "state 5" in FIG. 10).

After the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "14" (01110 in binary) in the "state 5" for an output from the adding circuit $16_{31}$.

Furthermore, since the fifth clock signal is input also to the synchronizing circuit $16_{51}$, the value obtained by addition in the adding circuit $16_{31}$ in the "state 4", that is, "10" in decimal ("state 4" of output from the adding circuit $16_{31}$ in FIG. 10) is divided by four by the synchronizing circuit $16_{51}$ (that is, shifted to lower-order digit by two bits) and is output from the synchronizing circuit $16_{51}$ as "2" in decimal ("10" in binary) ("state 5" of output from the averaging circuit 16 shown in FIG. 8, the "state 5" of output from the synchronizing circuit $16_{51}$ shown in FIG. 10). The thermometer code output from the synchronizing circuit $16_{51}$ is fed to an object (impedance matching circuit) that requires impedance matching and is used for the impedance matching therein.

When a sixth clock signal is input, since the voltage Va to be compared is higher than the reference voltage Vref, a down-signal is output from the comparator 13. Therefore, when the sixth clock signal is input to the up-down counter 14, the binary code output from the up-down counter 14 is decreased so that B2 bit=1, B1 bit=0, and B0 bit=0. A high-level Up-signal ("1" in binary) having been output from the UpDn output terminal of the up-down counter 14 comes not to be output. That is, a low-level Up-signal ("0" in binary) comes to be output. The binary code made up of B2 bit=1, B1 bit=0, and B0 bit=0 is fed to the code converting circuit 15. A code of the count value, in the same way as described above, is converted in the code converting circuit 15 and, in the resulting code-converted thermometer code, the T0 bit=1, T1 bit=1, T2 bit=1, T3 bit=1, T4 bit=0, T5 bit=0, and T6 bit=0 (in the case of code number 4 in FIG. 6).

The thermometer code, in the same manner as described above, is used for changing an impedance of the impedance varying circuit 11. That is, at time when the sixth clock signal is input, since the Up-signal to be output from the up-down counter 14 becomes a low-level Up-signal ("0" in binary), a high-level voltage is output from the inverter $11_{20}$ in the impedance converting circuit 11. Therefore, a low-level voltage is output from the NAND circuit $11_{11}$ which causes the impedance element (P-channel type MOSFET) $11_1$ to be turned ON.

Moreover, the impedance elements (P-channel type MOSFETs) $11_2$, $11_3$, $11_4$, $11_5$, $11_6$ and $11_9$ in the impedance varying circuit 11 are also turned ON and the P impedance elements (P-channel type MOSFETs) $11_6$, $11_7$ and $11_8$ are in an OFF state. An impedance of the impedance varying circuit 11 becomes a value being proportional to 1/(4W+¾W+W/2) (in the case of the code number 4 in FIG. 7). A change in the impedance causes a change in a voltage Va to be compared occurring at the connecting point $11_a$. The change in the voltage Va to be compared is shown in FIG. 8 as a "state 6" in which a shift voltage has been fed to the voltage Va to be compared. The voltage Va to be compared occurring at this time becomes a value that gets closest to a reference voltage Vref while the voltage Va to be compared is decreasing. An impedance (that is, impedance defined by a channel width) of the impedance elements (P-channel type MOSFETs) $11_1$ and $11_2$ is selected so that an shift voltage required for a voltage Va to be compared to exceed an offset voltage of the comparator 14 is added to the voltage Va to be compared at this time.

Moreover, since the sixth clock signal is fed also to the averaging circuit 16, the binary code made up of B2=0, B1=1, and B0=1 having been set in the synchronizing circuit $16_3$ in the averaging circuit 16 is set in the synchronizing circuit $16_4$ and the binary code made up of B2=1, B1=0, and B0=0 having been set in the synchronizing circuit $16_2$ is set in the synchronizing circuit $16_3$ and the binary code made up of B2=1, B1=0, and B0=1 having been set in the synchronizing circuit $16_1$ is set in the synchronizing circuit $16_2$ and, at a same time, the binary code made up of B2=1, B1=0, and B0=0 existing in the up-down counter 14 is set in the synchronizing circuit $16_1$ (in the case of the "state 6" in FIG. 10).

After the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_5$ is added to the added value being output from the adding circuit $16_6$ in the adding circuit $16_{31}$. The resulting added value is shown in FIG. 10 in decimal as "16" (10000 in binary) in the "state 6" for an output from the adding circuit $16_{31}$.

Furthermore, since the sixth clock signal is input also to the synchronizing circuit $16_{51}$ the value obtained by addition in the adding circuit $16_{31}$ in the "state 5", that is, "14" in decimal ("01110" in binary) ("state 5" of output from the adding circuit $16_{31}$ in FIG. 10) is divided by four (that is, shifted to a lower-order digit by two bits) in the synchronizing circuit $16_{51}$ and is output from the synchronizing circuit $16_{51}$ as "3" in decimal ("11" in binary) ("state 6" of output from the synchronizing circuit $16_{51}$ shown in FIG. 10 and "state 6" of output from the averaging circuit 16 shown in FIG. 8). The thermometer code output from the synchronizing circuit $16_{51}$ is fed to an object (impedance matching circuit) that requires impedance matching and is used for the impedance matching therein.

Then, when a seventh clock signal is input, since the voltage Va to be compared is higher than the reference voltage Vref, a down-signal is output from the comparator 13. Therefore, when the seventh clock signal is input to the up-down counter 14, the binary code output from the up-down counter 14 is decreased so that B2 bit=0, B1 bit=1, and B0 bit=1. Also, a low-level ("0" in binary) Up-signal is output from the UpDn output terminal of the up-down counter 14. The binary code made up of B2 bit=0, B1 bit=1, and B0 bit=1 is fed to the code converting circuit 15. A code of the binary code, in the same way as described above, is converted in the code converting circuit 15 and, in the resulting code-converted thermometer code, the T0 bit=1, T1 bit=1, T2 bit=1, T3 bit=0, T4 bit=0, T5 bit=0, and T6 bit=0 (in the case of code number 3 in FIG. 6).

The thermometer code, in the same manner as described above, is used for changing an impedance of the impedance varying circuit 11. That is, at time when the seventh clock signal is input, since the Up-signal being output from the up-down counter 14 is a low-level ("0" in binary) Up-signal, a high-level voltage is output from the inverter $11_{20}$ in the impedance converting circuit 11. Therefore, a low-level voltage is output from the NAND circuit $11_{11}$ which causes the impedance element (P-channel type MOSFET) $11_1$ to be turned ON.

Moreover, the impedance elements (P-channel type MOSFETs) $11_2$, $11_3$, $11_4$, and $11_9$ in the impedance varying circuit 11 are also turned ON and the impedance elements (P-channel type MOSFETs) $11_5$ to $11_8$ are in an OFF state. An impedance of the impedance varying circuit 11 becomes a value being proportional to $1/(3W+\frac{3}{4}w+W/2)$ (in the case of the code number 3 in FIG. 7). A change in the impedance causes a change in a voltage Va to be compared occurring at the connecting point $11_a$. The change in the voltage Va to be compared is shown in FIG. 8 as a "state 7" in which a shift voltage has been fed to the voltage Va to be compared. The voltage Va to be compared occurring at this time becomes a value being lower by a voltage corresponding to one step than a value that gets closest to the reference voltage Vref while the voltage Va to be compared is decreasing.

Moreover, since the seventh clock signal is fed also to the averaging circuit 16, the binary code made up of B2=1, B1=0, and B0=0 having been set in the synchronizing circuit $16_3$ in the averaging circuit 16 is set in the synchronizing circuit $16_4$ and the binary code made up of B2=1, B1=0, and B0=1 having been set in the synchronizing circuit $16_1$ is set in the synchronizing circuit $16_3$ and the binary code made up of B2=1, B1=0, and B0=0 having been set in the synchronizing circuit $16_2$ is set in the synchronizing circuit $16_2$ and, at a same time, the binary code made up of B2=0, B1=1, and B0=1 existing in the up-down counter 14 is set in the synchronizing circuit $16_1$ (in the case of the "state 7" in FIG. 10).

After the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "16" (10000 in binary) in the "state 7" for an output from the adding circuit $16_{31}$.

Also, since the seventh clock signal is input also to the synchronizing circuit $16_{51}$, the value obtained by addition in the adding circuit $16_{31}$ in the "state 6", that is, "16" in decimal (10000 in binary) ("state 6" of output from the adding circuit $16_{31}$ in FIG. 10) is divided by four (that is, shifted to a lower-order digit by two bits) in the synchronizing circuit $16_{51}$ and is output from the synchronizing circuit $16_{51}$ as "4" in decimal (100 in binary) (the "state 7" of output from the synchronizing circuit $16_{51}$ shown in FIG. 10 and "state 7" of output from the averaging circuit 16 shown in FIG. 8). The thermometer code output from the synchronizing circuit $16_{51}$, as described above, is fed to an object (impedance matching circuit) that requires impedance matching for achieving impedance matching therein (see FIG. 3).

Then, when an eighth clock signal is input, since the voltage Va to be compared is lower than the reference voltage Vref, an Up-signal is output from the comparator 13. Therefore, when the eighth clock signal is input to the up-down counter 14, the binary code of the up-down counter 14 is increased so that B2 bit=1, B1 bit=0, and B0 bit=0. Also, a high-level ("1" in binary) Up-signal is output from the UpDn output terminal of the up-down counter 14. The binary code of the up-down counter 14, made up of B2 bit=1, B1 bit=0, and B0 bit=0 is fed to the code converting circuit 15. This binary code, in the same way as described above, is converted in the code converting circuit 15 and, in the resulting code-converted thermometer code, the T0 bit=1, T1 bit=1, T2 bit=1, T3 bit=1, T4 bit=0, T5 bit=0, and T6 bit=0 (in the case of code number 4 in FIG. 6).

The thermometer code, in the same manner as described above, is used for changing an impedance of the impedance varying circuit 11. That is, at time when the eighth clock signal is input, since the Up-signal being output from the up-down counter 14 is a high-level ("1" in binary) Up-signal, a low-level voltage is output from the inverter $11_{20}$ in the impedance converting circuit 11. Therefore, a high-level voltage is output from the NAND circuit $11_{11}$ which causes the Impedance element (P-channel type MOSFET) $11_1$ to be turned OFF.

Furthermore, only the impedance elements (P-channel type MOSFETs) $11_2$, $11_3$, $11_4$, $11_5$ and $11_9$ are also turned ON and the impedance elements (P-channel type MOSFETs) $11_6$ to $11_8$ in the impedance varying circuit 11 are in an OFF state. An impedance of the impedance varying circuit 11 becomes a value being proportional to 1/(4W+¾W) (in the case of the code number 4 in FIG. 7). A change in the impedance causes a change in a voltage Va to be compared occurring at the connecting point $11_a$. The change in the voltage Va to be compared is shown in FIG. 8 as the "state 8". Contents for the "state 8" are the same as for the "state 4". The voltage Va to be compared occurring at this time becomes a value that gets closest to a reference voltage Vref while the voltage Va to be compared is increasing.

Moreover, since the eighth clock signal is fed also to the averaging circuit 16, the binary code made up of B2=1, B1=0, and B0=1 having been set in the synchronizing circuit $16_3$ in the averaging circuit 16 is set in the synchronizing circuit $16_4$ and the binary code made up of B2=1, B1=0, and B0=0 having been set in the synchronizing circuit $16_2$ is set in the synchronizing circuit $16_3$ and the binary code made up of B2=0, B1=1, and B0=1 having been set in the synchronizing circuit $16_1$ is set in the synchronizing circuit $16_2$ and, at a same time, the binary code made up of B2=1, B1=0, and B0=0 existing in the up-down counter 14 is set in the synchronizing circuit $16_1$ (in the case of the "state 8" in FIG. 10).

After the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "16" (10000 in binary) in the "state 8" for an output from the adding circuit $16_{31}$.

Also, since the eighth clock signal is input also to the synchronizing circuit $16_{51}$, the value obtained by addition in the adding circuit $16_{31}$ in the "state 7", that is, "16" in decimal (10000 in binary) ("state 7" of output from the adding circuit $16_{31}$ in FIG. 10) is divided by four (that is, shifted to a lower-order digit by two bits) by the synchronizing circuit $16_{51}$ and is output from the synchronizing circuit $16_{51}$ as "4" in decimal ("100", in binary) (the "state 8" of output from the synchronizing circuit $16_{51}$ shown in FIG. 10 and the "state 8" of output from the averaging circuit 16 shown in FIG. 8). The thermometer code output from the synchronizing circuit $16_{51}$, as described above, is fed to an object (impedance matching circuit) that requires impedance matching and is used for the impedance matching therein.

The "state 8" shown in FIG. 8 becomes the same as the "state" 4 described above and thereafter operations occurring from the "state 4" to the "state 7" are repeated. That is, as normal operations, operations from the "state 4" to the "state 7" are repeated.

In the conventional technology, as in FIG. 8, when an ordinary operation for impedance matching is performed, a control code output from an impedance matching data outputting circuit to be used as a reference for impedance matching in an impedance matching circuit that requires impedance matching is inevitably varied due to a characteristic of an up-down counter being used in a feedback control system, among a voltage that gets near to a reference voltage Vref of the comparator 13 (that is, a voltage occurring outside an upper and lower limit voltage of an offset voltage of the comparator 13, a voltage being lower by a voltage corresponding to one step than the above voltage that gets near to the reference voltage Vref, and a voltage being higher by a voltage corresponding to one step than the above voltage that gets near to the reference voltage Vref. However, according to the impedance matching data outputting circuit 10 of the first embodiment of the present invention, even if a voltage Va to be compared to be fed to the comparator 13 in the impedance matching data outputting circuit gets near to a reference voltage Vref, since a shift voltage being large enough for the comparator 13 to perform an exact judgement is fed to the voltage Va to be compared, an average value (impedance matching data) (output from the averaging circuit 16 in FIG. 22) of values occurring within four periods of basic unit time for a feedback control code that changes at levels being higher and lower than a level of a reference code corresponding to the reference voltage Vref is not varied in the ordinary operation for feedback control.

Thus, in the case in which a voltage Va to be compared is caused to continue increasing (change from "UP=1" to "1"), when the code number is changed to increase from its number 1 to its number 5, a denominator in the expression in FIG. 7, which indicates that a change is proportional to an impedance of the impedance varying circuit 11, is increased by 1W every time when the voltage Va to be compared is increased by a voltage corresponding to one step. On the other hand, in the case in which the voltage Va to be compared is caused to continue lowering (change from "UP=0" to "0"), when the code number is changed to increase from its number 1 to its number 5, the denominator in the expression in FIG. 7, which indicates that a change is proportional to an impedance of the impedance varying circuit 11, is decreased by 1W every time when the voltage Va to be compared is decreased by a voltage corresponding to one step. However, when the change in the voltage Va to be compared is switched from its increasing state to its decreasing state (change from "Up=1" to "0") or when the change in the voltage Va to be compared is switched from its decreasing state to its increasing state, the denominator in the expression is changed by W/2. By such the operations, the change in the voltage Va to be compared occurring when a shift voltage has been fed to the voltage Va to be compared is achieved.

Moreover, as a precondition in this case, it is necessary that a voltage obtained by adding voltages that change when a change in the voltage Va to be compared is switched to its increasing state and to its decreasing state to its increasing state has a potential being smaller than a potential of a voltage that changes one time when the voltage Va to be compared is caused to continue increasing and decreasing. In FIG. 8, the voltage Va to be compared continues boosting by one step and reaches a level being a little lower than the reference voltage Vref and, when being boosted next time, crosses over the reference voltage Vref. When a change in the voltage is next switched to its decreasing state, the voltage Va to be compared is lowered by a voltage corresponding to ½ steps and then is lowered by a voltage corresponding to one step. When the voltage Va to be compared is next boosted by ½ steps, it again reaches the reference voltage Vref and again becomes the same voltage that occurred when the voltage Va to be compared previously came nearest to the reference voltage Vref.

However, the conventional problem still persists in that since, when such the change in the voltage Va to be compared occurs, he voltage Va to be compared continues being boosted in the previous stage, there are some cases in which the voltage Va to be compared is again boosted even when the voltage Va to be compared again comes near to the reference voltage Vref, however, when an amount of an increase in voltage falls within the range of the offset voltage of the comparator 13, it is not certain whether the voltage Va to be compared exceeds over or comes below the reference voltage Vref. However, if above conditions are satisfied, it is possible to take a voltage being apart more from the reference voltage Vref compared with, at least, a case in which the voltage Va to be compared comes nearest to the reference voltage Vref in the previous stage and, when the voltage Va to be compared comes near to the reference voltage Vref in a subsequent stage, the voltage Va to be compared never fails to increase easily.

Moreover, in order to change the voltage Va to be compared regularly and reliably, design is preferably done so that a voltage falling within the range of the offset voltage of the comparator is not taken. However, in some cases, if the change in temperature occurs as described above, the voltage falling within the range of the offset voltage is unintentionally taken. Even in such the case, according to the present invention, the voltage does not fall within the range of the offset voltage easily compared with the case of the conventional method and, as a result, even if the temperature and/or power supply voltage is changed, control can be exerted easily so that a constant impedance is maintained.

Moreover, the case in the embodiment when the code number of Up=1 is changed from 5 to 4 (that is, the "state 5" in FIG. 8 is changed to the "state 6") is an example in which the denominator in the expression is changed by W/2. Furthermore, in the case in which a change in the voltage Va to be compared is switched from its decreasing state to its increasing state (change from "Up=0" to "1"), when the code number 3 for the Up=0 is changed to the code number 4 for Up=1 (change from the "state 7" in FIG. 8 to the "state 8" in FIG. 8), the denominator in the expression is increased by W/2.

In the impedance matching data outputting circuit 10 of the first embodiment, there are some cases in which an error in impedance matching operations becomes largest. FIGS. 11 and 12 show such the cases. That is, during a process in which a voltage Va to be compared is changed relative to a reference voltage Vref, in some cases, due to a change in temperature or operating voltage, the error become largest in the impedance matching operations for an impedance matching circuit that requires impedance matching. Particularly, in some cases, as shown as a case in which no shift voltage has been fed to a voltage to be compared (this voltage Va to be compared is for impedance to be matched), an error being equivalent to a voltage corresponding to −¾ steps (see FIG. 11) or to +¼ steps (see FIG. 12) occurs in the impedance matching operations for a terminating impedance in an impedance matching circuit that requires impedance matching included in, for example, an output buffer or an input buffer. However, according to the first embodiment of the present invention, this error can be reduced when compared with the error being equivalent to a voltage corresponding to one step occurs in the conventional technology.

Thus, according to configurations of the impedance matching data outputting circuit 10 of the first embodiment of the present invention, even if a voltage Va to be compared gets near to a reference voltage Vref from its lower level or from its higher level, by feeding a shift voltage being enough for a comparator 13 to perform an exact judgement, that is, by producing the voltage Va to be compared through addition of the shift voltage, operations always starts by a second counting operation from an upper side to a lower side of the reference voltage Vref or by a second counting operation from a lower side to an upper side of the reference voltage Vref and impedance matching data is produced based on a result obtained by averaging results from four time counting operations and, therefore, even when the voltage Va to be compared is changed in ordinary operations, it is made possible to suppress occurrence of the change in the data to keep a constant value, variations in matching impedance can be prevented, thus enabling successful impedance matching. Thus, according to the embodiment of the present invention, since an error can be made to be equivalent to ¾ step at the worst, a number of bits needed for the impedance matching data can be reduced. In particular, in a high-speed interface of a GHz class in broadband network devices or a like, the present invention serves to reduce the amount of jitter that occurs due to an increase in the impedance matching data. If such devices deal with the same number of bits, the jitter of signals can be reduced the more.

Therefore, the impedance matching data outputting circuit 10 of the present invention is very useful in a technological environment requiring reduction of the amount of jitter of signals. Moreover, since the number of bits needed in the impedance matching data can be reduced, an area for a circuit or a chip can be made the smaller, thus serving to simplify hardware mounted on the impedance matching data outputting circuit 10 of the present invention.

Second Embodiment

Figure 13:
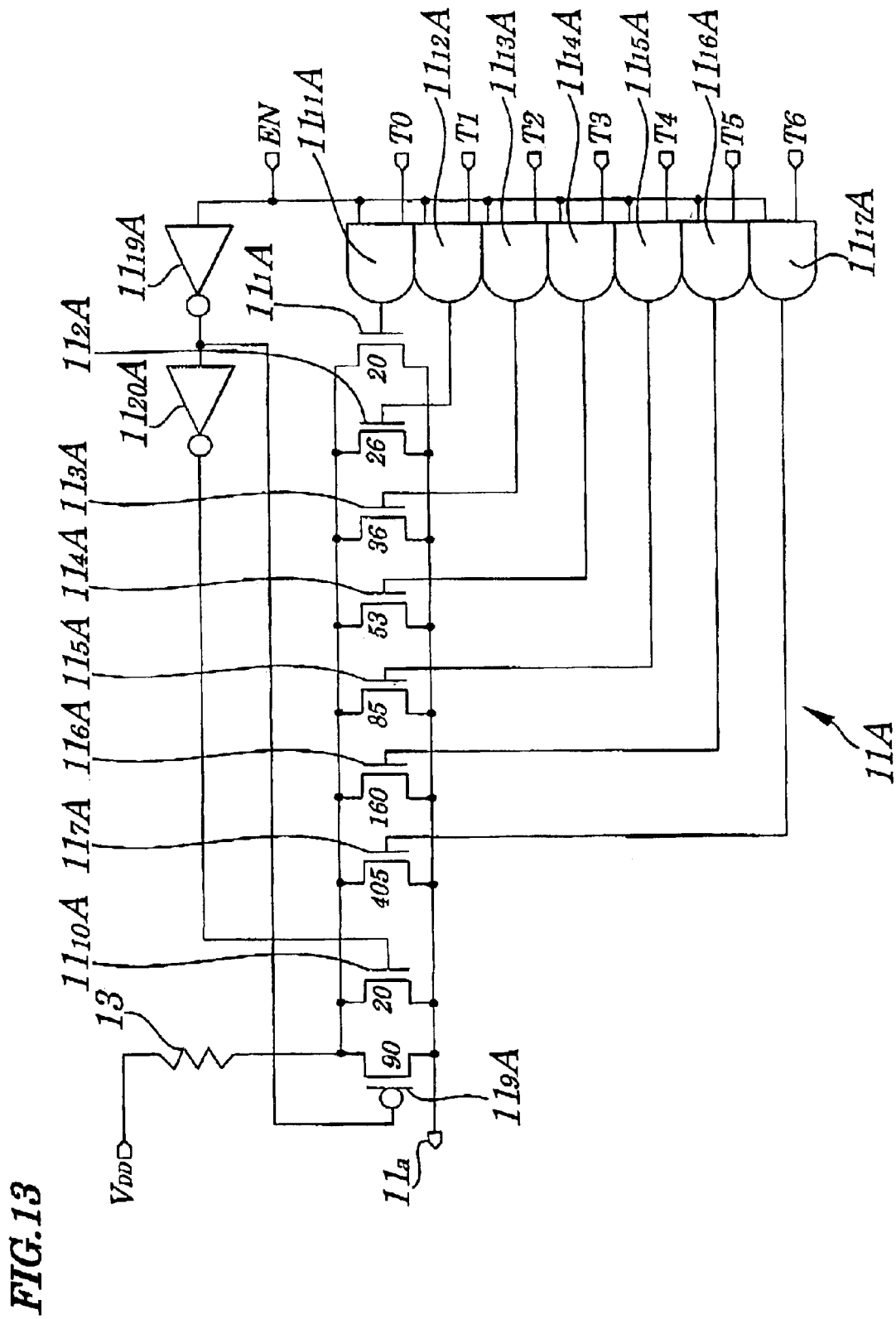
FIG. 13 is a diagram partially showing of an impedance varying circuit used in an impedance matching data outputting circuit according to a second embodiment of the present invention.
Figure 14:
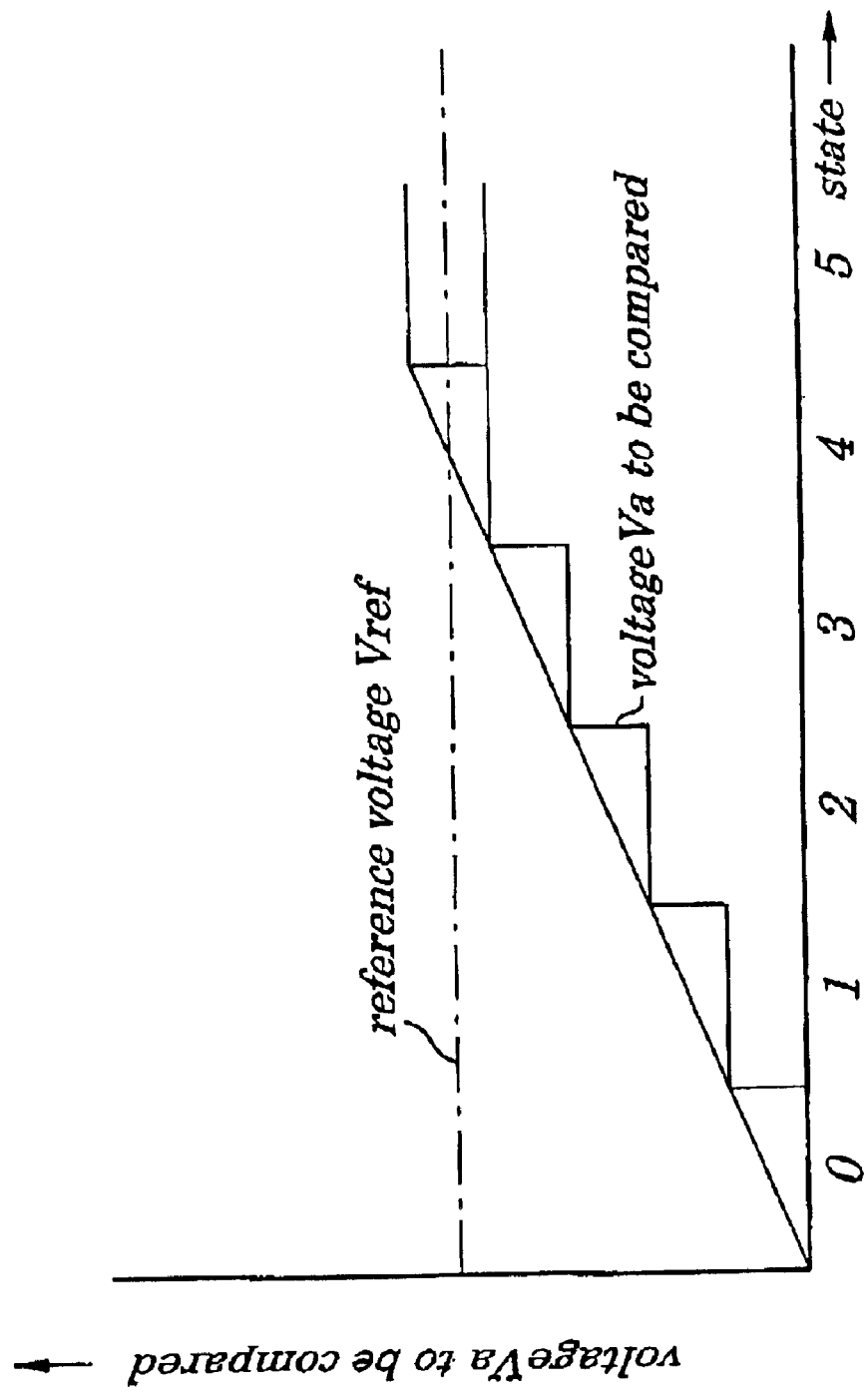
FIG. 14 is a graph showing an actual case to which a relation between a state of operations of the impedance matching data outputting circuit of the second embodiment and a voltage to be compared is applied.
Figure 15:
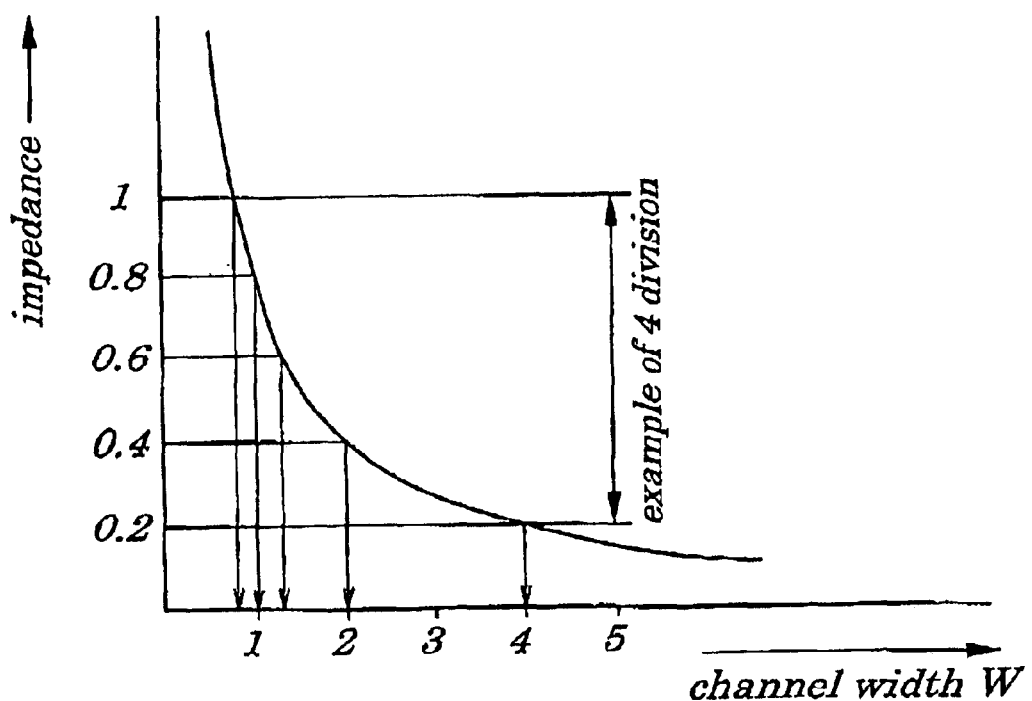
FIG. 15 is a diagram illustrating a relation between an impedance used for descriptions of the impedance varying circuit of the second embodiment and a channel width of MOSFET employed in the second embodiment.

FIG. 13 is a diagram partially showing an impedance varying circuit 11A used in an impedance matching data outputting circuit 10A (not shown) according to a second embodiment of the present invention. FIG. 14 is a graph showing an actual case to which a relation between a state of operations of the impedance matching data outputting circuit 10A of the second embodiment and a voltage Va to be compared is applied. FIG. 15 is a diagram illustrating a relation between an impedance used for descriptions of the impedance varying circuit 11A of the second embodiment and a channel width of a MOSFET employed in the second embodiment. Configurations of the impedance matching data outputting circuit 10A of the second embodiment differ greatly from those of the first embodiment in that accuracy of an impedance which is variable in response to a thermometer code output from an up-down counter can be uniformed in any one of thermometer codes.

An impedance varying circuit 11A (partially shown in FIG. 13) has, as impedance elements, portions fixing an impedance, that is, an impedance element (P-channel type MOSFET) $11_9$ being equivalent to a P-channel type MOSFET $11_9$A used in the first embodiment and an N-channel type MOSFET $11_{10}$A and portions varying an impedance, that is, N-channel type MOSFETs $11_1$A to $11_7$A and the MOSFETs $11_9$A, $11_{10}$A, $11_1$A to $11_7$A are so configured to be turned ON or OFF by inverters $11_{19}$A and $11_{20}$A, and AND circuits $11_{11}$A to $11_{17}$A. However, descriptions of N-channel type MOSFET (not shown) used to feed a shift voltage to a voltage Va to be compared in an up-counting operation or in a down-counting operation of the up-down counter 14 (not shown) and the circuit used to control ON or OFF operations of these N-channel type MOSFETs (not shown) in the above portions varying an impedance are omitted to more clarify features of the embodiment.

Channel widths of the P-channel type MOSFET $11_9$A and the N-channel type MOSFET $11_{10}$A are 90 μm and 20 μm, respectively. Channel widths of the N-channel type MOSFETs $11_1$A, $11_2$A, $11_3$A, $11_4$A, $11_5$A, $11_6$A, and $11_7$A are 20

μm, 26 μm, 36 μm, 53 μm, 85 μm, 160 μm, and 405 μm, respectively. Moreover, each of N-channel type MOSFETs used to feed a shift voltage to a voltage Va to be compared during up-counting operations is connected in parallel to each of the N-channel type MOSFETs $11_1A$, $11_2A$, $11_3A$, $11_4A$, $11_5A$, $11_6A$, and $11_7A$, and channel widths of these N-channel type MOSFETs used to feed the shift voltage during up-counting operations are 20 μm×¾, 26 μm×¾, 36 μm×¾, 53 μm×¾, 85 μm×¾, 160 μm×¾, and 405 μm×¾, respectively. Moreover, each of N-channel type MOSFETs used to feed a shift voltage to a voltage Va to be compared during down-counting operations is connected in parallel to each of the N-channel type MOSFETs used to provide a shift voltage in the up-counting and having channel widths of 20 μm×¾, 26 μm×¾, 36 μm×¾, 53 μm×¾, 85 μm×¾, 160 μm×¾, and 405 μm×¾, respectively, and to each of the N-channel type MOSFETs $11_1A$, $11_2A$, $11_3A$, $11_4A$, $11_5A$, $11_6A$, and $11_7A$ and channel widths of the N-channel type MOSFETs having channel width of 20 μm×½, 26 μm×½, 36 μm×½, 53 μm×½, 85 μm×½, 160 μm×½, and 405 μm×½, respectively.

Source terminals of the above P-channel type MOSFETs $11_9A$, $11_0A$, and N-channel type MOSFETs $11_1A$ to $11_7A$ are commonly connected and a connecting point for them is connected to a voltage (power) source terminal DD of a linear resistor 13. Drain terminals of the above P-channel type MOSFETs $11_9A$, $11_0A$, and N-channel type MOSFETs $11_1A$ to $11_7A$ are commonly connected and a connecting point for them makes up a connecting point $11_a$, in the same manner as in the first embodiment.

An input terminal of the inverter $11_{19}A$ is connected to an terminal EN and its output terminal is connected to an input terminal of the inverter $11_{20}A$. An output terminal of the inverter $11_{19}A$ is connected to a gate of the P-channel type MOSFET $11_0A$. An output terminal of the inverter $11_{20}A$ is connected to a gate of the N-channel type MOSFET $11_0A$. One input terminal of the two input terminals of the AND circuit $11_1A$ is connected to the terminal EN and another input terminal is connected to a terminal T0 and its output terminal is connected to a gate of the N-channel type MOSFET $11_{11}A$. One input terminal of the two input terminals of the AND circuit $11_{12}A$ is connected to the terminal EN and another input terminal is connected to a terminal T0 and its output terminal is connected to a gate of the N-channel type MOSFET $11_2A$.

One input terminal of the two input terminals of the AND circuit $11_{13}A$ is connected to the terminal EN and another input terminal is connected to a terminal T2 and its output terminal is connected to a gate of the N-channel type MOSFET $11_3A$. One input terminal of the two input terminals of the AND circuit $11_{14}A$ is connected to the terminal EN and another input terminal is connected to a terminal T3 and its output terminal is connected to a gate of the N-channel type MOSFET $11_4A$. Moreover, one input terminal of the two input terminals of the AND circuit $11_{15}A$ is connected to the terminal EN and another input terminal is connected to a terminal T4 and its output terminal is connected to a gate of the N-channel type MOSFET $11_5A$. One input terminal of the two input terminals of the AND circuit $11_{16}A$ is connected to the terminal EN and another input terminal is connected to a terminal T5 and its output terminal is connected to a gate of the N-channel type MOSFET $11_6A$. One input terminal of the two input terminals of the AND circuit $11_{17}A$ is connected to the terminal EN and another input terminal is connected to a terminal T6 and its output terminal is connected to a gate of the N-channel type MOSFET $11_7A$. In the second embodiment shown in FIG. 13, the impedance matching data outputting circuit 10A (not shown) has same configurations as that in the first embodiment except differences in its structure described above, same reference numbers are assigned to parts having same functions as those of the first embodiment and their descriptions are omitted accordingly.

Operations of the impedance matching data outputting circuit 10A (not shown) of the second embodiment are described by referring to FIGS. 13 to 15. Since each of the linear resistor 13, an up-down counter 14, a code converting circuit 15, an averaging circuit 16, and a code converting circuit 17 in the impedance matching data outputting circuit 10A of the second embodiment performs same operations as each of those in the first embodiment, descriptions of each of the corresponding components are omitted accordingly. An aim of setting the channel widths of the N-channel type MOSFETs $11_1A$, $11_2A$, $11_3A$, $11_4A$, $11_5A$, $11_6A$, and $11_7A$ in the impedance varying circuit 11A (partially shown in FIG. 13), respectively, at 20 μm, 26 μm, 36 μm, 53 μm, 85 μm, 160 μm, and 405 μm is, as shown in FIG. 13, to make uniformed steps at each of which an impedance is changed by an ON state of the MOSFET being turned ON when any one of bits out the T0 bit, T1 bit, T2 bit, T3 bit, T4 bit, T5 bit, and T6 bit incorporated in the thermometer code becomes "1", that is, to also make same an impedance occurring when "1" occurs in any one of the thermometer code which causes the MOSFET to be turned ON (see FIG. 15).

Since the impedance varying circuit 11A is configured as described above, an offset voltage to be added to a voltage Va to be compared occurring at the connecting point $11_a$ during up-counting operations of the up-down counter 14 (not shown) is the same as is shown in FIG. 8 in which equal intervals are assigned. Moreover, in the description of the first embodiment by referring to FIG. 8, for convenience of explanation, it is assumed that the shift voltage is same for all the steps to be added during up-counting operations of the up-down counter 14 (not shown). However, as explained by referring to FIG. 9, as a voltage Va to be compared gets nearer to a reference voltage Vref, a rate assigned to the shift voltage becomes lower, that is, a change in the shift voltage to be fed to the comparator 13 (not shown) in the reference voltage Vref becomes smaller. However, in the second embodiment, a shift voltage for every step is same, as described above. FIG. 14 shows clearly this relation.

Since the impedance varying circuit 11A is so configured that such an impedance occurs which can improve accuracy of the impedance to be assured. Therefore, a demand of a comparator 13 (not shown) that a shift voltage must be same in any step, that is, a required characteristic of a shift voltage to be fed to a comparator (not shown) can be satisfied. As a result, operations of a feedback control system employed in the impedance matching data outputting circuit 10A (not shown) become stable.

Moreover, since, by connecting the P-channel type MOSFET $11_9A$ in parallel, a transfer gate configuration is formed, a voltage range forming a linear characteristic of a voltage Va to be compared is expanded. Furthermore, by connecting a linear resistor 13 in series, a linear characteristic required in a voltage Va to be compared is further improved.

In response to a change in an impedance in the impedance varying circuit 11A, a voltage Va to be compared occurring at the connecting point $11_a$ is compared with a reference voltage Vref by the comparator 13. A result from the comparison by the comparator 13 causes counting operations corresponding to the comparison result to be performed by the up-down counter 14 (not shown). Binary values output from the up-down counter 14 (not shown) are averaged by an averaging circuit 16 (not shown) and an average value of the binary values is fed to the code converting circuit 17 (not shown). Then, a thermometer code output from the code converting circuit 17 (not shown), that is, impedance matching data is fed to an impedance matching circuit that requires impedance matching and is used for impedance matching of the circuit, as described in the first embodiment.

Thus, the impedance matching data outputting circuit 10A (not labeled or shown) of the second embodiment can achieve, in addition to the same effects as already obtained in the first embodiment, an effect that, since a change in an impedance being changed by the thermometer code is made uniformed, an amount of a change in a voltage Va to be compared which occurs in response to a change in a voltage corresponding to one step in the thermometer code can be made uniformed. As a result, a characteristic of the shift voltage required in the comparator become same, thus enabling operations in a feedback control system to be stable. Furthermore, since portions fixing an impedance is configured as a transfer gate, a range of linear characteristics of a voltage Va to be compared can be expanded and by connecting the linear resistor to the transfer gate, the range of linear characteristics of a voltage Va to be compared can be further increased.

Third Embodiment

Figure 16:
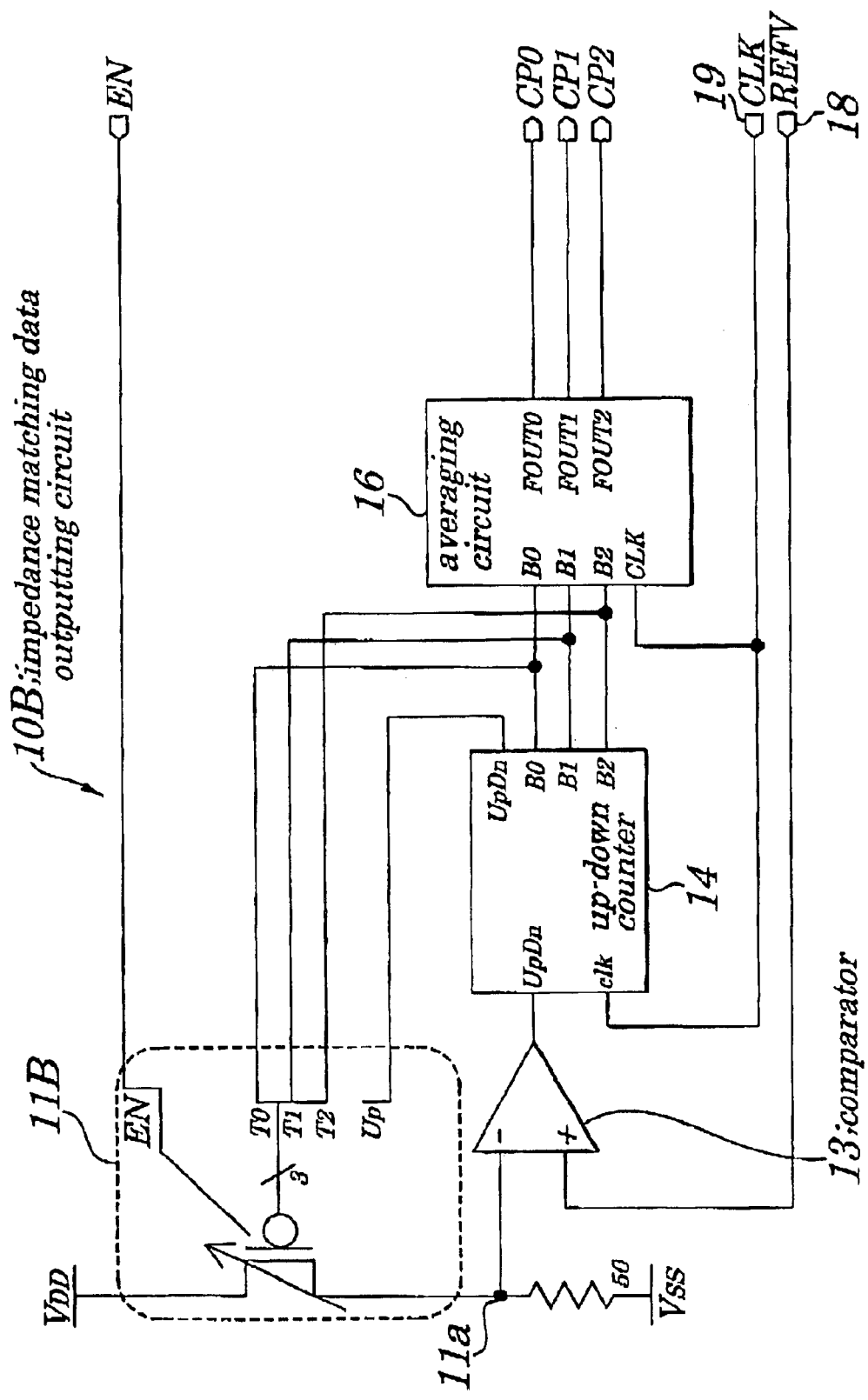
FIG. 16 is a schematic block diagram showing an impedance matching data outputting circuit according to a third embodiment of the present invention.

FIG. 16 is a schematic block diagram showing an impedance matching data outputting FIG. 16 shows circuit 10B according to a third embodiment of the present invention. Configurations of the impedance matching data outputting circuit 10B of the third embodiment differ greatly from those of the first or second embodiment in that, in response to binary codes output from an up-down counter, an impedance of an impedance varying circuit 11B is directly changed. That is, in the impedance matching data outputting circuit 10B of the third embodiment, as shown in FIG. 16 within an up-down counter 14, a binary code made up of B0, B1, and B2 and an UpDn signal are directly fed to T0, T1, T2 terminals and an Up terminal in the impedance matching varying circuit 11B, respectively, and FOUT0, FOUT1, and FOUT2 terminals in an averaging circuit 16 are connected respectively to a CP0, CP1, and CP2 terminal in the impedance matching data outputting circuit 10B.

Since the impedance matching data outputting circuit 10B of the third embodiment has same configurations as those of the first or second embodiment except components described above, same reference numbers are assigned to parts having same functions as those of the first or second embodiment and their descriptions are omitted accordingly.

Next, operations of the impedance matching data outputting circuit 10B of the third embodiment are described by referring to FIG. 16. The impedance varying circuit 11B in the third embodiment, as in the case of the first or second embodiment, in response to a binary code (made up of a B0 bit, B1 bit, and B2 bit) output from the up-down counter 14, turns ON or OFF up to eight pieces of P-channel type MOSFETs (not shown) or up to seven pieces of N-channel type MOSFETs (not shown) to provide impedance corresponding to the above binary code. As in the cases of the first or second embodiment, a voltage Va to be compared which corresponds to an impedance provided by the impedance varying circuit 11B occurs at a connecting point $11_a$ and the resulting voltage Va to be compared is compared with a reference voltage Vref by a comparator 13 and counting operations of the up-down counter 14 are performed according to a result from the comparison.

The binary code being a count value output from the up-down counter 14, as described above, is fed to the impedance varying circuit 11B to be used for a change in an impedance and is fed to the averaging circuit 16 to perform averaging operation on four states, as in the case of the first or second embodiment. An FOUT0 bit, FOUT1 bit, and FOUT2 bit output from the averaging circuit 16 are fed to an impedance matching circuit (see FIG. 3) that requires impedance matching as impedance matching data made up of three bits of the impedance matching data outputting circuit 10B, that is, the CP0 bit, CP1 bit, and CP2 bit and are used for impedance matching of the impedance matching circuit that requires the impedance matching, as in the case of the first or second embodiment.

Thus, according to the impedance matching data outputting circuit 10B of the third embodiment, same effects as obtained in the first or second embodiment can be achieved.

Fourth Embodiment

Figure 17:
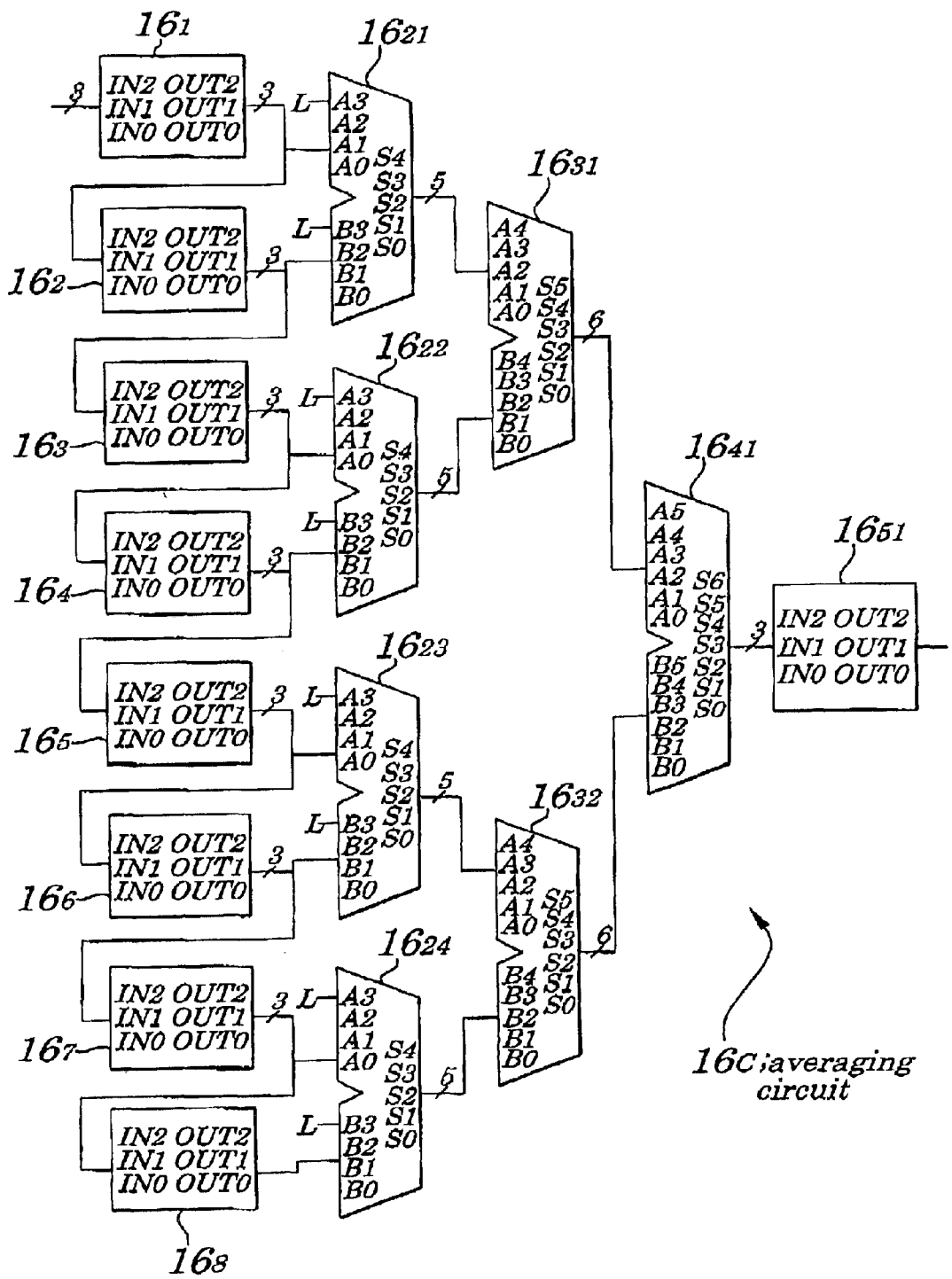
FIG. 17 is a schematic block diagram illustrating an averaging circuit employed in an impedance matching data outputting circuit of a fourth embodiment of the present invention.

FIG. 17 is a schematic block diagram illustrating an averaging circuit 16C employed in an impedance matching data outputting circuit 10C (not shown) of a fourth embodiment of the present invention. Configurations of an impedance varying circuit of the fourth embodiment differ greatly from those of the first or second embodiment in that an averaged value obtained from eight states, that is, the average value of eight values is used.

That is, the averaging circuit 16C shown in FIG. 17 in the impedance matching data outputting circuit 10C (not shown) includes a synchronizing circuit $16_1$, a synchronizing circuit $16_2$, a synchronizing circuit $16_3$, a synchronizing circuit $16_4$, a synchronizing circuit $16_5$, a synchronizing circuit $16_6$, a synchronizing circuit $16_7$, and a synchronizing circuit $16_8$, an adding circuit $16_{21}$, an adding circuit $16_{22}$, an adding circuit $16_{23}$, an adding circuit $16_{24}$, an adding circuit $16_{31}$, an adding circuit $16_{32}$, and an adding circuit $16_{41}$, and a synchronizing circuit $16_{51}$. In FIG. 17, inputting and outputting states of each circuit are illustrated by using one line, however, actually the inputting and outputting are achieved using a number of lines having a number assigned to a corresponding line. However, in the descriptions below, the connection is explained with considerations given to the number of lines used for connection among circuits.

Input terminals IN0, IN1, and IN2 of the synchronizing circuit $16_1$ are connected respectively to output terminals B0, B1, and B2 (not shown) of the up-down counter 14 (not shown) and output terminals OUT0, OUT1, and OUT2 of the synchronizing circuit $16_1$ are connected respectively to input terminals IN0, IN1, and IN2 of the synchronizing circuit $16_2$ and to added-input terminals A0, A1, and A2 of the adding circuit $16_{21}$. Output terminals OUT0, OUT1, and OUT2 of the synchronizing circuit $16_2$ are connected respectively to input terminals IN0, IN1, and IN2 of the synchronizing circuit $16_3$ and respectively to adding-input terminals B0, B1, and B2 of the adding circuit $16_{21}$.

Output terminals OUT0, OUT1 and OUT2 of the synchronizing circuit $16_3$ are connected respectively to input terminals IN0, IN1, and IN2 of the synchronizing circuit $16_4$ and respectively to added-input terminals A0, A1, and A2 of the adding circuit $16_{22}$. Output terminals OUT0, OUT1, and OUT2 of the synchronizing circuit $16_4$ are connected respectively to input terminals IN0, IN1, and IN2 of the synchronizing circuit $16_5$ and respectively to adding-input terminals B0, B1, and B2 of the adding circuit $16_{22}$.

Output terminals OUT0, OUT1, and OUT2 of the synchronizing circuit $16_5$ are connected respectively to input terminals IN0, IN1, and IN2 of the synchronizing circuit $16_6$ and respectively to added-input terminals A0, A1, and A2 of the adding circuit $16_{23}$. Output terminals OUT0, OUT1, and OUT2 of the synchronizing circuit $16_6$ are connected respectively to input terminals IN0, IN1, and IN2 of the synchronizing circuit $16_7$ and respectively to adding-input terminals B0, B1, and B2 of the adding circuit $16_{23}$.

Output terminals OUT0, OUT1, and OUT2 of the synchronizing circuit $16_7$ are connected respectively to input terminals IN0, IN1, and IN2 of the synchronizing circuit $16_8$ and respectively to added input terminals A0, A1, and A2 of the adding circuit $16_{24}$. Output terminals OUT0, OUT1, and OUT2 of the synchronizing circuit $16_8$ are connected respectively to adding-input terminals B0, B1, and B2 of the adding circuit $16_{24}$. To added input terminals A3 and adding input terminal B3 of the adding circuit $16_{21}$ to $16_{24}$ is applied a low-level voltage.

Adding-output terminals S0, S1, S2, S3, and S4 of the adding circuit $16_{21}$ are connected respectively to added-input terminals A0, A1, A2, A3, and A4 of the adding circuit $16_{31}$ and adding-output terminals S0, S1, S2, S3, and S4 of the adding circuit $16_{22}$ are connected respectively to adding-input terminals B0, B1, B2, B3, and B4 of the adding circuit $16_{31}$.

Adding-output terminals S0, S1, S2, S3, and S4 of the adding circuit $16_{23}$ are connected respectively to added-input terminals A0, A1, A2, A3, and A4 of the adding circuit $16_{32}$ and adding-output terminals S0, S1, S2, S3, and S4 of the adding circuit $16_{24}$ are connected respectively to adding input terminals B0, B1, B2, B3, and B4 of the adding circuit $16_{32}$.

Adding-output terminals S0, S1, S2, S3, S4, and S5 of the adding circuit $16_{31}$ are connected respectively to added-input terminals A0, A1, A2, A3, A4, and A5 of the adding circuit $16_{41}$ and adding-output terminals S0, S1, S2, S3, S4, and S5 of the adding circuit $16_{32}$ are connected respectively to adding-input terminals B0, B1, B2, B3, B4, and B5 of the adding circuit $16_{41}$.

Adding-output terminals S4, S5, and S6 of the adding circuit $16_{41}$ are connected respectively to input terminals IN0, IN1, and IN2 of the synchronizing circuit $16_{51}$. Output terminals OUT0, OUT1, and OUT2 of the synchronizing circuit $16_{51}$ are connected respectively to output terminals (not shown) FOUT0, FOUT1, and FOUT2 of the averaging circuit 16C (not shown). To a clock signal input terminal (CLK input terminal) (not shown) of the synchronizing circuit $16_1$ to the synchronizing circuit $16_8$ and the synchronizing circuit $16_{51}$ is connected a clock signal terminal 19 (not shown). Since each of components of the impedance matching data outputting circuit 10C (not shown) of the fourth embodiment has same configurations as each of the components in the first to third embodiments, except the components described above, same reference numbers are assigned to components having the same functions as components in the first to third embodiments and their descriptions are omitted accordingly.

Next, the impedance matching data outputting circuit 10C of the fourth embodiment is described by referring to FIG. 17. Each of the comparator 13, up-down counter 14 (not shown), code converting circuit 15, and code converting circuit 17 of the impedance matching data outputting circuit 10C (all not shown) of the fourth embodiment performs same operations as each of those of the first to third embodiments does.

In the averaging circuit 16C not shown), binary values (each made up of B0 bit, B1 bit, and B2 bit) sequentially output from the up-down counter 14 (not shown) is set sequentially to the synchronizing circuits $16_1$ to $16_8$. Whenever the setting is made, a binary value in the synchronizing circuit $16_1$ is added to a binary value in the synchronizing circuit $16_2$ by the adding circuit $16_{21}$ and a binary value in the synchronizing circuit $16_3$ is added to a binary value in the synchronizing circuit $16_4$ by the adding circuit $16_{22}$. Likewise, a binary value in the synchronizing circuit $16_5$ is added to a binary value in the synchronizing circuit $16_6$ by the adding circuit $16_{23}$ and a binary value in the synchronizing circuit $16_7$ is added to a binary value in the synchronizing circuit $16_8$ by the adding circuit $16_{24}$. At a same time when these adding operations are performed, the added value in the adding circuit $16_{21}$ is added to the added value in the adding circuit $16_{22}$ by the adding circuit $16_{31}$ and the added value in the adding circuit $16_{23}$ is added to the added value in the adding circuit $16_{24}$ and the added value in the adding circuit $16_{31}$ is added to the added value in the adding circuit $16_{32}$ by the adding circuit $16_{41}$.

By these adding operations, binary values in eight states, that is, eight values are acquired and, in response to a clock signal that has set the binary value to the synchronizing circuits $16_1$ to $16_8$, high-order three bits of the added value, that is, S3 bit, S4 bit, and S5 bit are set in the synchronizing circuit $16_{51}$ and are output, that is, an average of the above eight values is output. This average value is supplied to an impedance matching circuit (not shown) that requires impedance matching and is used for impedance matching of the impedance matching circuit (not shown) that requires the impedance matching.

This average value of eight values is obtained during a period being larger by two times than a period during which an average value of four values is obtained in the first to third embodiments. Therefore, a change in an impedance becomes slower when an average value of eight values is used rather than when an average value of four values is used. That is, a function of calibrating an impedance works in a slower manner. In other words, calibration of sensitivity is made possible by using an average value of eight values.

A code of the binary count values output from the averaging circuit 16C (not shown) is converted in the code converting circuit 17 (not shown) to become binary impedance matching data, which is fed to an impedance matching circuit (see FIG. 3) that requires impedance matching and is used for the impedance matching.

Thus, the impedance matching data outputting circuit 10C of the fourth embodiment can achieve, in addition to the effects already obtained in the first to third embodiments, an effect that, by using an average value of eight values taken in the averaging circuit (not shown), sensitivity calibration in an ordinary adjustment of an impedance can be made.

Fifth Embodiment

Figure 18:
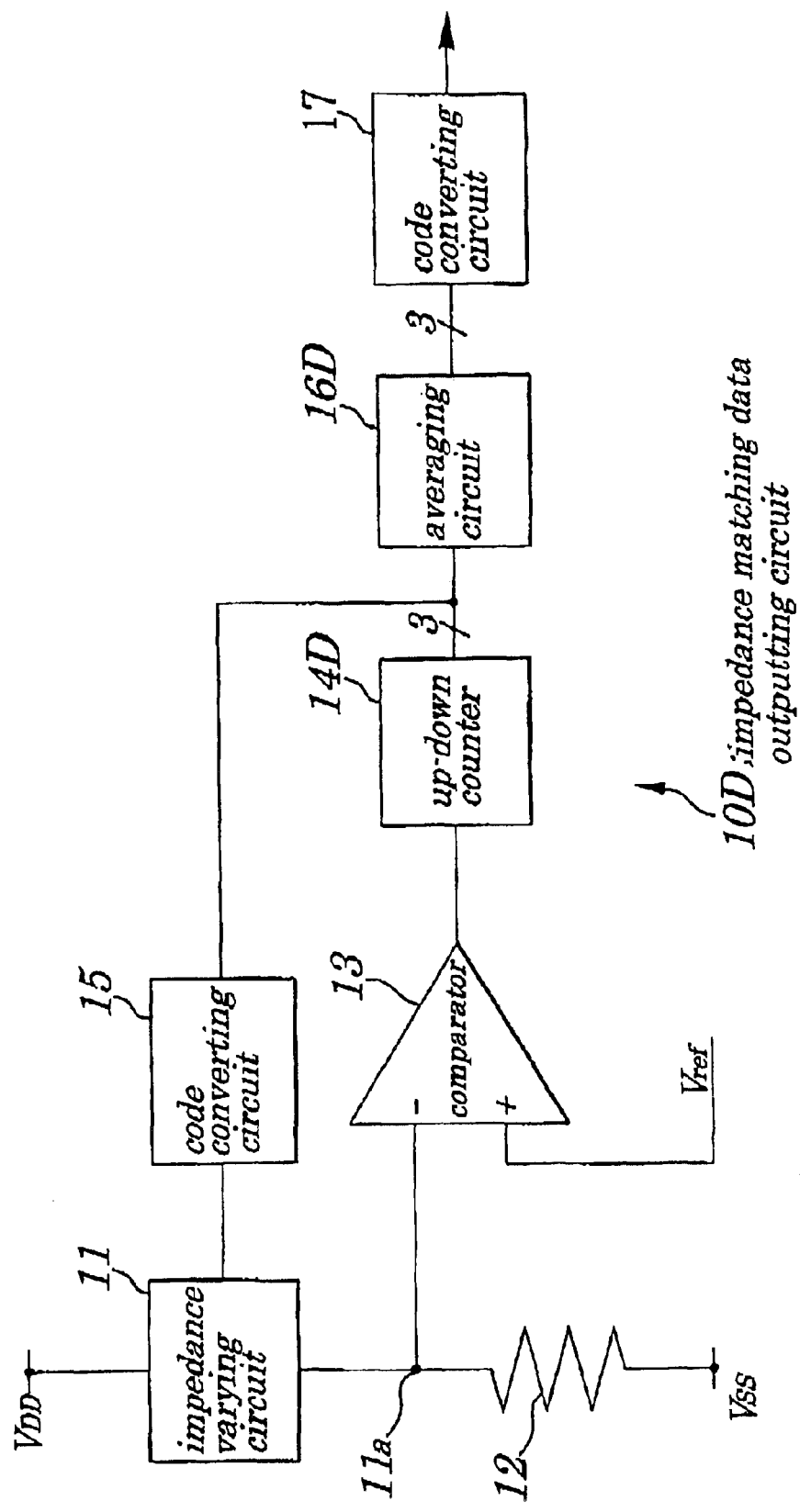
FIG. 18 is a schematic block diagram showing an impedance matching data outputting circuit according to a fifth embodiment of the present invention.
Figure 19:
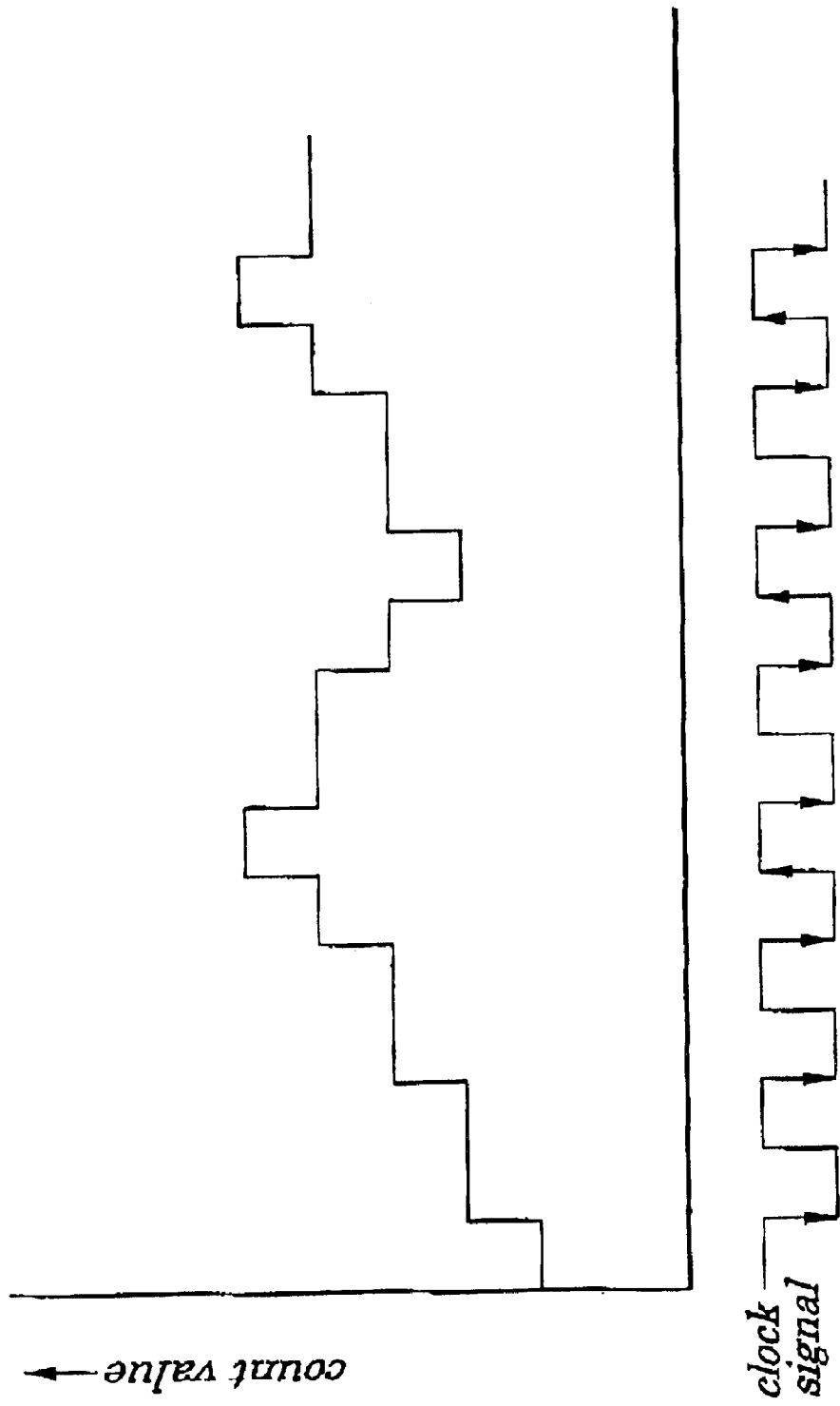
FIG. 19 is a graph showing count values output from an up-down counter of the impedance matching data outputting circuit of the fifth embodiment of the present invention.
Figure 20:
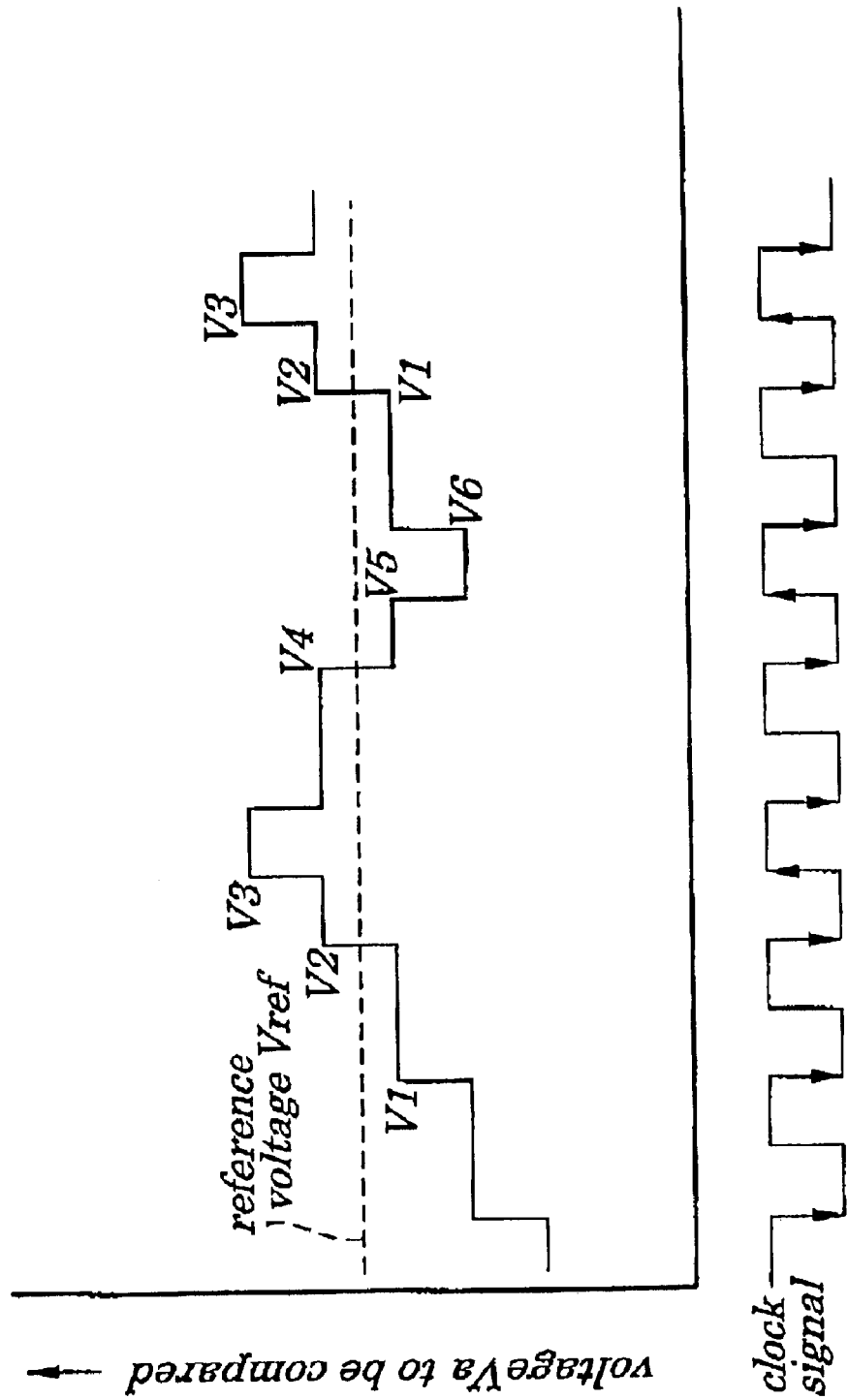
FIG. 20 is a graph showing voltages to be compared which occurs in the impedance matching data outputting circuit of the fifth embodiment of the present invention.

FIG. 18 is a schematic block diagram showing an impedance matching data outputting circuit 10D according to a fifth embodiment. FIG. 19 is a graph showing a count value output from an up-down counter 14D of the impedance matching data outputting circuit 10D of the fifth embodiment. FIG. 20 is a graph showing voltages Va to be compared which occur in the impedance matching data outputting circuit 10D of the fifth embodiment. Configurations of the impedance matching data outputting circuit 10D of the fifth embodiment differ greatly from those in the first to fourth embodiments in that an average value in values obtained in six states, that is, the average value of six values is taken.

In the impedance matching data outputting circuit 10D of the fifth embodiment, an impedance value of an impedance varying circuit 11 is changed by a count value output from the up-down counter 14D whose counting operation is performed according to a result from comparison in a comparator 13 and an up-counting operation of the up-down counter 14D is started in response to a rise or fall of every other clock signal until a voltage Va to be compared occurring at a connecting point $11_a$ gets nearest to a reference voltage Vref and when the voltage Va to be compared crosses over the reference voltage Vref according to the up-counting operation, the counting operation is performed only one time in a manner to respond to the result of the comparison and in response to a rise or fall of a subsequent clock signal, that is, a clock signal existing between the every other clock signal and same operations are repeated from a time of occurrence of a clock signal subsequent to the clock signal used to cause the one time operation to be performed.

An averaging circuit 16D of the fifth embodiment, unlike in the case of an averaging circuit 16 of the first embodiment, is made up of seven pieces of synchronizing circuits and five pieces of adding circuits. Since each of components of the impedance matching data outputting circuit 10D of the fifth embodiment has same configurations as each of the components in the first to fourth embodiments, except the components described above, same reference numbers are assigned to components having the same functions as components in the first to fourth embodiments and their descriptions are omitted accordingly.

Next, operations of the impedance matching data outputting circuit 10D of the fifth embodiment are described by referring to FIGS. 18 to 20. Each of the impedance varying circuit 11, the comparator 13, code converting circuits 15 and 17, except operations of the code converting circuits 15 and 17 in the third and fourth embodiments performs the same operation as each of those of the first to fourth embodiments. When an Up-signal is output as a result of comparison in the comparator 13, an impedance value in the impedance varying circuit 11 is changed by a count value output from the up-down counter 14D whose up-counting operation is performed in response to the Up-signal.

When the impedance is changed, an up-counting operation of the up-down counter 14D is performed in response to a rise or fall of every other clock signal until the voltage Va to be compared occurring at the connecting point $11_a$ gets closest to the reference voltage Vref. When the voltage Va to be compared crosses over the reference voltage Vref by the up-counting operations of the up-down counter 14D, the up-counting operation corresponding to the comparison result is performed further one time in response to a rise or fall of a clock signal existing between every other clock signal. A down-counting operation is performed in response to every other clock signal from a time of occurrence of a clock signal subsequent to the clock signal used to cause the one time up-counting operation to be performed.

When the voltage Va to be compared corresponding to a count value output from the up-down counter 14D according to the down-counting operation becomes below the reference voltage Vref, the down-counting operation is performed further one time in response to a rise or fall of a subsequent clock signal, that is, a clock signal existing between every other clock signal. A down-counting operation is performed again from a time of occurrence of a clock signal subsequent to the signal used to cause the one time down-counting operation to be performed in response to a rise or fall of every other clock containing the above subsequent clock signal and counting operations continue in the same manner as before. Such counting operations are sequentially repeated. FIG. 18 shows an example of count values output from the up-down counter 14D by the counting operations.

Thus, a count value (binary code or binary value) output from the up-down counter 14D is fed to the code converting circuit 15 and the averaging circuit 16D or to the impedance varying circuit 11. When the binary code is directly fed to the impedance varying circuit 11, the binary code is used for changing an impedance of the impedance varying circuit 11. The code converting circuit 15 feeds a thermometer code to the impedance varying circuit 11 in the same way as in the above embodiments. The thermometer code is used for changing an impedance of the impedance varying circuit 11. FIG. 20 shows an example of a voltage Va to be compared occurring due to a change in the impedance at the connecting point $11_a$ of the impedance matching data outputting circuit 10D.

Binary values sequentially output from the up-down counter 14D are set, sequentially in response to clock signals, to six pieces of synchronizing circuits in the averaging circuit 16D and binary values output from the six pieces of the synchronizing circuits are added by five pieces of adding circuits. Added values occurring in an adding circuit existing at a last stage out of the five pieces of the adding circuits are divided by a one-sixth dividing circuit. The value (averaged value) obtained by the dividing operation is set, in response to a clock signal that has caused the binary value to be set to the above six pieces of synchronizing circuits, to a synchronizing circuit placed at a final stage in the averaging circuit 16D.

An average value (binary code) of six values output from the averaging circuit 16D is fed to the code converting circuit 17 which converts the average value to the thermometer code corresponding to the binary code and output it. The thermometer code output from the code converting circuit 17 or a binary code output from the averaging circuit 16D, as described above, is used for impedance matching of an impedance matching circuit that requires impedance matching.

Thus, according to the impedance matching data outputting circuit 10D of the fifth embodiment, as in the first to fourth embodiments, by adding a shift voltage corresponding to one step for a count value output from the up-down counter 14D obtained when the comparator 13 performs an ideal operation, to a voltage Va to be compared, a disadvantage actually occurring in the up-down counter 14D, that is, a technological problem that, when a voltage Va to be compared gets close to a reference voltage Vref, which operation, an up-counting operation or a down-counting operation, must be performed by the up-down counter 14D is not determined, can be avoided.

Moreover, another technological problem can be avoided that, when a count value output from the up-down counter 14D varies among three values including the reference voltage Vref or its near voltage, a voltage being higher by a voltage corresponding to one step than the reference voltage Vref, and a voltage being lower by a voltage corresponding to one step than the reference voltage Vref, impedance matching data output from the impedance matching data outputting circuit 10D also becomes variable.

Also, though the effect obtained in the fourth embodiment can be achieved only in the case of using an average value of multiples of four, by using an average value of six values, the same effect as obtained in the fourth embodiment can be achieved in the fifth embodiment, which can thus remove a technological limitation internally existing in conventional impedance matching data outputting circuits. That is, in any one of the embodiments, any multiples can be averaged for use.

Sixth Embodiment

Figure 21:
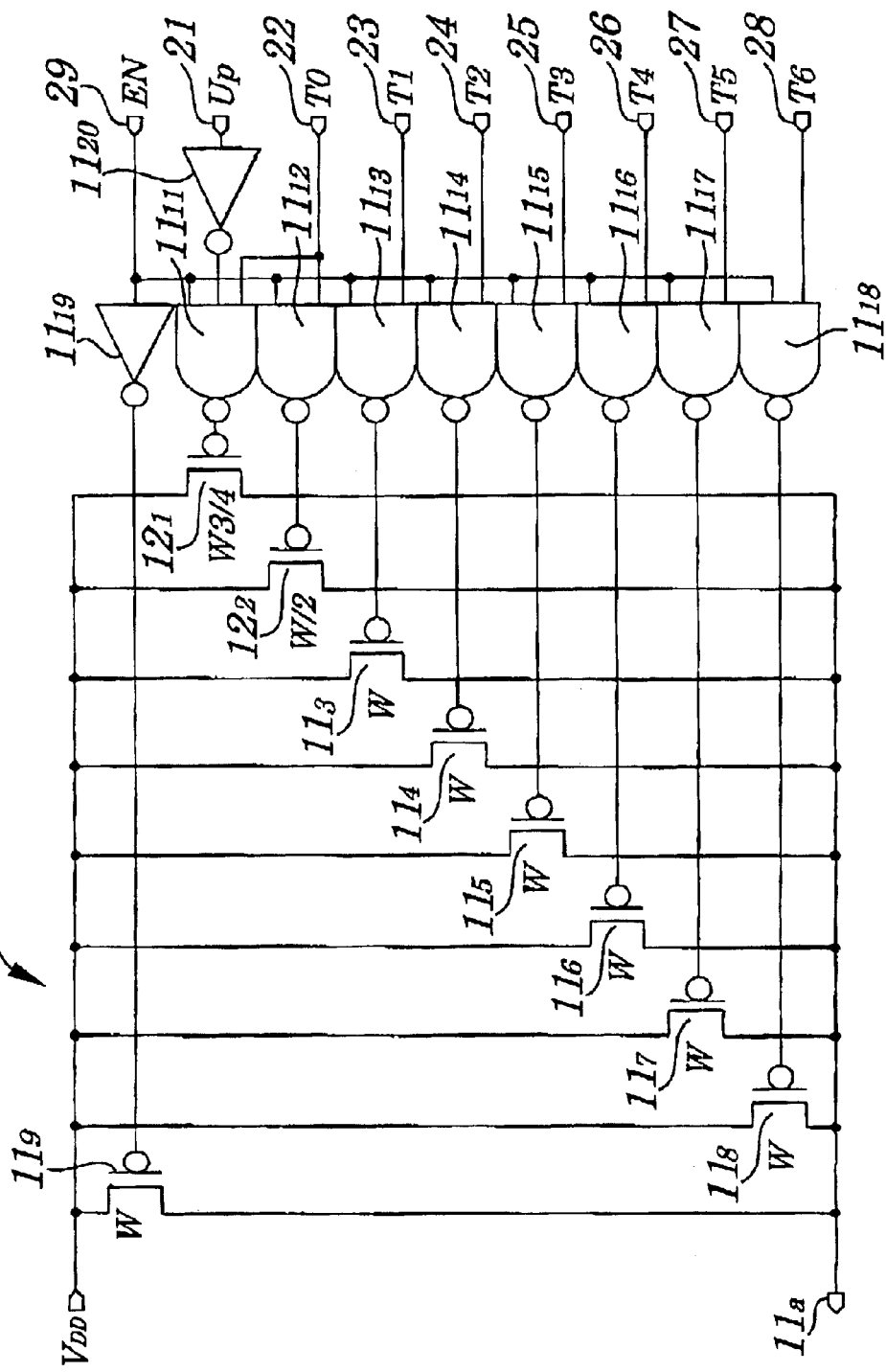
FIG. 21 is a diagram partially showing an impedance varying circuit in an impedance matching data outputting circuit according to a sixth embodiment of the present invention.
Figure 23:
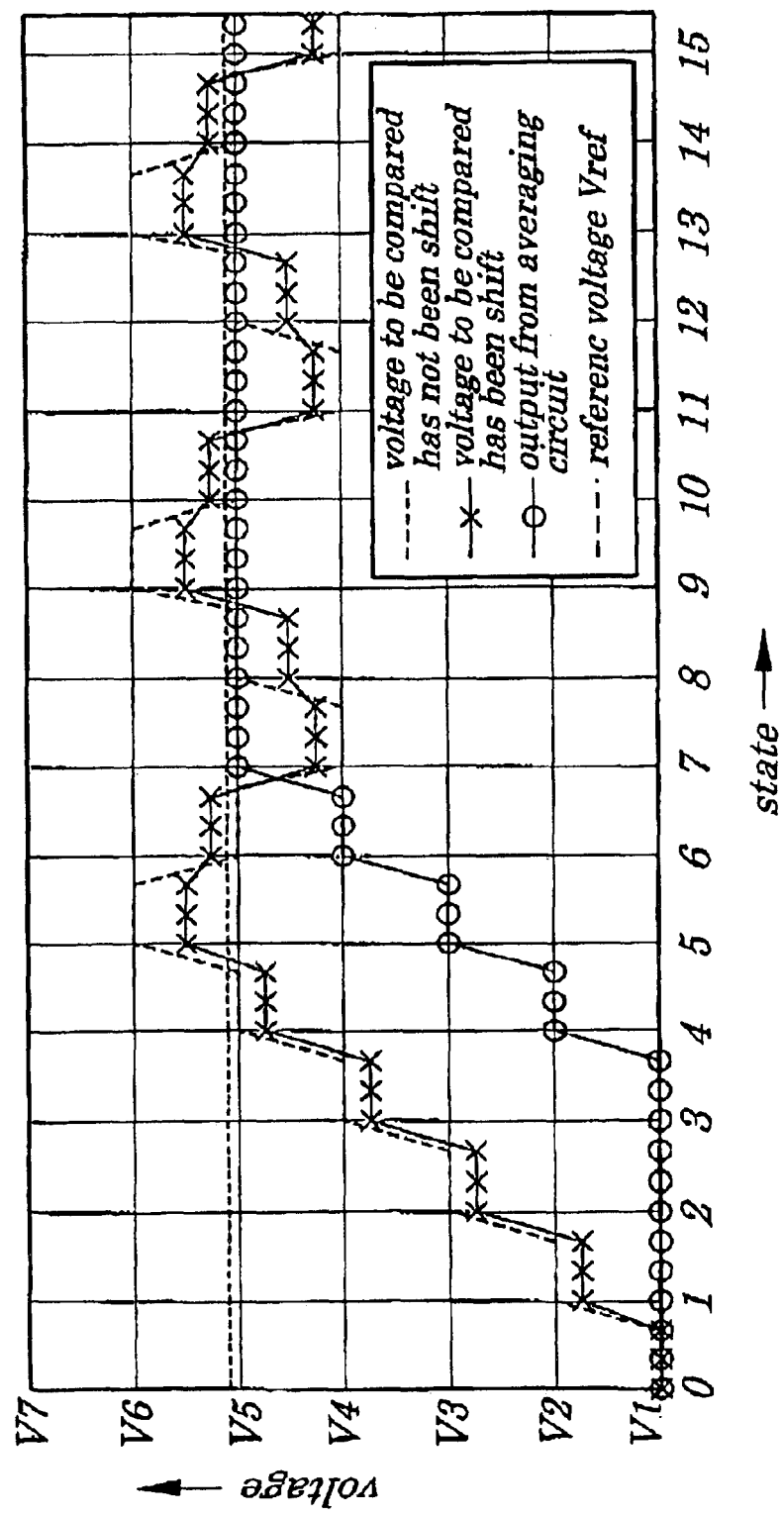
FIG. 23 is an enlarged graph showing a relation between a state of operations of the impedance matching data outputting circuit of the sixth embodiment and a voltage to be compared.
Figure 24:
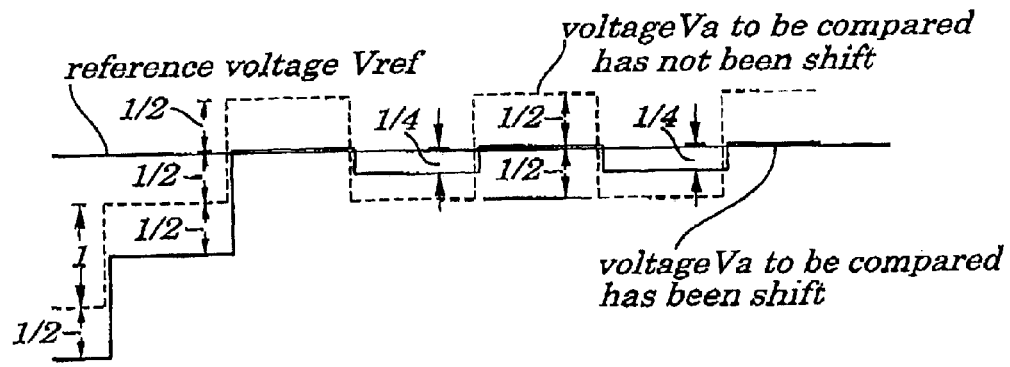
FIG. 24 is a diagram explaining one example of an error occurring in the impedance matching data outputting of the sixth embodiment of the present invention.
Figure 25:
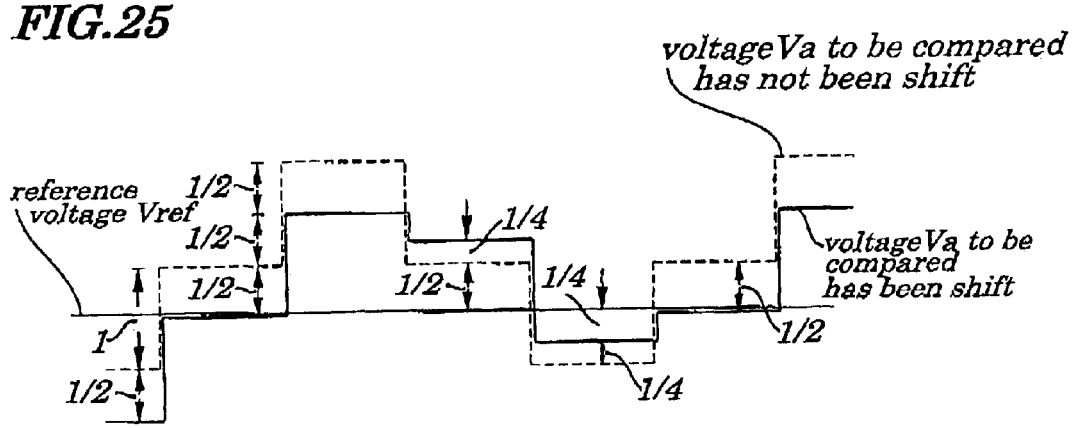
FIG. 25 is a diagram explaining another example of an error occurring in the impedance matching data outputting circuit of the sixth embodiment of the present invention.

FIG. 21 is a diagram partially showing an impedance varying circuit 11E in an impedance matching data outputting circuit 10E (not shown) according to a sixth embodiment of the present invention. FIG. 22 is a diagram showing a change in an impedance in the impedance varying circuit 11E incorporated in the impedance matching data outputting circuit 10E according to the sixth embodiment. FIG. 23 is an enlarged graph showing a relation between a state of operations of the impedance matching data outputting circuit 10E of the sixth embodiment and a voltage Va to be compared. FIG. 24 is a diagram explaining one example of an error occurring in the impedance matching data outputting circuit 10E of the sixth embodiment. FIG. 25 is a diagram explaining another example of an error occurring in the impedance matching data outputting circuit 10E of the sixth embodiment. Configurations of the impedance matching data outputting circuit 10E of the sixth embodiment differ greatly from those of the first to fifth embodiment in that a shift voltage is fed in a different way. That is, only configurations of the impedance varying circuit 11E in the impedance matching data outputting circuit 10E are different from those in an impedance varying circuit 11B shown in FIG. 4.

In the impedance varying circuit 11E, instead of impedance elements $11_1$ and $11_2$ employed in the impedance varying circuit 11B shown in FIG. 4, impedance elements $12_1$ and $12_2$ are used. Therefore, the impedance element $12_1$ is made up of a P-channel type MOSFET having a channel width of ¾ of each of the impedance elements $11_3$ to $11_9$. The impedance element $12_2$ is made up of a P-channel type MOSFET having a channel width of ½ of each of the impedance elements (P-channel type MOSFET) $11_3$ to $11_9$. Since each of components of the impedance matching data outputting circuit 10E of the sixth embodiment has same configurations as each of the components in the first to fifth embodiments, except the components described above, same reference numbers are assigned to components having the same functions as components in the first to fifth embodiments and their descriptions are omitted accordingly.

Next, operations of the impedance matching data outputting circuit 10E of the sixth embodiment are described by referring to FIGS. 1, 6, 9, 10 and FIGS. 21 to 25. In the impedance matching data outputting circuit 10E, according to an impedance of the impedance varying circuit 11E, a voltage Va to be compared is compared with a reference voltage Vref by a comparator 13. If the reference voltage Vref is higher than the voltage Va to be compared, an Up-signal is output from the comparator 13. If the voltage Va to be compared is higher than the reference voltage Vref, a down-signal is output from the comparator 13.

When an Up-signal is output from the comparator 13, a count value output from an up-down counter 14 is increased (incremented) by a binary value "1" in response to every clock signal being input to a clock input CLK and, when a down-signal is output from the comparator 13, a count value output from the up-down counter 14 is decreased (decremented) by a binary value "1" in response to every clock signal being input to a clock input CLK. A count value (binary code or binary value) made up of a B0 bit, B1 bit, and B2 bit being output from the up-down counter 14 in response to every clock signal is fed to a code converting circuit 15 and an averaging circuit 16.

The code converting circuit 15 converts the binary code made up of a B0 bit, B1 bit, and B2 bit fed from the up-down counter 14 into a thermometer code made up of a T0 bit, T1 bit, T2 bit, T3 bit, T4 bit, T5, and T6 bit as shown in FIG. 6. Each of the T0 bit, T1 bit, T2 bit, T3 bit, T4 bit, T5 bit, and T6 bit incorporated in the thermometer code output from the code converting circuit 15 is fed respectively to each of terminals T0, T1, T2, T3, T4, T5, and T6 in the impedance varying circuit 11E.

As in the first embodiment, since a high-level EN signal is fed to an EN terminal of the impedance varying circuit 11E in an ordinary operation of the impedance matching data outputting circuit 10E, a voltage signal output from an inverter $11_{19}$ is kept at a low level and a P-channel type MOSFET is turned ON.

Also, as in the first embodiment, each of NAND circuits $11_{11}$ to $11_{18}$ all of which receive a high-level EN signal through the EN terminal is conditioned to output a low-level or a high-level voltage signal according to a voltage signal fed to another input terminal of these NAND circuits $11_{11}$ to $11_{18}$ and, in addition to that, in a state where an Up-signal is fed to an terminal Up 21 from the up-down counter 14, a low-level voltage signal is output from an inverter $11_{20}$.

Therefore, as in the first embodiment, in a state where a high-level Up-signal (in the case of "UP=1" in FIG. 22) is fed from the up-down counter 14 to the terminal Up 21, a voltage signal output from the NAND circuit $11_{11}$ is at a high level and each of voltage signals output from other NAND circuit $11_{12}$ to $11_{18}$ is at a level corresponding to each of a T0 bit, T2 bit, T3 bit, T4 bit, T5 bit, and T6 bit each being fed to each of the terminals T0, T1, T2, T3, T4, T5, and T6.

As a result, in the impedance varying circuit 11E, according to the T0 bit, T1 bit, T2 bit, T3 bit, T4 bit, T5 bit, and T6 bit fed to each of the terminals T0, T1, T2, T3, T4, T5, and T6, a P-channel type MOSFET corresponding to each of the above bits, out of P-channel type MOSFETs $12_1$, $12_2$, $11_3$ to $11_8$, is turned OFF or ON and an impedance corresponding to the state of the ON/OFF of the P-channel type MOSFET occurs. Every time a binary value "1" occurs (that is, a high-level voltage signal occurs) sequentially for each of the T0 bit, T1 bit, T2 bit, T3 bit, T4 bit, T5 bit, and T6 bit, the impedance value becomes smaller in a step-wise manner (in the case of "UP=1" in FIG. 22). An impedance value becomes the smaller by an amount of a voltage caused by parallel connection of the P-channel type MOSFET $12_2$.

Therefore, since an impedance (resistance) occurring when the P-channel type MOSFETs $11_3$ to $11_8$ are sequentially connected in parallel is larger than that occurring when the Impedance element (P-channel type MOSFET) $11_2$ is not connected in parallel, when the Impedance element (P-channel type MOSFET) $11_2$ is connected in parallel, a level of the voltage Va to be compared is lower by a voltage corresponding to ½ steps than that occurring when the Impedance element (P-channel type MOSFET) $11_2$ is not connected in parallel. That is, a shift voltage is added to a voltage level of the voltage Va to be compared. Here, an increase in a voltage corresponding to "one step" represents an amount of a rise in the voltage which changes when an impedance element having a voltage value proportional to 1/W is connected in parallel to an impedance element that has already existed in the impedance varying circuit 11E.

Moreover, in a state where a low-level Up-signal is fed to the Up terminal 21 from the up-down counter 14 (in the case of "UP=0" in FIG. 22), the T0 bit fed to the T0 terminal serves to effectively control a voltage signal output from the NAND circuit $11_{11}$ and a low-level voltage signal continues to be output from the NAND circuit $11_{11}$ and the impedance element (P-channel type MOSFET) $12_1$ continues to be ON. As in the case of the first embodiment, like in the case of "UP=1", each of other NAND circuits $11_{12}$ to $11_{18}$ outputs a voltage signal being at a level corresponding to each of the T0 bit, T1 bit, T2 bit, T3 bit, T4 bit, T5 bit, and T6 bit, each being fed respectively to the terminals T0, T1, T2, T3, T4, T5, and T6.

Therefore, in the impedance varying circuit 11E, according to the T0 bit, T1 bit, T2 bit, T3 bit, T4 bit, T5 bit, and T6 bit fed to each of the terminals T0, T1, T2, T3, T4, T5, and T6, a P-channel type MOSFET corresponding to each of the above bits, out of the impedance elements (P-channel type MOSFETs) $12_1$, $12_2$, $11_3$ to $11_8$, is turned ON or OFF and an impedance corresponding to the state of the ON/OFF of the P-channel type MOSFET occurs. Every time a binary value "1" occurs (that is, a high-level voltage signal occurs) sequentially for each of the T0 bit, T1 bit, T2 bit, T3 bit, T4 bit, T5 bit, and T6 bit, the impedance value becomes the smaller in a step-wise manner (in the case of "UP=0" in FIG. 22, at a down time).

A rate at which the impedance value becomes smaller at the "down" time in a step-wise manner is smaller by a value proportional to ½W, compared with a case when the impedance value becomes smaller at the "up" time. This is because, when any one of the impedance elements (P-channel type MOSFETs) $11_3$ to $11_8$ that have been connected in parallel in the impedance varying circuit 11E is removed and the impedance element (P-channel type MOSFET) $12_1$ is connected in parallel in the impedance varying circuit 11E, an impedance of the impedance element (P-channel type MOSFET) $12_1$ being connected in parallel is smaller than that of the P-channel type MOSFET that has been removed. A rate at which the impedance value becomes smaller at the "down" time in a second time and thereafter in a step-wise manner becomes a value proportional to ½W which occurs when the impedance value becomes smaller at the "up" time. Therefore, a voltage Va to be compared which is a little higher than a voltage occurring when the impedance element (P-channel type MOSFET) $12_1$ is not connected in parallel in the impedance varying circuit 11E occurs at the connecting point $11_a$.

As described above, a binary code made up of a B0 bit, B1 bit, and B2 bit output from the up-down counter 14 is fed to the code converting circuit 15 and, at a same time, to the averaging circuit 16. The averaging circuit 16 does addition of four codes existing before the binary code, for every binary code (any binary code is made up of a B0 bit, B1 bit, and B2 bit) output sequentially from the up-down counter 14 and divides its sum by four to output averaged binary codes each made up of three bits including an FOUT0 bit, FOUT1 bit, and FOUT2 bit.

Then, the averaged binary code made up of the FOUT0 bit, FOUT1 bit, and FOUT2 is fed to the code converting circuit 17 in which the averaged binary code is converted into a thermometer code and which outputs the resulting thermometer code made up of six bits (being equivalent to those in the code converting circuit 15) including a CP0 bit, CP1 bit, CP2 bit, CP3 bit, CP4 bit, CP5 bit, and CP6 bit. The 6-bit thermometer code (that is, impedance matching data) is fed to an impedance matching circuit (output buffer or input buffer) that requires impedance matching in the high-speed interface shown in FIG. 2 and is used for its impedance matching.

Next, a concrete example of operations of the impedance matching data outputting circuit 10E of the sixth embodiment is explained below. As in the first embodiment, for convenience of explanation, let it be assumed that the reference voltage Vref is represented in binary as "101", a voltage Va to be compared V1 (see FIG. 23) occurring at the connecting point $11_a$ is represented in binary as "000", a count value existing before the up-down counter 14 starts its counting operations in response to a clock signal is represented in binary as "000" and that an Up-signal, which occurs in the case of "Up=1", that is, the signal is given a binary value "1", is output from the UpDn output terminal of the up-down counter 14 and a binary value "0" is output from each of the output terminals B0, B1, and B2. The state where a binary value "0" is output is shown as a "state 0" in FIGS. 23 and 10. Moreover, "000" is set to each of the synchronizing circuits $11_1$ to $11_4$ and $11_{51}$. In FIG. 23, intervals among reference characters V1 to V7 representing voltages shown at a vertical axis are assigned so as to be equal in order to clarify features of the sixth embodiment of the present invention. However, in actual operations, as shown in FIG. 9, the intervals among the reference characters V1 to V6 become smaller as positions become higher on the vertical axis.

The code converting circuit 15 receiving a binary code made up of B0=0, B1=0, and B2=0 (in the case of the code number 0 in FIG. 6) converts it into a thermometer code made up of T0=0, T1=0, T2=0, T3=0, T4=0, T5=0, and T6=0 and outputs each of the thermometer bits respectively to output terminals T0, T1, T2, T3, T4, T5, and T6. Therefore, all the impedance elements (P-channel type MOSFETs) $12_1$, $12_2$, $11_3$ to $11_8$ in the impedance varying circuit 11E are turned OFF and only the Impedance element (P-channel type MOSFET) $11_9$ is turned ON. An impedance of the impedance varying circuit 11E becomes a value proportional to 1/W (in the case of the code number 0 in FIG. 22). At this time, it is assumed that a voltage Va to be compared V1 (called a lowest voltage Va to be compared) occurring at the connecting point $11_a$ is lower by a voltage corresponding to four steps than a reference voltage Vref. Here, the voltage corresponding to "one step" represents an amount of a change in the voltage in a voltage signal occurring when an impedance value proportional to 1/W changes by 1 (one) and, though voltages each corresponding to one step is shown to be equal to each other in FIG. 8, actually the voltages are different from each other for every step as shown in FIG. 9.

In a state where the reference voltage Vref is larger than a voltage Va to be compared and an Up-signal having a binary value "1" is output from the comparator 13 and is input to the UpDn input terminal of the up-down counter 14, when a first clock signal is fed to the up-down counter 14, a count value output from the up-down counter 14 increases by 1 (one) and becomes a binary code made up of B2=0, B1=0, and B0=1. A signal being output from the UpDn output terminal of the up-down counter 14 remains an Up-signal Up.

A binary code made up of B2=0, B1=0, and B0=1 output from the up-down counter 14 is fed to the code converting circuit 15 and the averaging circuit 16. A code of a binary count value made up of B2=0, B1=0, and B0=1 is converted in the code converting circuit 15 to a thermometer code made up of T0=1, T1=0, T2=0, T3=0, T4=0, T5=0, and T6=0 (in the case of the code number 1 in FIG. 6). Therefore, the Impedance element (P-channel type MOSFET) $11_9$ in the impedance varying circuit 11E continues to be ON and, in addition, the impedance element (P-channel type MOSFET)

$12_2$ is turned ON and, on the other hand, the impedance elements (P-channel type MOSFETs) $12_1$, $11_3$ to $11_8$ continue to be OFF. As a result, an impedance of the impedance varying circuit 11E becomes a value proportional to 1/(W+ ½W) (in the case of the code number 1 in FIG. 22).

At this time, a voltage Va to be compared occurring at the connecting point $11_a$ is higher by a voltage corresponding to ½ steps than the lowest voltage Va to be compared. The voltage Va to be compared still remains lower than the reference voltage Vref. Here, an increase in a voltage corresponding to "½ step" represents an amount of a rise in the voltage occurring when an impedance element having a value proportional to ½W is connected to an impedance element already existing in the impedance varying circuit 11E. This state of the voltage is shown in FIG. 23 as the "state 1" in which a shift voltage has been fed to a voltage Va to be compared. Therefore, an Up-signal continues to be output from the comparator 13. Moreover, small dotted lines show a case in which no shift voltage has been fed to the voltage Va to be compared.

Moreover, since the first clock signal is fed also to the averaging circuit 16, a binary count value made up of B2=0, B1=0, and B0=1 output from the up-down counter 14 is set in the synchronizing circuit $16_1$ in the averaging circuit 16. This state is shown in FIG. 10 as the "state 1".

Before the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value in the adding circuit $16_{31}$ is "000000" in binary. The added value being output from the adding circuit $16_{31}$ is divided by four in the synchronizing circuit $16_{51}$ operated in response to the first clock signal. However, since the result of the dividing operation provides no meaning until the "state 3" described later occurs, descriptions of the addition and division to be done before the occurrence of the "state 3" are omitted accordingly.

When a second clock signal is input to the up-down counter 14, a count value to be output from the up-down counter 14 is increased to be a binary count value made up of B2=0, B1=1, and B0=0. The binary count value made up of B2=0, B1=1, and B0=0 output from the up-down counter 14 is fed to the code converting circuit 15 where code conversion is made and a code-converted thermometer code made up of T0 bit=1, T1 bit=1, T2 bit=0, T3 bit=0, T4 bit=0, T5 bit=0, and T6 bit=0 is output from the code converting circuit 15 (in the case of the code number 2 in FIG. 6).

The resulting thermometer code is used for impedance matching of the impedance varying circuit 11E in the same manner as described above. That is, the impedance elements (P-channel type MOSFETs) $12_2$ and $11_9$ in the impedance varying circuit 11E continue to be ON and, in addition, the Impedance element (P-channel type MOSFET) $11_3$ is newly turned ON and impedance elements (P-channel type MOSFETs) $12_1$ and $11_4$ to $11_8$ continue to be OFF. Therefore, an impedance of the impedance varying circuit 11E becomes a value proportional to 1/(2W+½W). The change in an impedance causes a change in the voltage Va to be compared occurring at the connecting point $11_a$, that is, the change increases the voltage Va to be compared by a voltage corresponding to one step. Here, an increase of the voltage corresponding to "one step" represents an amount of a voltage occurring when an impedance element having a value proportional to 1/W is connected to the impedance element already existing in the impedance varying circuit 11E (same hereinafter). The voltage Va to be compared occurring after the change is shown in FIG. 23 as the "state 2" in which a shift voltage has been fed to the voltage Va to be compared.

Moreover, since the second clock signal is fed also to the averaging circuit 16, a binary code made up of B2=0, B1=0, and B0=0 having been set in the synchronizing circuit $16_2$ in the averaging circuit 16 is set in the synchronizing circuit $16_3$ and a binary code made up of B2=0, B1=0, and B0=1 having been set in the synchronizing circuit $16_1$ is set in the synchronizing circuit $16_2$ and, at a same time, a binary code made up of B2=0, B1=1, and B0=0 existing in the up-down counter 14 is set in the synchronizing circuit $16_1$ (in the case of the "state 2" in FIG. 10).

When a third clock signal is input to the up-down counter 14, a count value to be output from the up-down counter 14 is increased so as to be a binary count value made up of B2=0, B1=1, and B0=0. The binary count value made up of B2=0, B1=1, and B0=0 output from the up-down counter 14 is fed to the code converting circuit 15 where code conversion is made and a code-converted thermometer code made up of T0 bit=1, T1 bit=1, T2 bit=1, T3 bit=0, T4 bit=0, T5 bit=0, and T6 bit=0 is output from the code converting circuit 15 (in the case of the code number 3 in FIG. 6).

The resulting thermometer code is used for impedance matching of the impedance varying circuit 11E in the same manner as described above. That is, the impedance elements (P-channel type MOSFETs) $12_2$, $11_3$ and $11_9$ in the impedance varying circuit 11E continue to be ON and, in addition, the Impedance element (P-channel type MOSFET) $11_4$ is newly turned ON and impedance elements (P-channel type MOSFETs) $12_1$ and $11_5$ to $11_8$ continue to be OFF. Therefore, an impedance of the impedance varying circuit 11E becomes a value proportional to 1/(3W+½W) (in the case of the code number 3 in FIG. 22). The change in an impedance causes a change in the voltage Va to be compared occurring at the connecting point $11_a$, that is, the change increases the voltage Va to be compared by a voltage corresponding to one step. The voltage Va to be compared occurring after the change is shown in FIG. 23 as a "state 3" in which a shift voltage has been fed to the voltage Va to be compared.

Moreover, since the third clock signal is fed also to the averaging circuit 16, a binary code made up of B2=0, B1=0, and B0=0 having been set in the synchronizing circuit $16_3$ in the averaging circuit 16 is set in the synchronizing circuit $16_4$ and a binary code made up of B2=0, B1=0, and B0=1 having been set in the synchronizing circuit $16_2$ is set in the synchronizing circuit $16_3$ and the binary code made up of B2=0, B1=1, and B0=0 having been set in the synchronizing circuit $16_1$ is set in the synchronizing circuit $16_2$ and, at a same time, a binary code made up of B2=0, B1=1, and B0=1 existing in the up-down counter 14 is set in the synchronizing circuit $16_1$ (in the case of the "state 3" in FIG. 10).

When the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "6"

("00110" in binary) in the "state 3" for the output from the adding circuit $16_{31}$.

Then, when a fourth clock signal is fed to the up-down counter 14, since the voltage Va to be compared still remains lower than the reference voltage Vref at this time, in response to the fourth clock signal fed to the up-down counter 14, a binary count value is increased so as to a binary value made up of B2=1, B1=0, and B0=0. The binary count value made up of B2=1, B1=0, and B0=0 output from the up-down counter 14 is fed to the code converting circuit 15 where code conversion is made and the code-converted thermometer code made up of T0 bit=1, T1 bit=1, T2 bit=1, T3 bit=1, T4 bit=0, T5 bit=0, and T6 bit=0 is output from the code converting circuit 15 (in the case of the code number 4 in FIG. 6).

The resulting thermometer code is used for impedance matching of the impedance varying circuit 11E in the same manner as described above. That is, the impedance elements (P-channel type MOSFETs) $12_2$, $11_3$, $11_4$ and $11_9$ in the impedance varying circuit 11E continue to be ON and, in addition, the Impedance element (P-channel type MOSFET) $11_5$ is newly turned ON and impedance elements (P-channel type MOSFETs) $12_1$ and $11_6$ to $11_8$ continue to be OFF. Therefore, an impedance of the impedance varying circuit 11E becomes a value proportional to 1/(4W+½W) (in the case of the code number 4 in FIG. 22). The change in an impedance causes a change in the voltage Va to be compared occurring at the connecting point $11_a$, that is, the change increases the voltage Va to be compared by a voltage corresponding to one step. The voltage Va to be compared occurring after the change is shown in FIG. 23 as a "state 4". The voltage Va to be compared becomes a value occurring when the voltage Va to be compared gets closest to the reference voltage Vref while the voltage Va to be compared is increasing.

Moreover, since the fourth clock signal is fed also to the averaging circuit 16, the binary code made up of B2=0, B1=0, and B0=1 having been set in the synchronizing circuit $16_3$ in the averaging circuit 16 is set in the synchronizing circuit $16_4$ and the binary code made up of B2=0, B1=1, and B0=0 having been set in the synchronizing circuit $16_2$ is set in the synchronizing circuit $16_3$ and the binary code made up of B2=0, B1=1, and B0=1 having been set in the synchronizing circuit $16_1$ is set in the synchronizing circuit $16_2$ and, at a same time, the binary code made up of B2=1, B1=0, and B0=0 existing in the up-down counter 14 is set in the synchronizing circuit $16_1$ (in the case of the "state 4" in FIG. 10).

When the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "10" ("01010" in binary) in the "state 4" for the output from the adding circuit $16_{31}$.

Moreover, since the fourth clock signal is input also to the synchronizing circuit $16_{51}$, an added value six obtained by addition in the adding circuit $16_{31}$ in the "state 3" ("state 3" of output from the adding circuit $16_{31}$ in FIG. 10) is divided by four (that is, shifted to a lower-order digit by two bits) by the synchronizing circuit $16_{51}$ and is output from the synchronizing circuit $16_{51}$ as "1" in decimal ("1" in binary) ("state 4" of output from the synchronizing circuit $16_{51}$ in FIG. 10). The thermometer code output from the synchronizing circuit $16_{51}$, as described above, is fed to an object (impedance matching circuit) that requires impedance matching and is used for the impedance matching therein.

Then, when a fifth clock signal is fed to the up-down counter 14, since the voltage Va to be compared still remains lower than the reference voltage Vref, an Up-signal continues to be output from the comparator 13. Therefore, when the fifth clock signal is input to the up-down counter 14, a binary count value to be output from the up-down counter 14 is increased so as to be a binary value made up of B2=1, B1=0, and B0=1. The binary count value made up of B2=1, B1=0, and B0=1 output from the up-down counter 14 is fed to the code converting circuit 15 where code conversion is made and a code-converted thermometer code made up of T0 bit=1, T1 bit=1, T2 bit=1, T3 bit=1, T4 bit=1, T5 bit=0, and T6 bit=0 is output from the code converting circuit 15 (in the case of the code number 5 in FIG. 6).

The resulting thermometer code is used for impedance matching of the impedance varying circuit 11E in the same manner as described above. That is, the impedance elements (P-channel type MOSFETs) $12_2$, $11_3$, $11_4$, $11_5$ and $11_9$ in the impedance varying circuit 11E continue to be ON and, in addition, the Impedance element (P-channel type MOSFET) $11_6$ is newly turned ON and impedance elements (P-channel type MOSFETs) $12_1$, $11_7$ and, $11_8$ continue to be OFF. Therefore, an impedance of the impedance varying circuit 11E becomes a value proportional to 1/(5W+½W) (in the case of the code number 5 in FIG. 22). The change in an impedance causes a change in the voltage Va to be compared occurring at the connecting point $11_a$, that is, the change increases the voltage Va to be compared by a voltage corresponding to one step. The voltage Va to be compared occurring after the change is shown in FIG. 23 as a "state 5" in which a shift voltage has been fed to the voltage Va to be compared. The voltage Va to be compared becomes a value being higher by a voltage corresponding to one step than a value occurring when the voltage Va to be compared gets closest to the reference voltage while the voltage Va to be compared is increasing.

Moreover, since the fifth clock signal is fed also to the averaging circuit 16, a binary code made up of B2=0, B1=1, and B0=0 having been set in the synchronizing circuit $16_3$ in the averaging circuit 16 is set in the synchronizing circuit $16_4$ and a binary code made up of B2=0, B1=1, and B0=1 having been set in the synchronizing circuit $16_2$ is set in the synchronizing circuit $16_2$ and, at a same time, a binary code made up of B2=1, B1=0, and B0=1 existing in the up-down counter 14 is set in the synchronizing circuit $16_1$ (in the case of the "state 5" in FIG. 10).

When the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "14" ("01110 in binary) in the "state 5" for the output from the adding circuit $16_{31}$.

Moreover, since the fifth clock signal is input also to the synchronizing circuit $16_{51}$, an added value being "10" in decimal ("state 4" of output from the adding circuit $16_{31}$ in FIG. 10) obtained by addition in the adding circuit $16_{31}$ in the "state 4" is divided by four (that is, shifted to a lower-order digit by two bits) by the synchronizing circuit $16_{51}$ and is output from the synchronizing circuit $16_{51}$ as "2" in decimal ("10" in binary) ("state 5" of output from the synchronizing circuit $16_{51}$ in FIG. 10). The thermometer code output from the synchronizing circuit $16_{51}$, as described above, is fed to an object (impedance matching circuit) that requires impedance matching and is used for the impedance matching therein.

Then, when a sixth clock signal is input to the up-down counter 14, since the voltage Va to be compared is higher than the reference voltage Vref, a down-signal is output from the comparator 13. Therefore, when the sixth clock signal is input to the up-down counter 14, a binary count value is decreased so that a binary count value being made up of B2=1, B1=0, and B0=0. Outputting of a high-level Up-signal ("1" in binary") output from an UpDn output terminal of the up-down counter 14 is stopped, that is, a low-level Up-signal ("0" in binary) is output. The binary count value being made up of B2=1, B1=0, and B0=0 output from the up-down counter 14 is fed to the code converting circuit 15 where code conversion is made and a code-converted thermometer code made up of T0 bit=1, T1 bit=1, T2 bit=1, T3 bit=1, T4 bit=0, T5 bit=0, and T6 bit=0 is output from the code converting circuit 15 (in the case of the code number 6 in FIG. 6).

The thermometer code, in the same way as above, is used for changing an impedance of the impedance varying circuit 11E. That is, at time when the sixth clock signal is input, since the Up-signal output from the up-down counter 14 becomes a low-level Up-signal ("0" in binary), a high-level voltage is output from an inverter $11_{20}$ in the impedance varying circuit 11E. Therefore, a low-level voltage is output from a NAND circuit $11_{11}$ and the Impedance element (P-channel type MOSFET) $11_1$ is turned ON.

Moreover, impedance elements (P-channel type MOSFETs) $12_2$, $11_3$, $11_4$, $11_5$, and $11_9$ in the impedance varying circuit 11E continue to be ON and, in addition, the impedance element (P-channel type MOSFET) $12_1$ having been OFF is turned ON and the Impedance element (P-channel type MOSFET) $11_6$ having been ON is turned OFF and, on the other hand, the impedance element (P-channel type MOSFET) $11_6$ having been ON is tunred OFF and impedance elements (P-channel type MOSFETs) $11_7$ and $11_8$ continue to be OFF. Therefore, an impedance of the impedance varying circuit 11E becomes a value proportional to 1/(4W+¾W+W/2) (in the case of the code number 4 in FIG. 22). The change in the impedance causes a change in the voltage Va to be compared occurring at the connecting point $11_a$, that is, the change causes the voltage Va to be compared to drop by a voltage corresponding to ¼ steps. Here, a drop in the voltage corresponding to "¼ steps" represents an amount of a drop in a voltage occurring when an impedance element having a value being proportional to 1/W is removed from impedance elements already existing in the impedance varying circuit 11E and an impedance element having a value being proportional to ¾W is connected in parallel.

The voltage Va to be compared occurring after the change is shown in FIG. 23 as the "state 6" in which a shift voltage has been fed to the voltage Va to be compared. The voltage Va to be compared becomes a voltage value occurring when the voltage Va to be compared gets nearest to the reference voltage Vref while the voltage Va to be compared is decreasing, that is, a value being lower by a voltage corresponding to ¼ steps than a potential level in a state existing before by one and is higher by a voltage corresponding to ¼ steps than the reference voltage Vref. An impedance (that is, being determined by a channel width) of the impedance elements (P-channel type MOSFETs) $12_1$ and $12_2$ is selected so that a shift voltage required for the voltage Va to be compared to cross over the reference voltage Vref by a voltage being higher than an upper limit of an offset voltage of the comparator 13, is added to the voltage Va to be compared occurring at this time.

Moreover, since the sixth clock signal is fed also to the averaging circuit 16, a binary code made up of B2=0, B1=1, and B0=1 having been set in the synchronizing circuit $16_3$ in the averaging circuit 16 is set in the synchronizing circuit $16_4$ and a binary code made up of B2=1, B1=0, and B0=1 having been set in the synchronizing circuit $16_2$ is set in the synchronizing circuit $16_3$ and, at a same time, a binary code made up of B2=1, B1=0, and B0=0 existing in the up-down counter 14 is set in the synchronizing circuit $16_1$ (in the case of the "state 6" in FIG. 10).

When the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "16" ("10000" in binary) in the "state 6" for the output from the adding circuit $16_{31}$.

Moreover, since the sixth clock signal is input also to the synchronizing circuit $16_{51}$, the added value being 14 in decimal ("01110" in binary) ("state 5" of output from the adding circuit $16_{31}$ in FIG. 10) obtained by addition in the adding circuit $16_{31}$ in the "state 5" is divided by four (that is, shifted to a lower-order digit by two bits) by the synchronizing circuit $16_{51}$ and is output from the synchronizing circuit $16_{51}$ as "3" in decimal ("11" in binary) ("state 6" of output from the synchronizing circuit $16_{51}$ in FIG. 10 and "state 6" of output from the averaging circuit 16 in FIG. 23). The thermometer code output from the synchronizing circuit $16_{51}$, as described above, is fed to an object (impedance matching circuit) that requires impedance matching and is used for the impedance matching therein.

Then, when a seventh clock signal is input to the up-down counter 14, since the voltage Va to be compared is higher than the reference voltage Vref, a down-signal is output from the comparator 13. Therefore, when the seventh clock signal is input to the up-down counter 14, a binary count value is decreased so that a binary count value made up of B2=0, B1=1, and B0=1. A low-level Up-signal ("0" in binary) is output from the UpDn output terminal of the up-down counter 14. The binary count value made up of B2=0, B1=1, and B0=1 output from the up-down counter 14 is fed to the code converting circuit 15 where code conversion is made and a code-converted thermometer code made up of T0 bit=1, T1 bit=1, T2 bit=1, T3 bit=0, T4 bit=0, T5 bit=0, and T6 bit=0 is output from the code converting circuit 15 (in the case of the code number 3 in FIG. 6).

The thermometer code, in the same way as above, is also used for changing an impedance of the impedance varying circuit 11E. That is, at time when the seventh clock signal is input, since the Up-signal output from the up-down counter 14 is a low-level Up-signal ("0" in binary), a high-level voltage is output from an inverter $11_{21}$ in the impedance varying circuit 11E. Therefore, a low-level voltage is output from the NAND circuit $11_{11}$ and the Impedance element (P-channel type MOSFET) $11_1$ is turned ON.

Moreover, impedance elements (P-channel type MOSFETs) $12_2$, $11_3$, $11_4$, $11_{51}$ and $11_9$ in the impedance varying circuit 11E continue to be ON and, on the other hand, the Impedance element (P-channel type MOSFET) $11_5$ having been ON is turned OFF and P-channel type MOSFETs $11_6$ and $11_8$ continue to be OFF. Therefore, an impedance of the impedance varying circuit 11E becomes a value being proportional to $1/(3W+¾W+W/2)$ (in the case of the code number 3 in FIG. 22). The change in the impedance causes a change in the voltage Va to be compared occurring at the connecting point $11_a$, that is, the change causes the voltage Va to be compared to drop by a voltage corresponding to one step. The voltage to be compared after the change is shown in FIG. 8 as the "state 7" in which a shift voltage has been fed to the voltage to be compared. The voltage Va to be compared becomes a voltage value being lower by a voltage corresponding to one step than a voltage value occurring when the voltage Va to be compared gets closest to the reference voltage Vref while the voltage Va to be compared is decreasing.

Moreover, since the seventh clock signal is fed also to the averaging circuit 16, a binary code made up of B2=1, B1=0, and B0=0 having been set in the synchronizing circuit $16_3$ in the averaging circuit 16 is set in the synchronizing circuit $16_4$ and a binary code made up of B2=1, B1=0 and B0=1 having been set in the synchronizing circuit $16_2$ is set in the synchronizing circuit $16_3$ and a binary code made up of B2=1, B1=0, and B0=0 having been set in the synchronizing circuit $16_1$ is set in the synchronizing circuit $16_2$ and, at a same time, the binary code made up of B2=0, B1=1, and B0=1 existing in the up-down counter 14 is set in the synchronizing circuit $16_1$ (in the case of the "state 7" in FIG. 10).

When the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "16" ("10000" in binary) in the "state 7" for the output from the adding circuit $16_{31}$.

Moreover, since the seventh clock signal is input also to the synchronizing circuit $16_{51}$, the added value being "16" in decimal ("10000" in binary) ("state 6" of output from the adding circuit $16_{31}$ in FIG. 10) obtained by addition in the adding circuit $16_{31}$ in the "state 5" is divided by four (that is, shifted to a lower-order digit by two bits) by the synchronizing circuit $16_{51}$ and is output from the synchronizing circuit $16_{51}$ as "4" in decimal ("100" in binary) ("state 7" of output from the synchronizing circuit $16_{51}$ in FIG. 10 and "state 7" of output from the averaging circuit 16 in FIG. 23). The thermometer code output from the synchronizing circuit $16_{51}$, as described above, is fed to an object (impedance matching circuit) that requires impedance matching and is used for the impedance matching therein.

Then, when an eighth clock signal is input to the up-down counter 14, since the voltage Va to be compared is lower than the reference voltage Vref, an Up-signal is output from the comparator 13. Therefore, when the eighth clock signal is input to the up-down counter 14, a binary count value is increased so that a binary count value made up of B2=1, B1=0, and B0=0. A high-level Up-signal ("1" in binary) is output from the UpDn output terminal of the up-down counter 14. The binary count value made up of B2=1, B1=0, and B0=0 output from the up-down counter 14 is fed to the code converting circuit 15 where code conversion is made and a code-converted thermometer code made up of T0 bit=1, T1 bit=1, T2 bit=1, T3 bit=1, T4 bit=0, T5 bit=0, and T6 bit=0 is output from the code converting circuit 15 (in the case of the code number 4 in FIG. 6).

The thermometer code, in the same way as above, is used for changing an impedance of the impedance varying circuit 11E. That is, at time when the eighth clock signal is input, since the Up-signal output from the up-down counter 14 is a high-level Up-signal ("1" in binary), a low-level voltage is output from an inverter $11_{20}$ in the impedance varying circuit 11E. Therefore, a high-level voltage is output from the NAND circuit $11_{11}$ and the impedance element (P-channel type MOSFET) $12_1$ is turned OFF.

Moreover, impedance elements (P-channel type MOSFETs) $12_2$, $11_3$, $11_4$, and $11_9$ in the impedance varying circuit 11E continue to be ON and, on the other hand, the Impedance element (P-channel type MOSFET) $11_5$ having been OFF is turned ON and P-channel type MOSFETs $11_6$ to $11_8$ continue to be OFF. Therefore, an impedance of the impedance varying circuit 11E becomes a value being proportional to $1/(4W+½W)$ (in the case of the code number 4 in FIG. 22).

The change in the impedance causes a change in the voltage Va to be compared occurring at the connecting point $11_a$, that is, the change causes the voltage Va to be compared to increase by a voltage corresponding to ¼ step. Here, an increase in the voltage corresponding to "¼ steps" represents an amount of a rise in a voltage occurring when an impedance element having a value proportional to ¾W is removed from impedance elements already existing in the impedance varying circuit 11E and an impedance element having a value being proportional to ¼W is connected in parallel. The voltage Va to be compared occurring after the change is shown in FIG. 23 as the "state 8". The "state 8" is same for the "state 4". The voltage Va to be compared becomes a voltage value occurring when the voltage Va to be compared gets closest to the reference voltage Vref while the voltage Va to be compared is increasing.

Moreover, since the eighth clock signal is fed also to the averaging circuit 16, a binary code made up of B2=1, B1=0, and B0=1 having been set in the synchronizing circuit $16_3$ in the averaging circuit 16 is set in the synchronizing circuit $16_4$ and a binary code made up of B2=1, B1=0, and B0=0 having been set in the synchronizing circuit $16_2$ is set in the synchronizing circuit $16_3$ and a binary code made up of B2=0, B1=1, and B0=1 having been set in the synchronizing circuit $16_1$ is set in the synchronizing circuit $16_2$ and, at a same time, a binary code made up of B2=1, B1=0, and B0=0 existing in the up-down counter 14 is set in the synchronizing circuit $16_1$ (in the case of the "state 8" in FIG. 10).

When the above setting is completed, after a binary value being set in the synchronizing circuit $16_1$ has been added to a binary value being set in the synchronizing circuit $16_2$ in the adding circuit $16_{21}$ and after a binary value being set in the synchronizing circuit $16_3$ has been added to a binary value being set in the synchronizing circuit $16_4$ in the adding circuit $16_{22}$, the added value being output from the adding circuit $16_{21}$ is added to the added value being output from the adding circuit $16_{22}$ in the adding circuit $16_{31}$. The resulting added value is shown in FIG. 10 in decimal as "16" ("10000" in binary) in the "state 8" for the output from the adding circuit $16_{31}$.

Moreover, since the eighth clock signal is input also to the synchronizing circuit $16_{51}$, the added value being "16" in decimal ("10000" in binary) ("state 7" of output from the adding circuit $16_{31}$ in FIG. 10) obtained by addition in the adding circuit $16_{31}$ in the "state 5" is divided by four (that is, shifted to lower-order digit by two bits) by the synchronizing circuit $16_{51}$ and is output from the synchronizing circuit $16_{51}$ as "4" in decimal ("100" in binary) ("state 8" of output from the synchronizing circuit $16_{51}$ in FIG. 10 and "state 8" of output from the averaging circuit 16 in FIG. 23). The thermometer code output from the synchronizing circuit $16_{51}$, as described above, is fed to an object (impedance matching circuit) that requires impedance matching and is used for the impedance matching herein.

Contents for the "state 8" shown in FIG. 23 become the same as for the "state 4" described above and thereafter operations occurring from the "state 4" to the "state 7" are repeated. That is, as normal operations, operations from the "state 4" to the "state" 7 are repeated.

As is apparent in FIG. 23, in the conventional technology, when an ordinary operation for impedance matching is performed, a control code output from the impedance matching data outputting circuit to be used as a reference for impedance matching in an impedance matching circuit that requires impedance matching is inevitably varied, due to a characteristic of an up-down counter being used in the feedback control system, among voltages that get near to a reference voltage Vref of the comparator 13 (that is, a voltage occurring outside an upper and lower limit voltage of an offset voltage of the comparator 13), a voltage being lower by a voltage corresponding to one step than the above voltage that gets near to the reference voltage Vref, and a voltage being higher by a voltage corresponding to one step than the above voltage that gets near to the reference voltage Vref. However, according to the impedance matching data outputting circuit 10E of the sixth embodiment of the present invention, even if a voltage Va to be compared to be fed to the comparator 13 in the impedance matching data outputting circuit 10E gets near to a reference voltage Vref, since a shift voltage being large enough for the comparator 13 to perform an exact judgement is fed to the voltage Va to be compared, an average value (impedance matching data) (output from the averaging circuit 16 in FIG. 23) of four values occurring within four periods of basic unit time for a feedback control code that changes at levels being higher and lower than a level of a reference code corresponding to the reference voltage Vref is not varied at the ordinary operations for feedback control.

In the impedance matching data outputting circuit 10E of the sixth embodiment, there are some cases in which an error in impedance matching operations becomes largest. FIGS. 24 and 25 show such the cases. That is, during a process in which a voltage Va to be compared is changed relative to a reference voltage Vref, in some cases, due to a change in temperature or operating voltage, the error becomes largest in the impedance matching operations for an impedance matching circuit that requires impedance matching. Particularly, in some cases, as shown as a case in which a shift voltage has been fed to a voltage Va to be compared (this voltage Va to be compared is for impedance to be matched) an error being equivalent to a voltage corresponding to −½ steps (see FIG. 24) or to +½ steps (see FIG. 25) occurs in the impedance matching operations for a terminating resistance in an impedance matching circuit that requires impedance matching including, for example, an output buffer or an input buffer. However, this error can be reduced to one half when compared with the error being equivalent to a voltage corresponding to one step that occurs in the conventional technology. Moreover, it is possible to reduce the number of bits incorporated in the impedance matching data by one bit.

Thus, the impedance matching data outputting circuit 10E of the sixth embodiment can achieve, in addition to effects obtained in the first to fifth embodiments, an effect that an error in impedance matching can be reduced to a voltage corresponding to −½ steps to +½ steps, that is, at the worst in terms of an absolute value, to a voltage corresponding to ½ steps, compared with the above embodiments in which the error can be reduced to a voltage corresponding to ¼ steps to ¾ steps or, to the worst in terms of an absolute value, to a voltage corresponding to ¾ steps. In other words, both stabilization of values contained in the impedance matching data and reduction of one bit out of bits incorporated in the impedance matching data can be simultaneously achieved.

Seventh Embodiment

Figure 26:
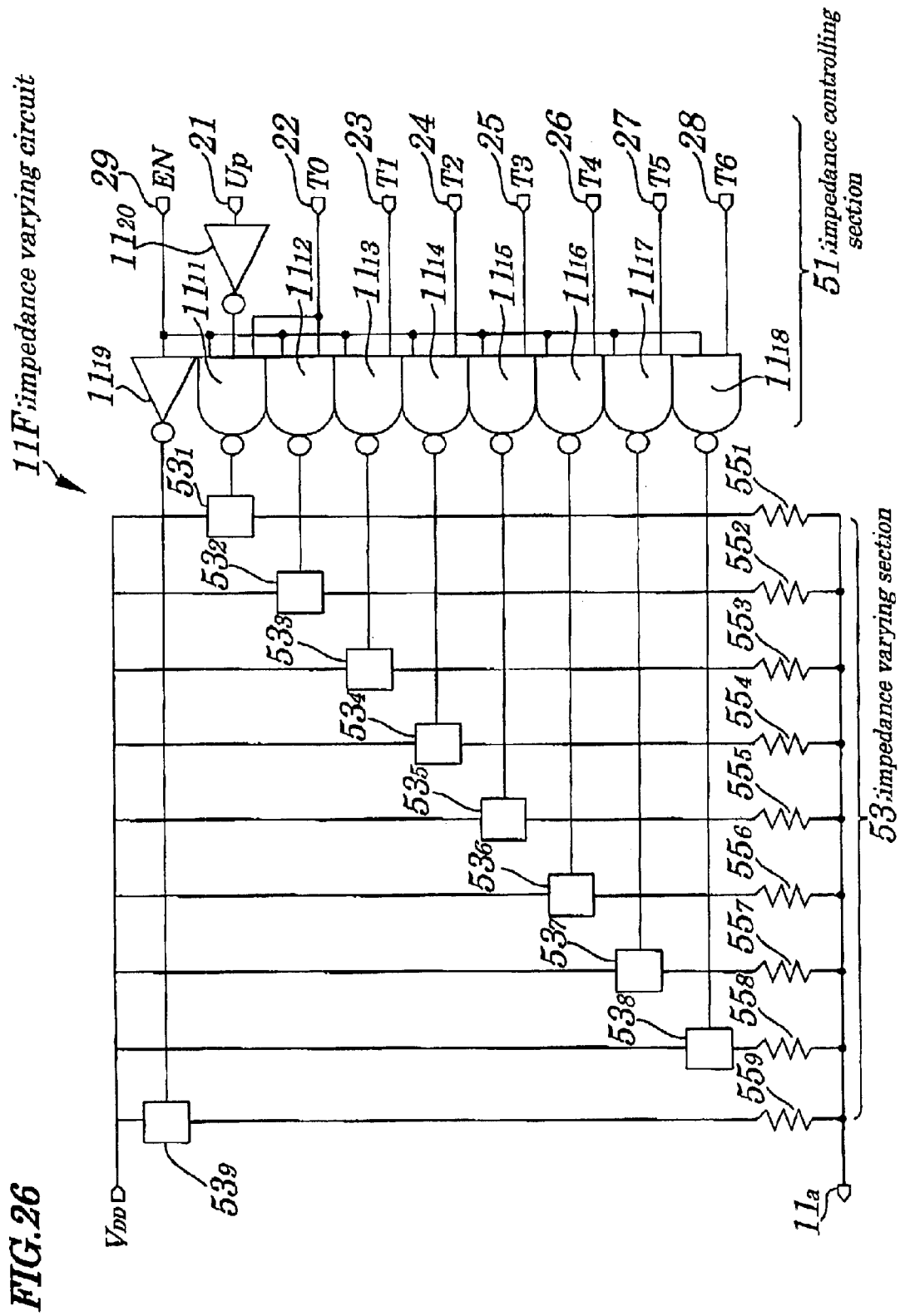
FIG. 26 is a diagram showing an impedance varying circuit incorporated in an impedance matching data outputting circuit of a seventh embodiment.

FIG. 26 is a diagram showing an impedance varying circuit 11E incorporated in an impedance matching data outputting circuit 10F (not shown) of a seventh embodiment. Configurations of the impedance varying circuit 11F of the seventh embodiment differ greatly from those in the first to fifth embodiments in that it is made up of DC impedance elements (not shown) and switches (not shown) used to establish parallel connection and disconnection of the DC impedance elements.

In the impedance varying circuit 11F of the impedance matching data outputting circuit 10F (not shown) of the seventh embodiment, as shown in FIG. 6, an impedance controlling section 51 made up of NAND circuits $11_{11}$ to $11_{18}$ and inverters $11_{19}$ and $11_{20}$ has same configurations of that in the first embodiment (FIG. 4) and an impedance varying section 53 is different from those in the first embodiment in following points. That is, the impedance varying section 53 is made up of switching elements (for example, P-channel MOSFETs) $53_1$ to $53_8$ and resistors $55_1$ to $55_9$.

The switching element $53_1$ is connected serially to the resistor $55_1$ between a voltage source terminal $V_{DD}$ and a connecting point $11_a$. Likewise, each of the switching elements $53_2$, $53_3$, $53_4$, $53_5$, $53_6$, $53_7$, and $53_8$ is serially connected to each of the resistors $55_2$, $55_3$, $55_4$, $55_5$, $55_6$, $55_7$, and $55_8$ between the voltage source terminal $V_{DD}$ and the connecting point $11_a$. A resistance of the resistor $55_1$ is R1 and a resistance of each of the resistors $55_2$ to $55_9$ is R2. The resistances R1 and R2 are selected so that they produce a change in a voltage by a voltage corresponding to the same steps (FIG. 8) as are employed in the first embodiment occurring at the connecting point $11_a$ when a corresponding switching element (for example, P-channel type MOSFET) is turned ON. The resistance R1 is, for example, 60 Ω and the resistance R2 is, for example, 700 Ω.

To a control input terminal of the switching element $53_1$ is connected an output terminal of the NAND circuit $11_{11}$. To a control input terminal of the switching element $53_2$ is connected an output terminal of the NAND circuit $11_{12}$. To a control input terminal of the switching element $53_3$ is connected an output terminal of the NAND circuit $11_{13}$. To a control input terminal of the switching element $53_4$ is connected an output terminal of the NAND circuit $11_{14}$. To a control input terminal of the switching element $53_5$ is connected an output terminal of the NAND circuit $11_{15}$. To a control input terminal of the switching element $53_6$ is connected an output terminal of the NAND circuit $11_{16}$. To a control input terminal of the switching element $53_7$ is connected an output terminal of the NAND circuit $11_{17}$. To a control input terminal of the switching element $53_8$ is connected an output terminal of the NAND circuit $11_{18}$. To a control input terminal of the switching element $53_9$ is connected an output terminal of the NAND circuit $11_{19}$. Since each of components of the impedance matching data outputting circuit 10F of the seventh embodiment has same configurations as each of the components in the first to fifth embodiments, except the components described above, same reference numbers are assigned to components having the same functions as components in the first to fifth embodiments and their descriptions are omitted.

Next, operations of the impedance matching data outputting circuit 10F of the seventh embodiment are described by referring to FIGS. 1 to 3, FIGS. 6 to 10, and FIG. 26. Each of a comparator 13, an up-down counter 14, a code converting circuit 15, and a code converting circuit 17 in the impedance matching data outputting circuit 10F of the seventh embodiment performs same operations as each of those of the first to fifth embodiment does.

A thermometer code made up of a T0 bit, T1 bit, T2 bit, T3 bit, T4 bit, T5 bit, and T6 bit (see FIG. 6) sequentially output from the code converting circuit 15 is output in the same way as in the first to fifth embodiments. Also, an impedance of the impedance varying circuit 11F is changed by the thermometer code in the same manner as in the first to fifth embodiments (see FIG. 7, FIG. 8, and FIG. 9).

As an impedance changes as above, the voltage Va to be compared occurring at the connecting point $11_a$ is changed in the same way as in FIG. 8, as described in the first to fifth embodiments. Therefore, a thermometer code (impedance matching data) (FIG. 10) output from an averaging circuit 16 in the impedance matching data outputting circuit 10F can be stabilized so as to maintain a constant value and so as not to change even if the voltage Va to be compared is changed during ordinary operations. The thermometer code is fed to an impedance matching circuit requiring impedance matching and is used for the impedance matching.

Thus, the impedance matching data outputting circuit 10F of the seventh embodiment can achieve, in addition to effects obtained in the first to fifth embodiments, an effect that, by employing the DC impedance element (resistor) as an impedance element in the impedance varying circuit, instead of the active element such as the P-channel type MOSFET, change caused by a change in a voltage in a power source that activates the impedance varying circuit can be avoided. This serves to improve performance for impedance matching.

Eighth Embodiment

Figure 27:
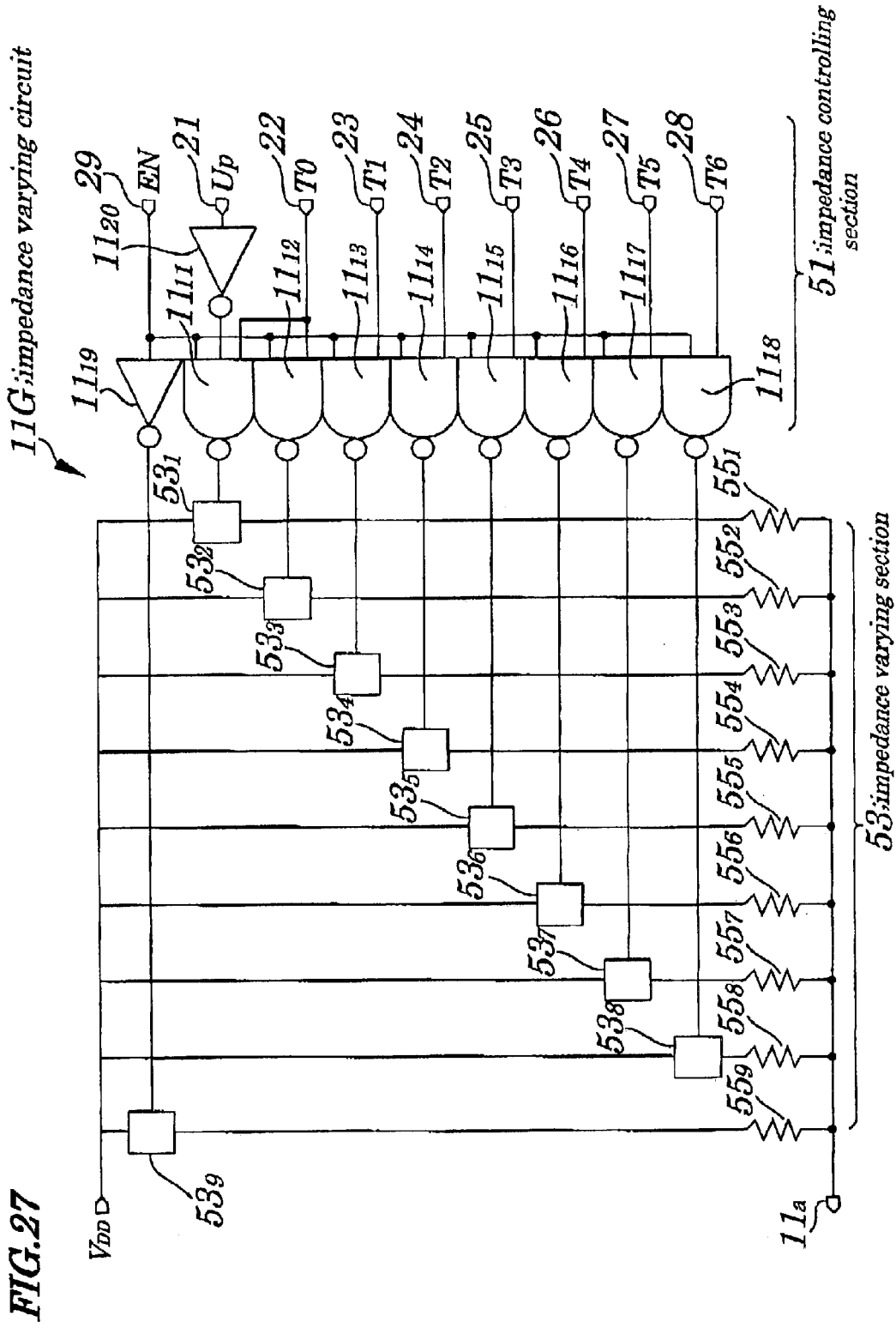
FIG. 27 is a diagram showing an impedance varying circuit incorporated in an impedance matching data outputting circuit of an eighth embodiment.

FIG. 27 is a diagram showing an impedance varying circuit 11G incorporated in an impedance matching data outputting circuit 10G (not shown) of an eighth embodiment. Configurations of the impedance matching data outputting circuit 10G of the eighth embodiment differ greatly from those of the seventh embodiment in that a shift voltage is applied in a different way. That is, the impedance matching data outputting circuit 10G (not shown) of the eighth embodiment uses a resistor $57_1$ having a resistance R2 an a resistor $57_1$ having the resistance 2R2. This enables the impedance varying circuit 11G to perform operations being equivalent to an impedance varying circuit 11E of the sixth embodiment. Since each of components of the impedance matching data outputting circuit 10G of the eighth embodiment has same configurations as each of the components in the sixth embodiment, except the components described above, same reference numbers are assigned to components having the same functions as components in the first to fifth embodiments and their descriptions are omitted.

Next, operations of the impedance matching data outputting circuit 10G of the eighth embodiment are described by referring to FIG. 1, FIG. 6, FIG. 10, FIG. 22, FIG. 23 and FIG. 27. Each of a comparator 13 (not shown), an up-down counter 14 (not shown), a code converting circuit 15 (not shown), and a code converting circuit 17 (not shown) in the impedance matching data outputting circuit 10G of the eighth embodiment performs same operations as each of those of the sixth embodiment does.

A thermometer code made up of a T0 bit, T1 bit, T2 bit, T3 bit, T4 bit, T5 bit, and T6 bit (see FIG. 6) sequentially output from the code converting circuit 15 is output in the same way as in the sixth embodiment. Also, an impedance of the impedance varying circuit 11G is changed by the thermometer code in the same manner as in the sixth embodiment (see FIGS. 22 and 23).

As an impedance changes as above, a voltage Va to be compared occurring at a connecting point $11_a$ is changed in the same way as in FIG. 23, as described in the sixth embodiment. Therefore, a thermometer code (impedance matching data) (FIG. 10) output from an averaging circuit 16 (not shown) in the impedance matching data outputting circuit 10G can be stabilized so as to maintain a constant value and so as not to change even if the voltage Va to be compared is changed during ordinary operations. The thermometer code is fed to an impedance matching circuit requiring impedance matching and is used for the impedance matching.

Thus, the impedance matching data outputting circuit 10G of the eighth embodiment can achieve, in addition to effects obtained in the sixth embodiment, an effect that, by employing a DC impedance element (resistor) as an impedance element in the impedance varying circuit 11G, instead of the active element such as a P-channel type MOSFET, a change caused by a change in a voltage in a power source that activates the impedance varying circuit 11G can be avoided. This serves to improve performance for impedance matching.

Ninth Embodiment

Figure 28:
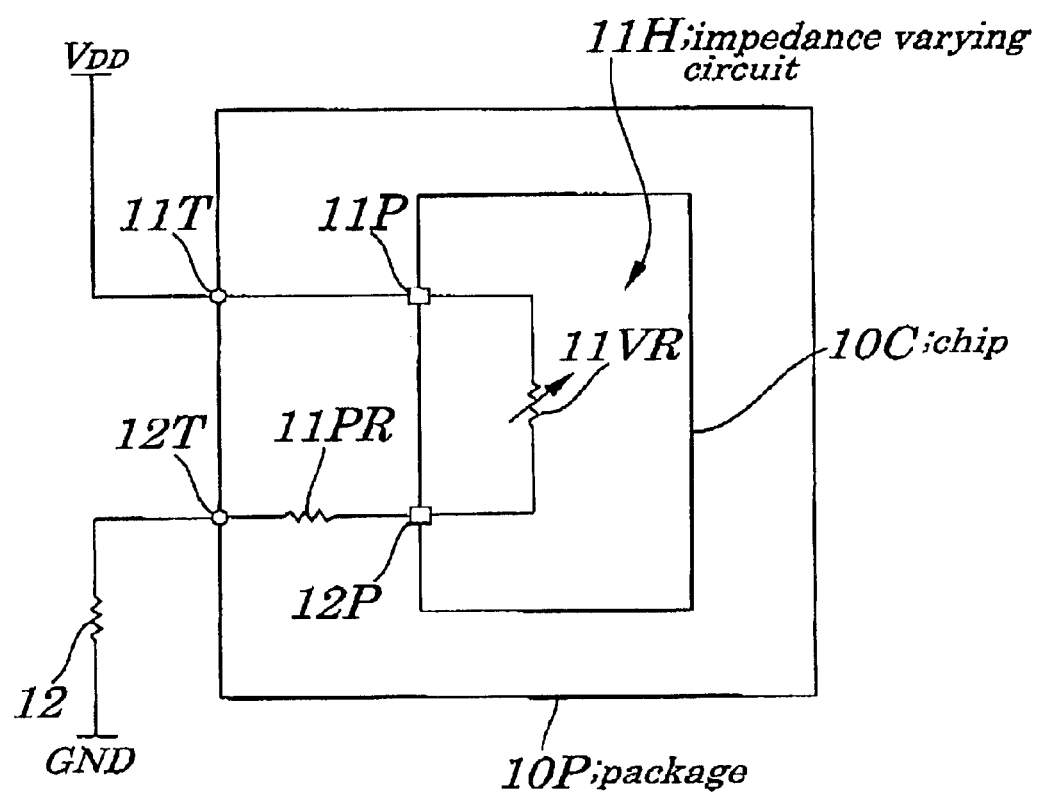
FIG. 28 is a diagram showing an impedance varying circuit incorporated in an impedance matching data outputting circuit of a ninth embodiment.

FIG. 28 is a diagram showing an impedance varying circuit 11H incorporated in an impedance matching data outputting circuit 10H (not shown) of a ninth embodiment. Configurations of the impedance matching data outputting circuit 10H of the eighth embodiment differ greatly from those of the first to eighth embodiments in that, by making impedance values of the impedance varying circuit 11H and a DC impedance resistor 12 being serially connected to the impedance varying circuit 11H be extraordinarily larger than an impedance of an impedance matching circuit that requires impedance matching, an influence of a parasitic resistance is removed as soon as possible.

That is, FIG. 28 shows a circuit portion for the impedance varying circuit 11H and the resistor 12 incorporated in features of the impedance matching data outputting circuit 10H. As shown in FIG. 28, the impedance varying circuit 11H is placed on a chip 10C and the chip 10C is mounted on a package 10P. As shown in FIG. 28, a pad 11P of an impedance varying section 11VR, indicated as a variable resistor, in the impedance varying circuit 11H, is connected through a connecting terminal 11T to a voltage source terminal $V_{DD}$ and a pad 12P (serving as a portion equivalent to a connecting point $11_a$) of the impedance varying section is connected through a parasitic resistor 11PR and a connecting terminal 12T of a package 10P to the resistor 12. The resistor 12 is connected to a ground (GND). The impedance matching data outputting circuit 10H of the ninth embodiment is featured by the impedance varying section 11VR and the resistor 12. That is, resistances of these impedance varying section 11VR and the resistor 12 are set so that they are extraordinarily larger than resistance of an output buffer (not shown) or an input buffer (not shown) requiring impedance matching. For example, the resistance of the impedance varying section 11VR and the resistor 12 are set so as to be 100 times or more as large as that of the output buffer or input buffer that requires impedance matching. That is, when the resistance of the output buffer or the input buffer requiring impedance matching is 50 ohms, the resistance of the impedance varying part 11VR and of the resistor 12 are set to be 5 k ohms.

The impedance varying section 11VR shown in FIG. 28 corresponds to the impedance varying section including P-channel type MOSFETs $11_1$ to $11_9$ shown in FIG. 4 employed in the first to fifth embodiments, to impedance varying section including the impedance elements (P-channel type MOSFETs) $12_1$ and $12_2$, and $11_3$ to $11_9$ shown in FIG. 20 employed in the sixth embodiment, to an impedance varying section including the switching elements $53_1$ to $53_9$ and resistors $54_1$ to $54_9$ shown in FIG. 26 employed in the seventh embodiment, or to an impedance varying section including switching elements $53_1$ to $53_9$ and resistors $54_1$ to $54_9$ shown in FIG. 27 employed in the eighth embodiment. Since each of components of the impedance matching data outputting circuit 10H of the ninth embodiment has same configurations as each of the components in the first to sixth embodiments, except the components described above, same reference numbers are assigned to components having the same functions as components in the first to eighth embodiments and their descriptions are omitted.

Next, operations of the impedance matching data outputting circuit 10H of the ninth embodiment are described by referring to FIG. 28. The impedance matching data outputting circuit 10H of the embodiment performs same operations as that in the first to eighth embodiment except those described below. That is, in the ninth embodiment, by setting resistance of the impedance varying section 11VR and the resistor 12 so as to be larger by 100 times than the resistance of the resistors in the output buffer or input buffer that requires impedance matching, for example, when the resistance of the resistor of the output buffer or input buffer requiring impedance matching is 50 ohms, by setting the resistance of the impedance varying section 11VR and the resistor 12 at 5 k ohms, even if the parasitic resistance is added, an influence of the parasitic resistance on the voltage Va to be compared is prevented.

By doing such the setting, it is possible to reduce the influence of parasitic resistance to one-hundredth or less, compared with a case in which the resistance of the impedance varying section 11VR and the resistor 12 is set to be 50 ohms which is same as is set as the resistance of the output buffer or input buffer that requires impedance matching. For example, if the parasitic resistance is a known 1 (one) ohm and the resistance of the impedance varying section 11VR and the resistor 12 is set to be 50 ohms being the same as is set for the output or input buffer that requires impedance matching, the influence of the parasitic resistance is 2%. However, according to the embodiment, when a targeted resistance value of the output buffer or input buffer requiring impedance matching is 50 ohms, by setting the resistance of the impedance varying section 11VR and the resistor 12 at 5 k ohms, the influence of the parasitic resistance can be reduced to 0.02%.

Moreover, when the resistance of the impedance varying section 11VR is made larger, it causes a width of the P-channel type MOSFET that produces the above resistance to be smaller which requires a countermeasure against electrostatic discharge (ESD). In this case, an ESD protection circuit may be provided.

Thus, the impedance matching data outputting circuit 10H of the ninth embodiment can achieve, in addition to effects obtained in the first to eighth embodiments, an effect that, by setting an impedance value (resistance value) of the impedance varying circuit and the resistor so as to be larger than a resistance of a circuit that requires impedance matching, an influence of a parasitic resistance in the package can be greatly reduced and even if a parasitic resistor 11PR is added, the influence of the addition of the parasitic resistance on a voltage Va to be compared can be prevented, thus serving to reduce an error in impedance matching.

Tenth Embodiment

Figure 29:
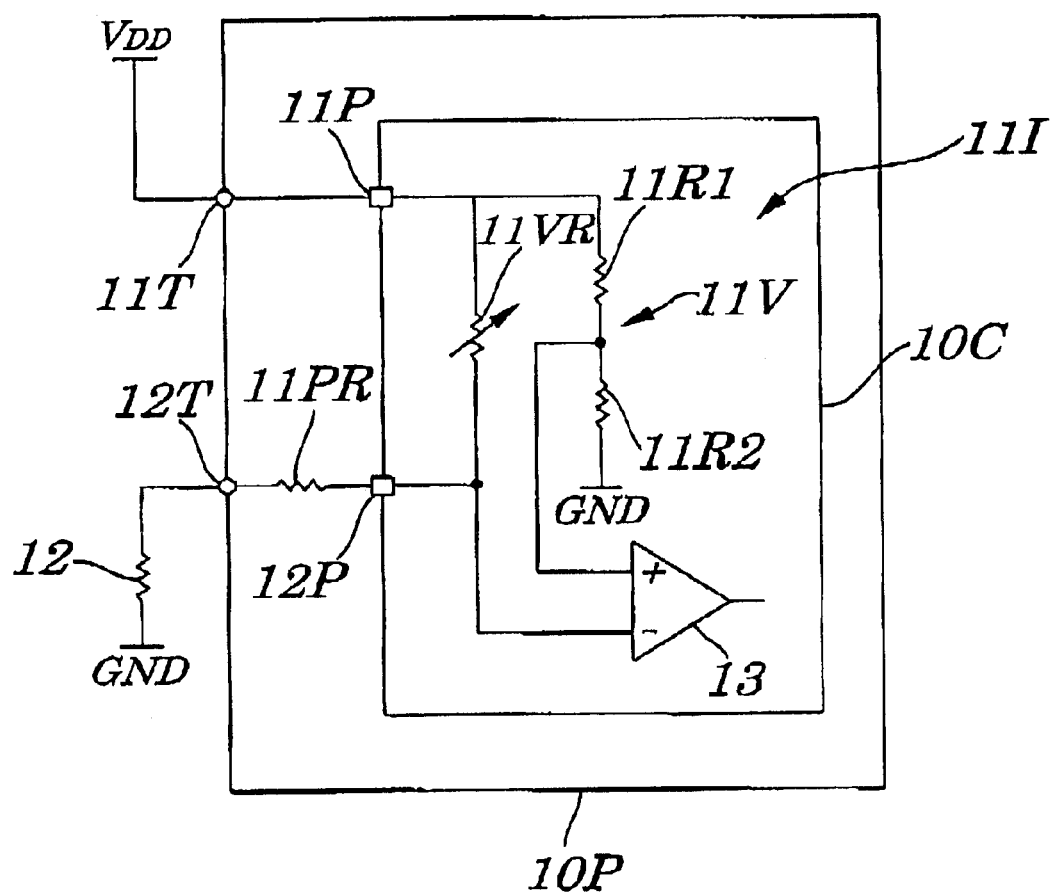
FIG. 29 is a diagram showing an impedance varying circuit incorporated in an impedance matching data outputting circuit of a tenth embodiment.
Figure 30:
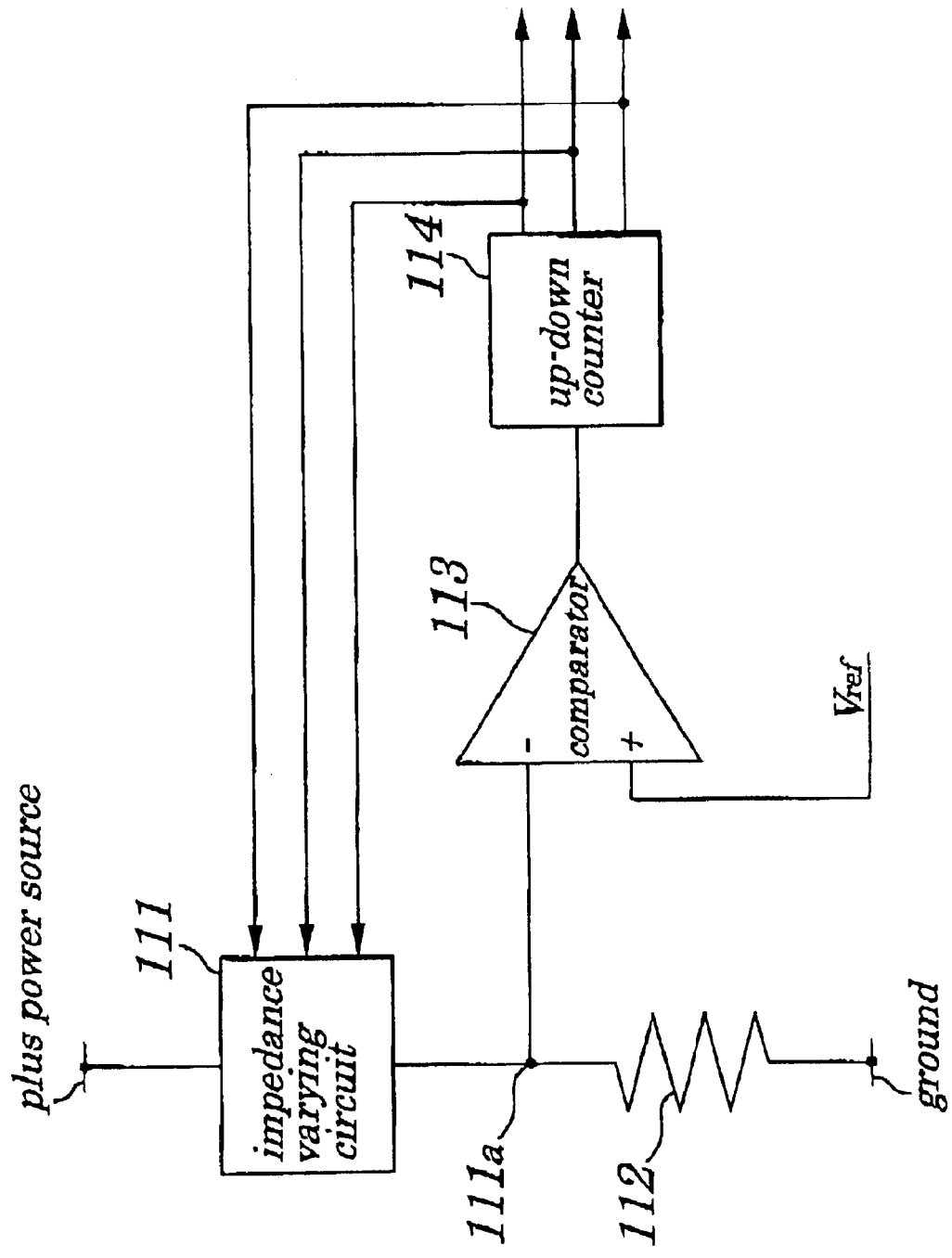
FIG. 30 is a schematic block diagram showing a conventional (first application) output impedance calibrating circuit.
Figure 31A:
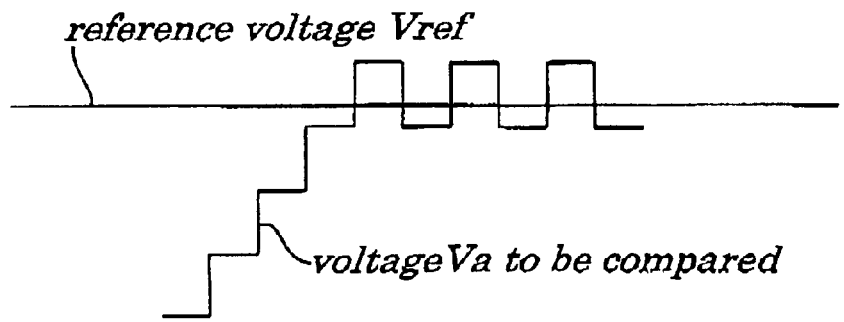
FIG. 31A is a diagram showing a change in a voltage to be compared in the conventional output impedance calibrating circuit and FIG. 31B is a diagram showing a change in an output from an averaging circuit in the conventional output calibrating circuit.
Figure 31B:
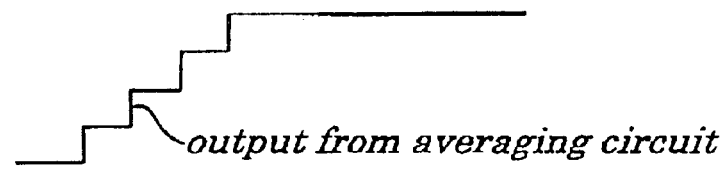

FIG. 29 is a diagram showing an impedance varying circuit incorporated in an impedance matching data outputting circuit 10I (not shown) of a tenth embodiment. Configurations of the impedance matching data outputting circuit 10I of the tenth embodiment differ greatly from those of the first to eighth embodiment in that, by configuring a reference voltage Vref feeding circuit 11V by taking a parasitic resistance contained in a circuit of producing a voltage Va to be compared into consideration, an influence of the parasitic resistance is removed as soon as possible.

FIG. 29 shows the reference voltage Vref feeding circuit 11V to supply a reference voltage Vref to a comparator 13 in the impedance matching data outputting circuit 10I, which features the tenth embodiment. An impedance varying circuit 11I is placed on a chip 10C. The chip 10C is mounted on a package 10P. As shown in FIG. 29, a pad 11P in the impedance varying section 11VR, indicated as a variable resistor, in the impedance varying circuit 11I is connected through a connecting terminal 11T on the package 10P to a voltage source terminal $V_{DD}$ and a pad 12P (being equivalent to a connecting point $11_a$) is connected through a parasitic resistor 11PR on the package 10P and through a connecting terminal 12T to a resistor 12. A resistor 12 is connected to a ground (GND).

The reference voltage Vref feeding circuit 11V, which features the tenth embodiment, is made up of resistors 11R1 and 11R2 (connected to a ground) adapted to divide a voltage fed from the voltage source terminal $V_{DD}$. The tenth embodiment of the present invention is featured in that a resistance of the resistor 11R1 is set to be equal to that of the impedance varying section 11VR and the resistor 12 and a resistance of the resistor 11R2 is set to be a value which includes a resistance of a parasitic resistor. For example, a resistance of the impedance varying section 11VR and the resistor 12 is set so as to be equal to a resistance of an output buffer or an input buffer that requires impedance matching and therefore a resistance of the resistor 11R1 is set to be equal to a resistance of the output buffer or the input buffer. The resistance of the resistor 11R2 is set to be a value obtained by adding a resistance of the parasitic resistor 11PR to the resistance of the output buffer or the input buffer requiring impedance matching. When a resistance of a resistor of an output buffer or input buffer requiring impedance matching is 50 ohms and a resistance of a parasitic resistor 11PR is 1 ohm as a known value, a resistance of the resistor 11R2 is set to be 51 ohms.

Moreover, the impedance varying section 11VR shown in FIG. 29 corresponds to an impedance varying section including P impedance elements (P-channel type MOSFETs) $11_1$ to $11_9$ shown in FIG. 4 employed in the first to fifth embodiments, to an impedance varying section including the impedance elements (P-channel type MOSFETs) $12_1$ and $12_2$, and $11_3$ to $11_9$ shown in FIG. 20 employed in the sixth embodiment, to an impedance varying section including switching elements $53_1$ to $53_9$ and resistors $54_1$ to $54_9$ shown in FIG. 26 employed in the seventh embodiment, or to an impedance varying section including switching elements $53_1$ to $53_9$ and resistors $54_1$ to $54_9$ shown in FIG. 27 employed in the eighth embodiment. Since each of components of the impedance matching data outputting circuit 10I of the tenth embodiment has same configurations as each of the components in the first to eighth embodiments, except the components described above, same reference numbers are assigned to components having the same functions as components in the first to eighth embodiments and their descriptions are omitted.

Next, operations of the impedance matching data outputting circuit 10I (not shown) of the tenth embodiment are described by referring to FIG. 29. The impedance matching data outputting circuit 10I (not shown) of the embodiment performs same operations as that in the first to eighth embodiment except those described below. That is, in the tenth embodiment, by making a ratio of a resistance of the impedance varying section 11VR to a resistance obtained by adding a resistance of the parasitic resistor 11PR to a resistance of the resistor 12 be equal to a ratio of the resistor 11R1 to the resistor 11R2, even if the parasitic resistor 11PR is added, an influence of addition of the parasitic resistance and/or change in a supply power voltage on accuracy in comparison of the comparator 13 can be prevented. By maintaining the above relation both in a process of designing and in a process of manufacturing, an intended purpose is achieved.

By doing such the setting, even if a voltage corresponding to a change in a voltage fed from the voltage source terminal $V_{DD}$ and/or to a parasitic resistance are added to a voltage Va to be compared occurring at the pad 12P being equivalent to the connecting point $11_a$ shown in FIG. 1, since a change in a voltage being equivalent to an amount of the addition of the voltages occurs also in a reference voltage Vref occurring at a connecting point between the resistor 11R1 and resistor 11R2 at a same rate, an influence of the change in the voltage fed from the voltage source terminal $V_{DD}$ and/or the parasitic resistance on accuracy in comparison in the comparator 13 can be prevented, thus enabling exact impedance matching data to be produced in a stable manner. For example, when control is exerted so that a resistance of a parasitic resistance is 1 ohm as a known value and a resistance of the resistor 12 is set to be 50 ohms being equal to a resistance of a resistor of an output buffer or input buffer requiring impedance matching and a resistance of the impedance varying section 11VR is set to be 50 ohms being equal to a resistance of a resistor of the output buffer or input buffer requiring impedance matching, if a resistance of the resistor 11R1 is set to be 50 ohms, a resistance of the resistor 11R2 is set to be 51 ohms in a process of designing and if a resistance of the resistor 11R1 is 55 ohms and a resistance of the resistor 11R2 is 56.1 ohms in a process of manufacturing, a rate of a resistance Rref1 of the resistor 11R1 to a resistance Rref2 of the resistor 11R2 becomes 1.02 in both of the processes for designing and manufacturing and therefore an intended purpose can be achieved.

Thus, the impedance matching data outputting circuit 10G of the ninth embodiment can achieve, in addition to effects obtained in the first to eighth embodiments, an effect that, by making a ratio of a resistance of the impedance varying section 11VR to a value obtained by a resistance of the parasitic resistor 11PR to a resistance of the resistor 12 be equal to a ratio of a resistance of the resistor 11R1 to a resistance of the resistor 11R2, even if the parasitic resistor 11PR is added, an influence of the addition of the parasitic resistance and/or of the change in a voltage fed from the voltage source terminal $V_{DD}$ on accuracy in comparison in the comparator 13 can be prevented, thus enabling exact impedance matching data to be produced in a stable manner.

It is apparent that the present invention is not limited to the above embodiments but may be changed and modified without departing from the scope and spirit of the invention. For example, in the above first embodiment, an example is shown in which the P-channel type MOSFET is used, however, the present invention is not limited to this, that is, instead of the P-channel type MOSFET, an N-channel type MOSFET may be employed. This can be applied to other embodiments. Moreover, in the first embodiment, the Impedance element (P-channel type MOSFET) $11_9$ may be configured by using a transfer gate so that a linear characteristic of an impedance is improved to increase performance of the impedance matching data outputting circuit.

Also, in the sixth embodiment, a voltage used to change a voltage Va to be compared occurring when a down-signal is being output from the comparator may be set to a voltage other than a voltage corresponding to +¼, that is, to a voltage corresponding to a step being larger than +¼ and a step being less than +½.

Also, channel widths, that enable a shift voltage to be applied to a voltage Va to be compared, other than the channel width employed in the first and second embodiments may be used in the first and second embodiment by combining them.

Also, the number of synchronizing circuits serving as shift registers incorporated in the averaging circuit in the first embodiment may be odd multiples of two, three, or a like.

Also, in the first and fourth embodiments, multiples of four may be used. In the fifth embodiment, six values are used, however, for example, three values, five values, seven values, or a like may be employed.

Also, instead of the resistors 12 and 13 used in the above embodiments, other DC impedance elements such as a diode or a like may be used. Any impedance element may be employed so long as the element can output a voltage Va to be compared.

Furthermore, in each of the embodiments, an example is shown in which the MOSFET is employed, however, instead of the MOSFET, bipolar transistors may be used.

What is claimed is:

1. A method for producing a control signal for impedance matching for adjusting an output impedance of an output buffer or an input impedance of an input buffer by comparing a voltage to be compared with a reference voltage to increase, when said voltage to be compared is smaller than said reference voltage, said voltage to be compared by a predetermined voltage and to decrease, when said voltage to be compared is larger than said reference voltage, said voltage to be compared by a predetermined voltage and by producing said control signal based on a result from the comparison and using this produced control signal, said method comprising:

a step of setting so that said predetermined voltage to be used when a change in said voltage to be compared is switched from its increasing state to its decreasing state or when said change in said voltage to be compared is switched from its decreasing state to its increasing state has a potential being smaller than that of said predetermined voltage to be used when said voltage to be compared is caused to continue increasing and when said voltage to be compared is caused to continue decreasing and so that a voltage obtained by adding both predetermined voltages to be used when a change in said voltage to be compared is switched from its increasing state to its decreasing state or when a change in said voltage to be compared is switched from its decreasing state to its increasing state has a potential being smaller than that when said voltage to be compared is caused to continue increasing or when said voltage to be compared is caused to continue decreasing.

2. The method for producing a control signal for impedance matching according to claim 1, wherein said predetermined voltage to be used when said voltage to be compared is caused to continue increasing and when said voltage to be compared is caused to continue decreasing is made constant.

3. The method for producing a control signal for impedance matching according to claim 1, wherein said voltage to be compared is changed in every specified period of time and values given by said control signals produced based on a result from the comparison made in said every specified period of time are averaged in a predetermined time.

4. The method for producing a control signal for impedance matching according to claim 1, wherein, in the change in said voltage to be compared, an increase value to be used when said voltage to be compared is caused to increase and a decrease value to be used when said voltage to be compared is caused to decrease are made different from each other.

5. A circuit for producing a control signal for impedance matching comprising:

a comparator to compare a voltage to be compared with a reference voltage in every period of a specified constant time;

an up-down counter to increment, every time results from the comparison by said comparator are input and compared, a count value by 1 (one) when said voltage to be compared is smaller than said reference voltage and to decrement a count value by 1 (one) when said voltage to be compared is larger than that said reference voltage;

a first circuit for changing a value of said voltage to be compared based on said count value;

a second circuit for producing and outputting said control signal for impedance matching; and wherein said first circuit does setting so that, when a value of said voltage to be compared is changed, a value to be used when said value of said voltage to be compared is increased and a value to be used when a value of a voltage to be compared is decreased are made different from each other and changes a value of said voltage to be compared so that a potential to be changed when a change in said voltage to be compared is switched from its increasing state to its decreasing state or when a change in said voltage to be compared is switched from its decreasing state to its increasing state is smaller than a potential to be changed in every counting when said voltage to be compared is caused to continue increasing and decreasing and so that a potential obtained by adding a potential to be used when a change in said voltage to be compared is switched from its increasing state to its decreasing state and a potential to be used when a change in said voltage to be compared is switched from its decreasing state to its increasing state is smaller than a potential to be changed in every counting when said voltage to be compared is caused to continue decreasing and increasing and wherein said second circuit produces and outputs a control signal for said impedance matching based on an average value of said count values measured within said predetermined time.

6. The circuit for producing a control signal for impedance matching according to claim 5, wherein said first circuit includes two impedance elements being connected serially between a power source and a ground and wherein said voltage to be compared is output from a connecting point of both of said impedance elements and wherein said impedance elements being connected to said power source are transistors being, in parallel, connected whose impedance values are changed according to said count value and a signal based on said count value is input to a gate of each of said transistors.

7. The circuit for producing a control signal for impedance matching according to claim 6, wherein said impedance elements being connected to said power source are made up of a switching element and a resistor in series, instead of said transistors and wherein said switching element is closed or opened depending on a signal based on said count value.

8. A method for producing a control signal for impedance matching comprising:

a step of comparing a voltage to be compared with a reference voltage by a comparator;

a step of incrementing count values output from an up-down counter by only 1 (one) in every predetermined period of time when a result of the comparison indicates that said voltage to be compared is smaller than said reference voltage and of decrementing said count values output from said up-down counter by only 1 (one) in every predetermined period of time when said result of said comparison indicates that said voltage to be compared is larger than said reference voltage;

a step of changing said voltage to be compared by a predetermined voltage based on said count values for every one counting operation of said up-down counter;

a step of producing, based on said count values, said control signal for said impedance matching to be used for matching terminating impedance of a circuit that requires impedance matching;

a step of regularly changing said voltage to be compared at levels being higher and lower than a level of said reference voltage;

a step of setting, even when said voltage to be compared gets closest to said reference voltage, said predetermined voltage to be used for changing said voltage to be compared at a voltage at which said voltage to be compared is apart by an offset voltage of said comparator from said reference voltage; and a step of outputting said control signal for said impedance matching based on an average value of count values obtained by one counting operation of said up-down counter within a predetermined period of time.

9. The method for producing the control signal for the impedance matching according to claim 8, wherein setting of said predetermined voltage for changing is made so that said voltages to be compared become symmetric with respect to said reference voltage at levels being higher and lower than said level of said reference voltage.

10. The method for producing the control signal for the impedance matching according to claim 8, wherein setting of said predetermined voltage for changing is made so that said voltages to be compared become asymmetric with respect to said reference voltage at levels being higher and lower than said level of said reference voltage.

11. The method for producing the control signal for the impedance matching according to claim 8, wherein said predetermined voltage is changed so that a ratio of said changing is made larger when a difference between said reference voltage and said voltage to be compared is the larger.

12. A method for producing a control signal for impedance matching comprising:
a step of comparing a voltage to be compared with a reference voltage by using a comparator;
a step of decrementing count values output from an up-down counter by only 1 (one) in every predetermined period of time when a result of the comparison indicates that said voltage to be compared is smaller than said reference voltage and of incrementing said count values output from said up-down counter by only 1 (one) in every predetermined period of time when said result of said comparison indicates that said voltage to be compared is larger than said reference voltage;
a step of changing said voltage to be compared by a predetermined voltage based on said count values for every one counting operation of said up-down counter;
a step of producing, based on said count values, said control signal for said impedance matching to be used for matching terminating impedance of a circuit that requires impedance matching;
a step of regularly changing said voltage to be compared at levels being higher and lower than a level of said reference voltage;
a step of setting, even when said voltage to be compared gets closest to said reference voltage, said predetermined voltage to be used for changing said voltage to be compared at a voltage at which said voltage to be compared is apart by an offset voltage of said comparator from said reference voltage; and
a step of outputting said control signal for said impedance matching based on an average value of count values obtained by one counting operation of said up-down counter within a predetermined period of time.

13. The method for producing the control signal for the impedance matching according to claim 12, wherein setting of said predetermined voltage for changing is made so that said voltages to be compared become symmetric with respect to said reference voltage at levels being higher and lower than said level of said reference voltage.

14. The method for producing the control signal for the impedance matching according to claim 12, wherein setting of said predetermined voltage for changing is made so that said voltages to be compared become asymmetric with respect to said reference voltage at levels being higher and lower than said level of said reference voltage.

15. The method for producing the control signal for the impedance matching according to claim 12, wherein said predetermined voltage is changed so that a ratio of said changing is made larger when a difference between said reference voltage and said voltage to be compared is the larger.

16. A circuit for producing a control signal for impedance matching of terminating impedance of a circuit that requires impedance matching comprising:
a comparator to compare a voltage to be compared with a reference voltage in every predetermined time;
an up-down counter to receive a result from the comparison by said comparator to increment a count value output from an up-down counter by 1 (one) only every time when a result of said comparison indicates that said voltage to be compared is smaller than said reference voltage and to decrement said count value output from said up-down counter by 1 (one) only every time when said result of said comparison indicates that said voltage to be compared is larger than said reference voltage;
a circuit for changing said voltage to be compared used to change said voltage to be compared by a predetermined voltage based on said count values for every one counting operation of said up-down counter wherein said count value is used for outputting said control signal for said impedance matching, and
wherein said circuit for changing said voltage to be compared regularly changes said voltage to be compared at levels being higher and lower than a level of said reference voltage and sets, even when said voltage to be compared gets closest to said reference voltage, said predetermined voltage to be used for changing said voltage to be compared at a voltage at which said voltage to be compared is apart by an offset voltage of said comparator from said reference voltage and has an averaging circuit to produce an average value of count values obtained by one counting operation within a predetermined period of time and outputs said control signal for said impedance matching by using said averaged count values.

17. The circuit for producing the control signal for the impedance matching according to claim 16, wherein setting of said predetermined voltage for changing to be made by said circuit for changing a voltage to be compared is made so that said voltages to be compared become symmetric with respect to said reference voltage at levels being higher and lower than a level of said reference voltage.

18. The circuit for producing the control signal for the impedance matching according to claim 16, wherein setting of said predetermined voltage for changing to be made by said circuit for changing a voltage to be compared is made so that said voltages to be compared become asymmetric with respect to said reference voltage at levels being higher and lower than said level of said reference voltage.

19. The circuit for producing the control signal for the impedance matching according to claim 16, wherein a value for one counting of said predetermined voltage to be changed by said circuit for changing a voltage to be compared is the larger when a difference between said reference voltage and said voltage to be compared is larger.

20. A circuit for producing a control signal for impedance matching of terminating impedance of a circuit that requires impedance matching comprising:
a comparator to compare a voltage to be compared with a reference voltage in every predetermined time;
an up-down counter receiving a result from the comparison made by said comparator to decrement count values output from an up-down counter by only 1 (one) every time when said result of said comparison indicates that said voltage to be compared is smaller than said reference voltage and to increment said count values output from said up-down counter by only 1 (one) every time when said result of said comparison indicates that said voltage to be compared is larger than said reference voltage;

a circuit for changing said voltage to be compared used to change said voltage to be compared by a predetermined voltage based on said count values for every one counting operation of said up-down counter wherein said count values are used for outputting said control signal for said impedance matching; and wherein said circuit for changing said voltage to be compared regularly changes said voltage to be compared at levels being higher and lower than a level of said reference voltage and sets, even when said voltage to be compared gets closest to said reference voltage, said predetermined voltage to be used for changing said voltage to be compared at a voltage at which said voltage to be compared is apart by an offset voltage of said comparator from said reference voltage and has an averaging circuit to produce an average value of count values obtained by one counting operation within a predetermined period of time wherein said average value is used for outputting said control signal for said impedance matching.

21. The circuit for producing the control signal for the impedance matching according to claim 20, wherein setting of said predetermined voltage for changing to be made by said circuit for changing a voltage to be compared is made so that said voltages to be compared become symmetric with respect to said reference voltage at levels being higher and lower than a level of said reference voltage.

22. The circuit for producing the control signal for the impedance matching according to claim 20, wherein setting of said predetermined voltage for changing to be made by said circuit for changing a voltage to be compared is made so that said voltages to be compared become asymmetric with respect to said reference voltage at levels being higher and lower than said level of said reference voltage.

23. The circuit for producing the control signal for the impedance matching according to claim 20, wherein a value for one counting of said predetermined voltage to be changed by said circuit for changing a voltage to be compared is the larger when a difference between said reference voltage and said voltage to be compared is larger.

* * * * *